United States Patent
Sato et al.

(10) Patent No.: US 6,893,743 B2
(45) Date of Patent: May 17, 2005

(54) ORGANIC ELECTROLUMINESCENT DEVICE

(75) Inventors: Hideki Sato, Yokohama (JP);
Yoshiharu Sato, Yokohama (JP);
Masayo Fugono, Yokohama (JP)

(73) Assignee: Mitsubishi Chemical Corporation, Tokyo (JP)

(*) Notice: Subject to any disclaimer, the term of this patent is extended or adjusted under 35 U.S.C. 154(b) by 264 days.

(21) Appl. No.: 09/969,758

(22) Filed: Oct. 4, 2001

(65) Prior Publication Data

US 2003/0218418 A9 Nov. 27, 2003

(30) Foreign Application Priority Data

| Oct. 4, 2000 | (JP) | ........................................ 2000-304655 |
| Oct. 4, 2000 | (JP) | ........................................ 2000-304656 |
| Jun. 21, 2001 | (JP) | ........................................ 2001-188392 |

(51) Int. Cl.$^7$ ............................................. H05B 33/14
(52) U.S. Cl. ........................ 428/690; 428/917; 313/504; 313/506; 257/102
(58) Field of Search ................................. 428/690, 917; 313/504, 506; 257/102, 103

(56) References Cited

U.S. PATENT DOCUMENTS

| 5,294,810 A | * | 3/1994 | Egusa et al. .................... 257/40 |
| 5,374,489 A | * | 12/1994 | Imai et al. .................... 428/690 |
| 5,487,953 A | * | 1/1996 | Shirota et al. ................. 428/690 |
| 5,891,587 A | * | 4/1999 | Hu et al. ..................... 428/690 |
| 6,121,727 A | * | 9/2000 | Kanai et al. ................... 313/504 |
| 6,306,559 B1 | * | 10/2001 | Tanamura et al. ............. 430/315 |
| 6,310,360 B1 | * | 10/2001 | Forrest et al. ................. 257/40 |
| 2002/0045061 A1 | * | 4/2002 | Hosokawa .................... 428/690 |
| 2002/0197511 A1 | * | 12/2002 | D'Andrade et al. ........ 428/690 |

FOREIGN PATENT DOCUMENTS

| JP | 2000-21572 | 1/2000 |
| JP | 2000-164362 | 6/2000 |
| WO | WO 00/57676 | 9/2000 |
| WO | WO 00/70655 | 11/2000 |
| WO | WO 01/08230 | 2/2001 |

OTHER PUBLICATIONS

"High Quantum Efficiency in Organic Light–Emitting Devices with Iridium–Complex as a Triplet Emissive Center," by Tetsuo Tsutsui, Moon–Jae Yang, Masayuki Yahiro, Kenji Nakamura, Teruichi Watanabe, Taishi Tsuji, Yoshinori Fukuda, Takeo Wakimoto and Satoshi Miyaguchi, Jpn. J. Appl. Phys., vol. 38, p. L1502, Dec. 15, 1999.

"Organic electroluminescent diodes," by C. W. Tang and S. A. VanSlyke, Appl. Phys. Lett., vol. 51, p. 913, Sep. 21, 1987.

(Continued)

*Primary Examiner*—Marie Yamnitzky
(74) *Attorney, Agent, or Firm*—Oblon, Spivak, McClelland, Maier & Neustadt, P.C.

(57) ABSTRACT

An organic electroluminescent device is disclosed, comprising a substrate having thereon a light-emitting layer sandwiched by an anode and a cathode, wherein the light-emitting layer comprises at least:
  (1) a host material having electron-transporting or hole-transporting property,
  (2) Compound A capable of phosphorescence emission at room temperature, and
  (3) Compound B capable of phosphorescence emission or fluorescence emission at room temperature and having the maximum light emission wavelength longer than the maximum light emission wavelength of Compound A, and the maximum light emission wavelength of said device is attributable to said (3). The light emission attributable to (3) is intensified by (2) to elevate the light emission efficiency and by selecting a fluorescent compound as (3), the device can be prevented from aging deterioration of the luminance.

23 Claims, 8 Drawing Sheets

OTHER PUBLICATIONS

"Electroluminescence of doped organic thin films," by C. W. Tang, S. A. VanSlyke and C. H. Chen, J. Appl. Phys., vol. 65, p, 3610, May 1, 1989.

The 51st Autumn Meeting. 1990; The Japan Society of Applied Physics, 28a–PB–7 (1990), with English translation of 28a–PB–8.

M. A. Baldo, et al., Nature, vol. 395, pp. 151–154, "Highly Efficient Phosphorescent Emission from Organic Electroluminescent Devices", Sep. 10, 1998.

M. A. Baldo, et al., Nature, vol. 403, pp. 750–753, "High–Efficiency Fluorescent Organic Light–Emitting Devices Using a Phosphorescent Sensitizer", Feb. 17, 2000.

M. A. Baldo, et al., Applied Physics Letters, vol. 75, No. 1, pp. 4–6, "Very High–Efficiency Green Organic Light–Emitting Devices Based on Electrophosphorescence", Jul. 5, 1999.

* cited by examiner

- 8: CATHODE
- 6: HOLE-BLOCKING LAYER
- 5: LIGHT-EMITTING LAYER
- 4: HOLE-TRANSPORTING LAYER
- 2: ANODE
- 1: SUBSTRATE

- 8: CATHODE
- 7: ELECTRON-TRANSPORTING LAYER
- 6: HOLE-BLOCKING LAYER
- 5: LIGHT-EMITTING LAYER
- 4: HOLE-TRANSPORTING LAYER
- 2: ANODE
- 1: SUBSTRATE

◆(T-2)+(Dye-2)   □(T-2)

ORGANIC ELECTROLUMINESCENT DEVICE

FIELD OF THE INVENTION

The present invention relates to an organic electroluminescent device. More specifically, the present invention relates to a thin film-type device which emits light upon application of an electric field to a light-emitting layer comprising an organic compound.

BACKGROUND OF THE INVENTION

In conventional thin film-type electroluminescent (EL) devices, an inorganic material group II-VI compound semiconductor such as ZnS, CaS and SrS is generally doped with Mn or a rare earth element (e.g., Eu, Ce, Th, Sm) as a emission center. However, the EL device fabricated from the above-described inorganic material has problems such that:

1) a.c. (alternating current) driving is necessary (from 50 to 1,000 Hz),
2) the driving voltage is high (up to 200 V),
3) full color emission is difficult (particularly blue) and
4) the peripheral driving circuit costs highly.

In recent years, however, for the purpose of improving the above-described problems, studies have been made to develop an EL device using an organic thin film. In order to elevate the light emission efficiency, an organic electroluminescent device has been developed, where the kind of electrode is optimized for the purpose of improving the efficiency of carrier injection from an electrode and a hole-transporting layer comprising an aromatic diamine and a light-emitting layer comprising an aluminum complex of 8-hydroxyquinoline are provide (see, *Appl. Phys. Lett.*, Vol. 51, page 913 (1987)). By this technique, the light emission efficiency is greatly improved as compared with conventional EL devices using a single crystal such as anthracene. Furthermore, for example, an aluminum complex of 8-hydroxyquinoline as a host material is doped with a fluorescence dye for laser, such as coumarin (see, *J. Appl. Phys.*, Vol. 65, page 3610 (1989)), with an attempt to improve the light emission efficiency, convert the light emission wavelength or the like. The devices are coming to have practically usable properties.

In addition to these electroluminescent devices using a low-molecule-weight material, studies are being made to develop an electroluminescent device using a polymer material such as poly(p-phenylenevinylene), poly[2-methoxy-5-(2-ethylhexyloxy)-1,4-phenylenevinylene] or poly(3-alkyl-thiophene) for the light-emitting layer material or to develop a device using a low molecule light-emitting material and an electron-transfer material by mixing these with a polymer such as polyvinylcarbazole.

Also, use of not only fluorescence but also phosphorescence is being studied with an attempt to elevate the light emission efficiency. If phosphorescence is used, that is, light emission from the triplet excitation state is utilized, an improvement of about three times higher efficiency can be expected as compared with conventional devices using fluorescence (singlet). For this purpose, it has been proposed to form the light-emitting layer using a coumarin derivative or a benzophenone derivative (see, *The 51st Autumn Meeting, 1990; The Japan Society of Applied Physics*, 28a-PB-7 (1990)). However, only an extremely low luminance could be obtained. Thereafter, use of an europium complex is studied with an attempt to utilize the triplet excitation state, however, high light emission efficiency could not be attained either by this use.

Recently, it has been reported that red light emission with high efficiency can be attained by using a platinum complex (T-1) shown below (see, *Nature*, Vol. 395, page 151 (1998)). Thereafter, the efficiency in green light emission is further greatly improved by doping an iridium complex (T-2) shown below to the light-emitting layer (see, *Appl. Phys. Lett.*, Vol. 75, page 4 (1999)).

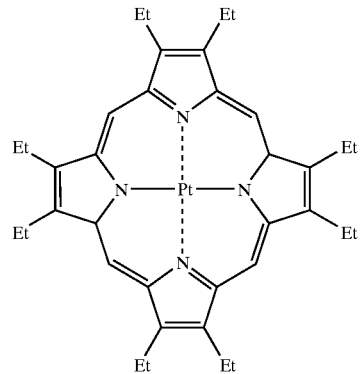

(T-1)

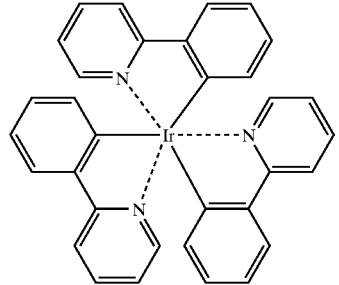

(T-2)

For applying the organic electroluminescent device as a display device such as flat panel display, further, as a light source for fluorescent lamp or marker lamp, the light emission efficiency of the device must be more improved.

The organic electroluminescent device using the phosphorescence molecule (T-2) described in the above-described publication emits light with relatively high efficiency, however, the organic electroluminescent device using (T-1) is low in the light emission efficiency as compared with devices using (T-2). The main cause of this is presumed to reside in the relationship between the host material in the light-emitting layer and the phosphorescent substance.

The formation probability of triplet exciton is three times higher than that of singlet exciton and therefore, if light emission from the triplet exciton (namely, phosphorescence) is used, the light emission efficiency is elevated. However, use of a phosphorescent substance alone suffers from bad stability of film and low mobility of electric charge (hole or electron) injected from electrodes and accordingly, the light emission efficiency is not elevated. On the other hand, use of a host material alone cannot provide light emission from a triplet exciton and the material uses its energy mostly for heat and is deactivated, as a result, the light emission efficiency is not elevated. For overcoming this problem, a method of forming a light-emitting layer by dispersing a phosphorescent substance in a host material which exhibits fluorescent property is employed.

According to this method, triplet excitons generated from the host material are used as triplet excitons for the phosphorescent substance to cause light emission therefrom.

However, this method involves energy transfer and unless the excited triplet level in the host material is close to the excited triplet level of the phosphorescent substance, the probability of energy transfer decreases and the triplet excitons cannot contribute to the light emission. In the case of the above-described device using (T-1) and (T-2), the excited triplet level of the host material used is considered close to the excited triplet level of (T-2).

Under these circumstances, the present inventors have made investigations on the method for, in an organic electroluminescent device using a phosphorescent emission, attaining high-luminance and high-efficiency light emission from a phosphorescent material which by itself does not emit light with high efficiency.

In order to apply an organic electroluminescent device to a display device such as flat panel display, the device must be ensured with sufficiently high stability at the driving in addition to the improvement of light emission efficiency. However, the organic electroluminescent device using the phosphorescence molecule (T-2) described in the above-described publication, which ensures high-efficiency light emission, is insufficient in the driving stability for practical use (see, *Jpn. J. Appl. Phys.*, Vol. 38, page L1502 (1999)). Thus, a high-efficiency display device cannot be realized.

This driving deterioration is presumed to arise mainly because of deterioration of the light-emitting layer.

Electric charges injected from electrodes form electron-hole pairs (excitons) at a certain probability. In general, the light emission (phosphorescence) by triplet excitons has a longer lifetime as compared with the light emission (fluorescence) by singlet excitons but, on the contrary, the singlet exciton has higher thermal stability than triplet exciton.

With increase of a current applied to a device, electric charges injected to the light-emitting layer increase and accompanying this, the amount of electric charges not participating in the generation of excitons also increase. Also, the amount of excitons which are generated but not contribute to the light emission in the light-emitting layer and are thermally deactivated increases and this causes elevation of the temperature of the light-emitting layer.

At this time, the device is considered to deteriorate because the triple exciton is inferior in the thermal stability as compared with singlet exciton. This can be also verified from the fact that the light emission efficiency of the organic electroluminescent device using the phosphorescence molecule (T-2) greatly decreases with the increase of injected current (see, *Appl. Phys. Lett.*, Vol. 75, page 4 (1999)).

As such, organic electroluminescent devices using a phosphorescence molecule have a serious problem in the device driving stability for the practical use at present.

For applying an organic electroluminescent device to a display device such as flat panel display, polychromatic display must be realized. In recent years, compact display devices such as portable telephone, which are a promising use of the organic electroluminescent device, are also required to have polychromatic display.

For realizing polychromatic display such as multicolor display and full color display by using an organic electroluminescent device, the following methods have been heretofore proposed:

1) a method of providing light emission sub pixel for desired colors such as red (R), green (G) and blue (B),
2) a method of disposing a color filter on a white light-emission layer and coloring the emitted light, and
3) a method of disposing a fluorescence converting layer on a blue light-emitting layer and converting the color of emitted light.

Among these, the method 1) uses no layer of absorbing emitted light, such as color filter, and ensures high use efficiency of light and therefore, this method is ideal for high-efficiency self-light emission-type polychromatic display devices. However, in this method, the materials suitable for respective emitted light colors must be prepared.

For this purpose, as described above, for example, a fluorescence dye for laser, such as coumarin, is doped into an aluminum complex of 8-hydroxyquinoline used as a host material to convert the light emission wavelength (see, *J. Appl. Phys.*, Vol. 65, page 3610 (1989)).

However, since conventionally proposed methods of doping a fluorescence dye all utilize the light emission by singlet excitons, the probability of generating excitons is theoretically low as described above and a sufficiently high light emission efficiency cannot be attained. Furthermore, the method of using a phosphorescence molecule such as (T-1) or (T-2) has a problem in that the number of molecules known to emit phosphorescence at room temperature is very small and desired colors cannot be afforded.

By taking account of these circumstances, the present inventors have studied on the method for attaining high efficiency, high driving stability and capability of polychromatic display, and succeeded in reaching the present invention.

SUMMARY OF THE INVENTION

The organic electroluminescent device of the present invention is characterized by that in an organic electroluminescent device comprising a substrate having thereon a light-emitting layer sandwiched by an anode and a cathode, the light-emitting layer comprises at least (1) a host material having electron-transporting and/or hole-transporting property,
(2) Compound A capable of phosphorescence emission at room temperature, and
(3) Compound B capable of phosphorescence emission or fluorescence emission at room temperature and having the maximum light emission wavelength longer than the maximum light emission wavelength of Compound A, and the maximum light emission wavelength of the device is attributable to (3).

More specifically, the present inventors have found that when the constituent element (2), namely, Compound A, which is capable of phosphorescence emission at room temperature, is used in combination with the constituent element (3), namely Compound B, which is (a) phosphorescent compound not capable of emitting light with high efficiency by itself, or which is (b) a fluorescent compound capable of emitting light in various colors but incapable of ensuring light emission efficiency as high as that of the phosphorescent compound for any of those colors, Compound A plays a role of sensitizer, and the light emission of Compound B is intensified.

As a result, a device capable of emitting light in various colors can be obtained and accordingly, this is very useful in realizing a flat panel display of multi-color display or full-color display using an organic electroluminescent device.

In the case where Compound B is a compound capable of fluorescence emission at room temperature, an effect of inhibiting the deterioration of luminance and the decrease in a light emission efficiency can also be provided and this is preferred. By the combination use with the phosphorescence emission Compound A, a light emission color attributable to the fluorescent Compound B and light emission efficiency close to the phosphorescence emission can be realized and at the same time, the aging deterioration of luminance and the decrease in the light emission efficiency when the device emits light at a high luminance, which occurs very often in phosphorescence emission devices, can be inhibited to elevate the driving stability.

DETAILED DESCRIPTION OF THE INVENTION

Figure 1:
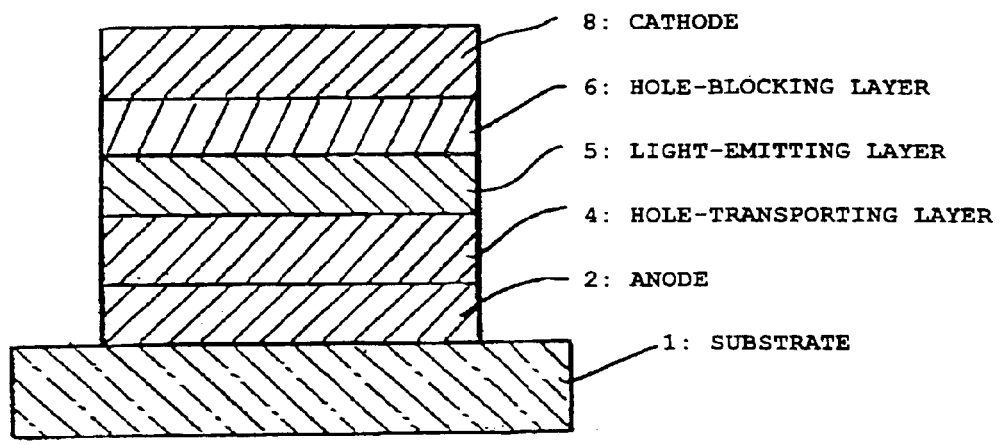
FIG. 1 is a schematic sectional view showing one example of the organic electroluminescent device according to the present invention.

The present invention relates to an organic electroluminescent device containing a host material, Compound A capable of phosphorescence emission at room temperature and Compound B capable of phosphorescence emission or fluorescence emission at room temperature in the light-emitting layer, and having a maximum light emission wavelength attributable to Compound B. In the organic electroluminescent device, the light-emitting layer preferably contains the host material as a main component and Compound A and Compound B as sub-components.

The term "main component" as used herein means a material occupying 50% by weight or more in the materials constituting the layer and the term "sub-component" means a material occupying less than 50% by weight in the materials constituting the layer. That is, the term "contains Compounds A and B as sub-components" means that the total amount of Compound A and Compound B is less than 50% by weight based on the materials for forming the light-emitting layer.

The host material preferably has an excited triplet level in an energy state higher than the excited triplet level of Compound A and the excited triplet level (when Compound B is a phosphorescent compound) or excited singlet level (when Compound B is a fluorescent compound) of Compound B, contained in the light-emitting layer.

Also, the host material must be a compound ensuring a stable thin film shape, having a high glass transition temperature (Tg) and being capable of efficiently transporting holes and/or electrons.

Furthermore, the host material must be a compound which is electrochemically and chemically stable and does not easily allow the generation of impurities working out to a trap or quenching the emitted light during the production or use.

Examples of the host material satisfying these requirements include the compounds represented by the following formula (I) or (II), or the compounds having the group represented by the following formula (III):

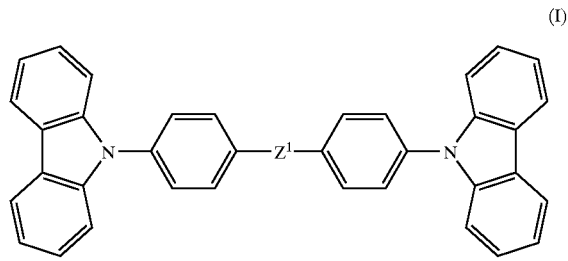

(wherein the carbazolyl group and the phenylene group each may have an arbitrary substituent, and $Z^1$ represents a direct bond or a divalent linking group).

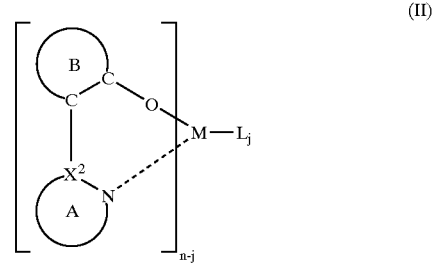

(wherein M represents a metal selected from Groups 1, 2, 3, 12 and 13 of the periodic table, n represents a valence number of the metal, L represents an arbitrary substituent, j represents a number of the substituent L and is 0 or 1, $X^2$ represents a carbon atom or a nitrogen atom, the ring A represents a nitrogen-containing heterocyclic ring and may have a substituent, and the ring B represents an aromatic hydrocarbon ring group or an aromatic heterocyclic group and may have a substituent).

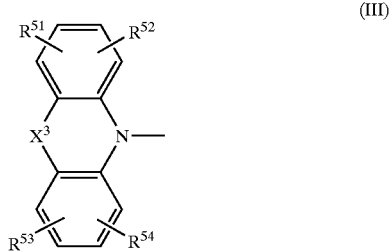

(wherein $R^{51}$ to $R^{54}$ each independently represents a hydrogen atom or an arbitrary substituent, each of the pairs $R^{51}$ and $R^{52}$, and $R^{53}$ and $R^{54}$ may combine to form a ring, and $X^3$ represents an oxygen atom or a sulfur atom).

Preferred examples of the compound having an N-phenylcarbazole skeleton, represented by formula (I), include the compounds represented by the following formula (I-1):

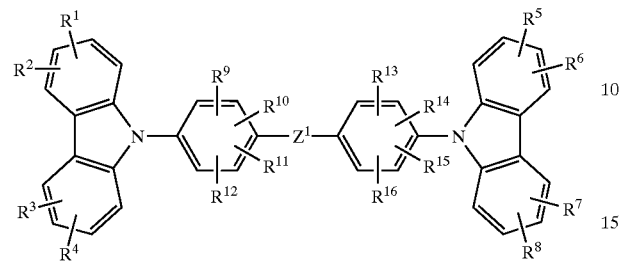

(wherein $R^1$ to $R^{16}$ each independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group or an aromatic hydrocarbon ring group or aromatic heterocyclic group which may have a substituent, each of the adjacent substituents $R^1$ and $R^2$, $R^3$ and $R^4$, $R^5$ and $R^6$, $R^7$ and $R^8$, $R^9$ and $R^{10}$, $R^{11}$ and $R^{12}$, $R^{13}$ and $R^{14}$, and $R^{15}$ and $R^{16}$ may combine to form a ring, and $Z^1$ represents a direct bond or a divalent linking group).

Specific examples of $R^1$ to $R^{16}$ in formula (I-1) include a hydrogen atom; a halogen atom such as chlorine atom and fluorine atom; an alkyl group having from 1 to 6 carbon atoms such as methyl group and ethyl group; an aralkyl group such as benzyl group; an alkenyl group having from 2 to 6 carbon atoms such as vinyl group; a cyano group; an amino group; an acyl group; an alkoxycarbonyl group having from 2 to 6 carbon atoms such as methoxycarbonyl group and ethoxycarbonyl group; a carboxyl group; an alkoxy group having from 1 to 6 carbon atoms such as methoxy group and ethoxy group; an alkylamino group such as diethylamino group and diisopropylamino group; an aralkylamino group such as dibenzylamino group and diphenethylamino group; a haloalkyl group such as trifluoromethyl group; a hydroxyl group; an aryloxy group such as phenoxy group and benzyloxy group; an aromatic hydrocarbon ring group such as phenyl group or naphthyl group, which may have a substituent; and an aromatic heterocyclic group such as thienyl group and pyridyl group, which may have a substituent.

Examples of the substituent which the aromatic hydrocarbon ring group and the aromatic heterocyclic group each can have include a halogen atom such as fluorine atom; an alkyl group having from 1 to 6 carbon atoms such as methyl group and ethyl group; an alkenyl group having from 2 to 6 carbon atoms such as vinyl group; an alkoxycarbonyl group having from 2 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; an alkylamino group such as dimethylamino group and diethylamino group; an acyl group such as acetyl group; a haloalkyl group such as trifluoromethyl group; and a cyano group.

Each pair of the adjacent substituents $R^1$ and $R^2$, $R^3$ and $R^4$, $R^5$ and $R^6$, $R^7$ and $R^8$, $R^9$ and $R^{10}$, $R^{11}$ and $R^{12}$, $R^{13}$ and $R^{14}$, and $R^{15}$ and $R^{16}$ may be combine to form a 5-, 6- or 7-membered ring such as benzene ring or cyclohexane ring.

$R^1$ to $R^{16}$ each is particularly preferably a hydrogen atom, an alkyl group or a cyano group.

$Z^1$ in formula (I) or (I-1) is preferably a direct bond, an oxygen atom, a sulfur atom, a linking group shown below:

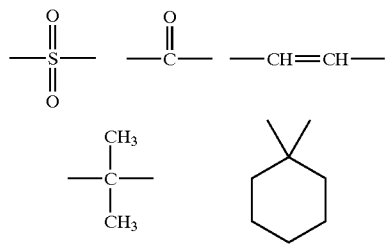

a divalent aromatic hydrocarbon ring group or aromatic heterocyclic group which may have a substituent, or any one of the following linking groups:

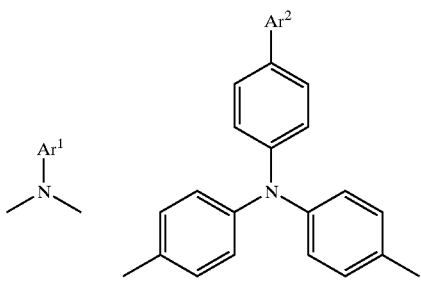

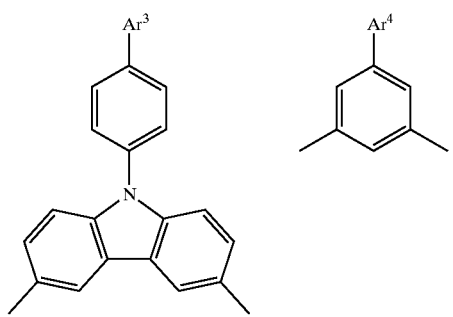

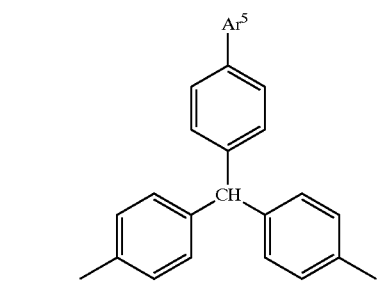

-continued

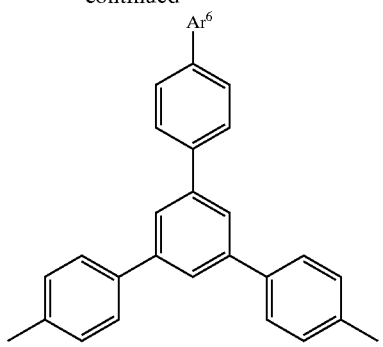

(any benzene ring moiety in the each structure may have an arbitrary substituent, and $Ar^1$ to $Ar^6$ each represents an aromatic hydrocarbon ring group or aromatic heterocyclic group which may have a substituent or a group represented by the following formula (I-2):

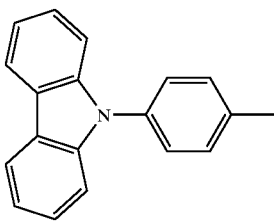

wherein the carbazolyl group and the phenylene group each may have an arbitrary substituent).

Among the preferred linking groups for $Z^1$ in formula (I) or (I-1), examples of the aromatic hydrocarbon ring group include a 5- or 6-membered monocyclic ring and a 2-, 3- or 4-condensed ring, such as phenylene group, naphthylene group, anthranyl group and naphthacene, and examples of the aromatic heterocyclic group include a 5- or 6-membered monocyclic ring and a 2- or 3-condensed ring, such as divalent thiophene ring residue, furan ring residue, pyridine ring residue, pyrimidine ring residue and quinoline ring residue.

These aromatic hydrocarbon ring group and aromatic heterocyclic group may have a substituent such as an alkyl group having from 1 to 6 carbon atoms (e.g. methyl, ethyl), a halogen group (e.g. fluorine) or an α-haloalkyl group (e.g. trifluoromethyl).

Examples of $Ar^1$ to $Ar^6$ include an aromatic hydrocarbon ring group which is a 5- or 6-membered monocyclic ring or a 2-, 3- or 4-condensed ring, such as phenylene group, naphthylene group, anthranyl group and naphthacene, and an aromatic heterocyclic ring which is a 5- to 6-membered monocyclic ring or a 2- or 3-condensed ring, such as thienyl group, furan group, pyridyl group, pyrimidinyl group and quinolyl group. These aromatic hydrocarbon ring group and aromatic heterocyclic group may have a substituent such as an alkyl group (e.g. methyl, ethyl), a halogen group (e.g. fluorine) or an α-haloalkyl group (e.g. trifluoromethyl).

The structure represented by formula (I-2) is preferably represented by the following formula (I-3):

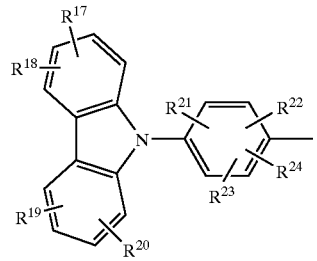

(wherein $R^{17}$ to $R^{24}$ each independently represents a hydrogen atom, a halogen atom, an alkyl group, an aralkyl group, an alkenyl group, a cyano group, an amino group which may have a substituent, an acyl group, an alkoxycarbonyl group, a carboxyl group, an alkoxy group, an alkylamino group, an aralkylamino group, a haloalkyl group, a hydroxyl group, an aryloxy group, or an aromatic hydrocarbon ring group or aromatic heterocyclic group which may have a substituent, each of the pairs $R^{17}$ and $R^{18}$, $R^{19}$ and $R^{20}$, $R^{21}$ and $R^{22}$, and $R^{23}$ and $R^{24}$ may combine with each other to form a ring).

Specific examples of $R^{17}$ to $R^{24}$ in formula (I-3) include a hydrogen atom; a halogen atom; an alkyl group having from 1 to 6 carbon atoms such as methyl group and ethyl group; an aralkyl group such as benzyl group; an alkenyl group having from 2 to 6 carbon atoms such as vinyl group; a cyano group; an amino group; an acyl group; an alkoxycarbonyl group having from 2 to 6 carbon atoms such as methoxycarbonyl group and ethoxycarbonyl group; a carboxyl group; an alkoxy group having from 1 to 6 carbon atoms such as methoxy group and ethoxy group; an alkylamino group such as diethylamino group and diisopropylamino group; an aralkylamino group such as dibenzylamino group and diphenethylamino group; a haloalkyl group such as trifluoromethyl group; a hydroxyl group; an aryloxy group such as phenoxy group and benzyloxy group; an aromatic hydrocarbon ring group such as phenyl group and naphthyl group, which may have a substituent; and an aromatic heterocyclic group such as thienyl group and pyridyl group, which may have a substituent.

Examples of the substituent which the aromatic hydrocarbon ring group and the aromatic heterocyclic group each can have include a halogen atom such as fluorine atom; an alkyl group having from 1 to 6 carbon atoms such as methyl group and ethyl group; an alkenyl group having from 2 to 6 carbon atoms such as vinyl group; an alkoxycarbonyl group having from 2 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; a dialkylamino group such as dimethylamino group and diethylamino group; an acyl group such as acetyl group; a haloalkyl group such as trifluoromethyl group; and a cyano group.

Each pair of the adjacent substituents $R^{17}$ and $R^{18}$, $R^{19}$ and $R^{20}$, $R^{21}$ and $R^{22}$, and $R^{23}$ and $R^{24}$ may combine to form a 5-, 6- or 7-membered ring such as benzene ring or cyclohexane ring.

Specific preferred examples of the compound represented by formula (I) are set forth below, however, the present invention is not limited thereto.

(H-1)
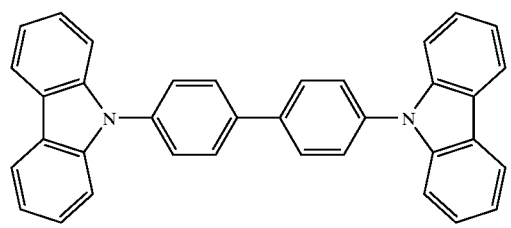
(H-2)
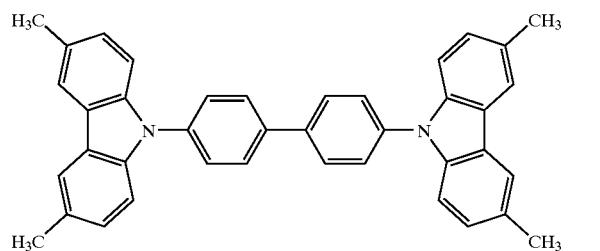
(H-3)
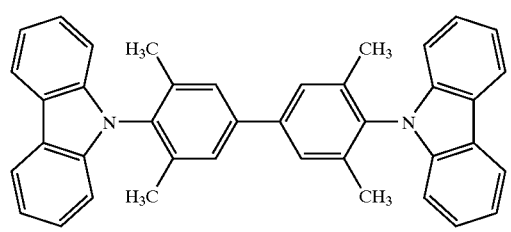
(H-4)
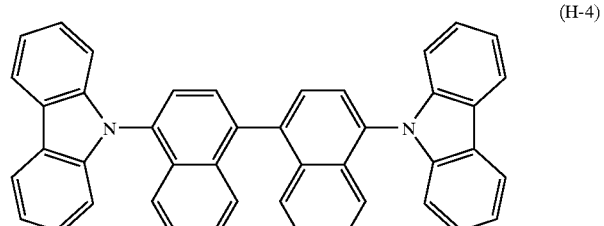
(H-5)
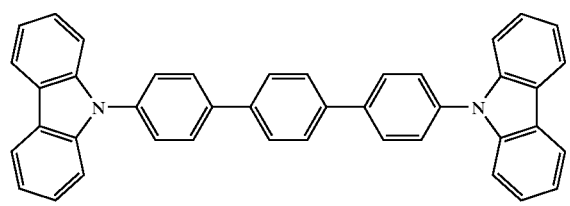
(H-6)
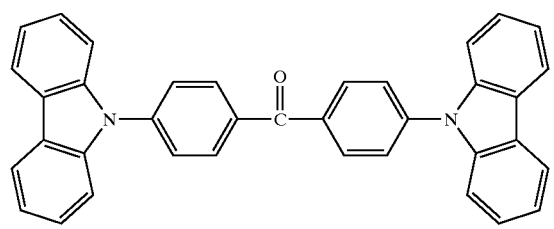
(H-7)
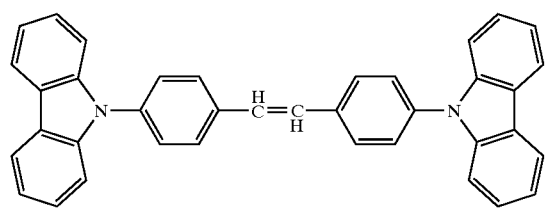
(H-8)
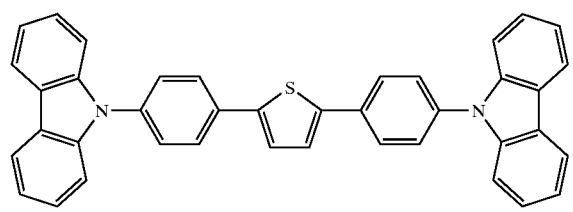
(H-9)
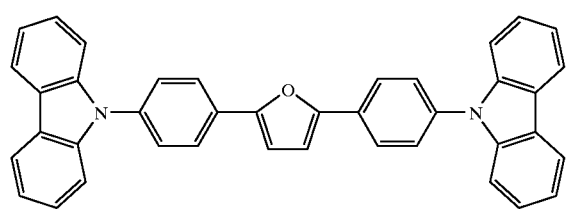
(H-10)
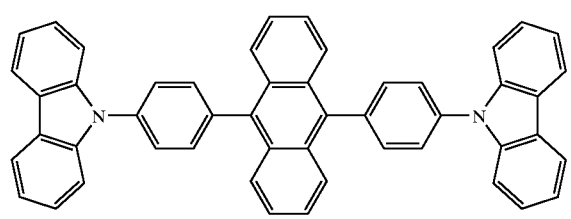

-continued
(H-11)
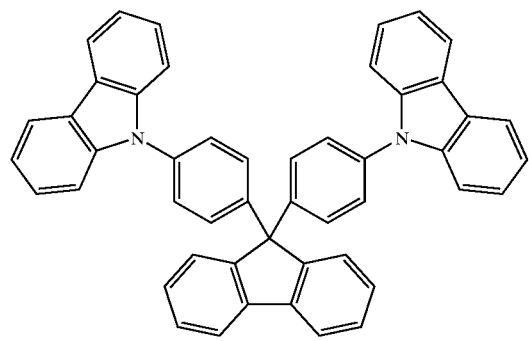
(H-34)
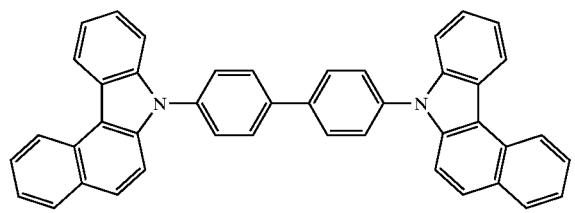
(H-12)
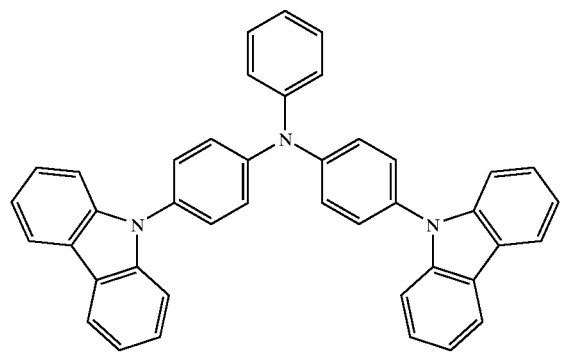
(H-13)
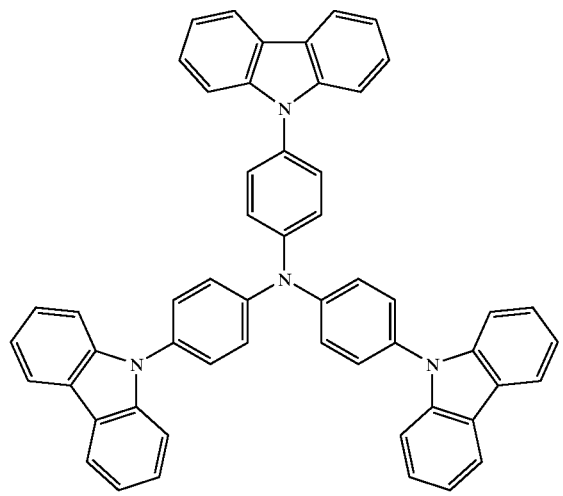
(H-14)
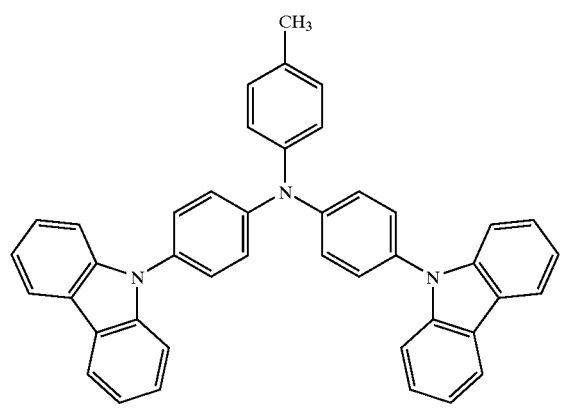
(H-15)
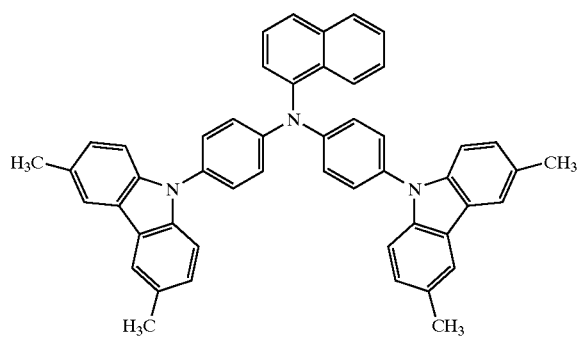

-continued
(H-16)
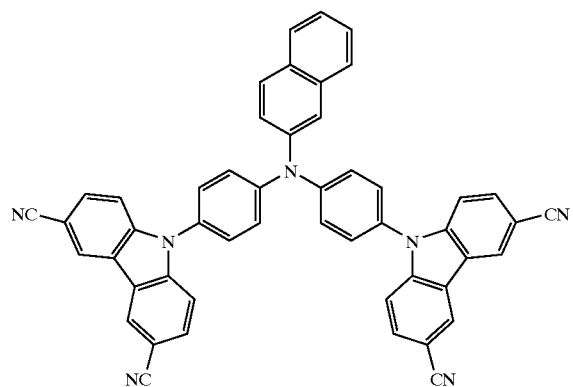
(H-17)
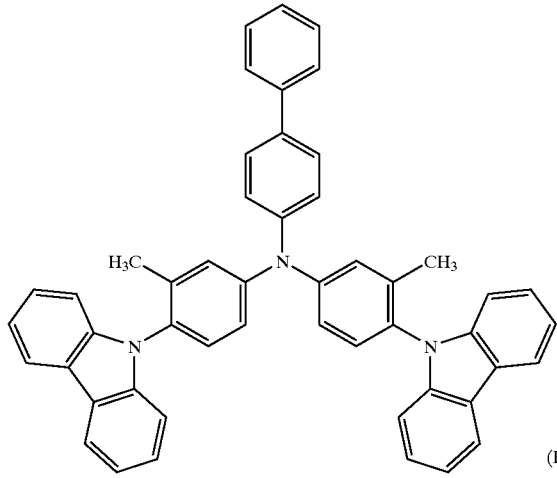
(H-18)
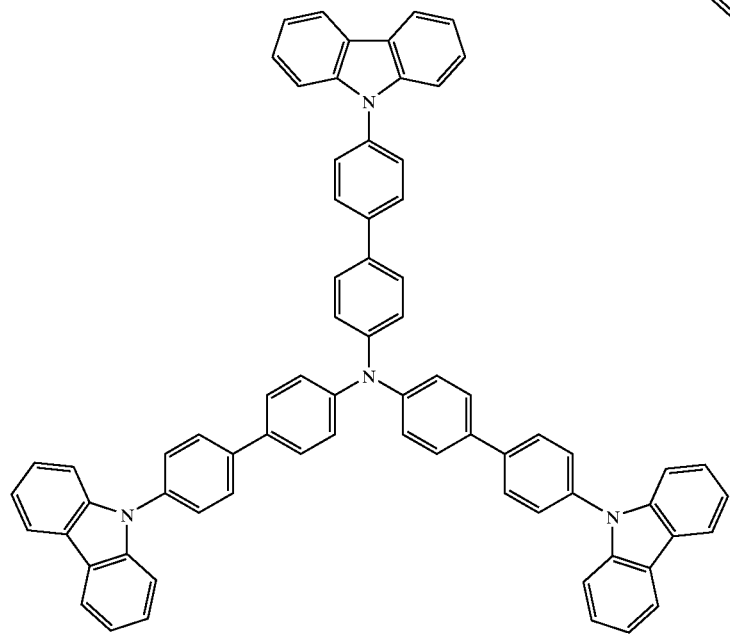
(H-19)
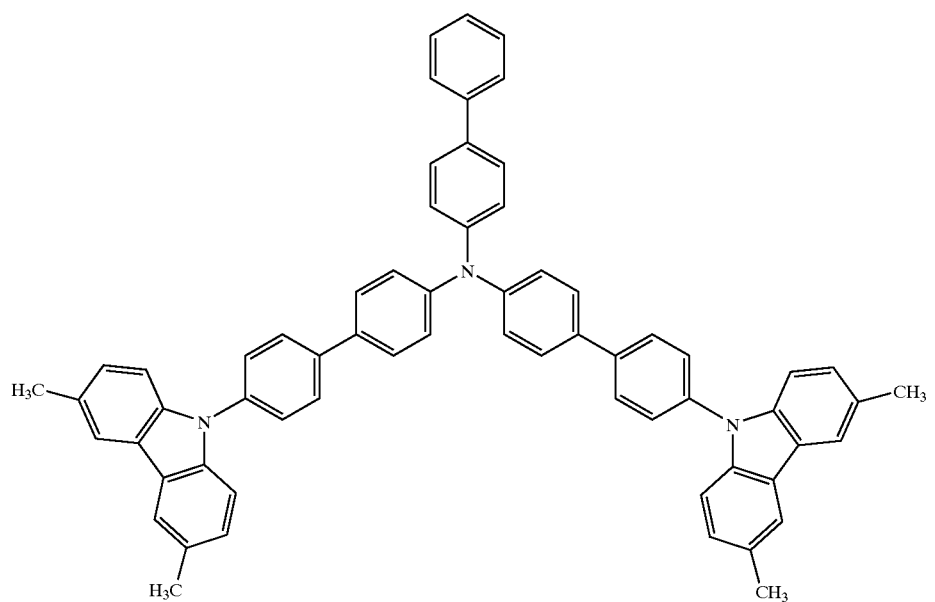

(H-20)
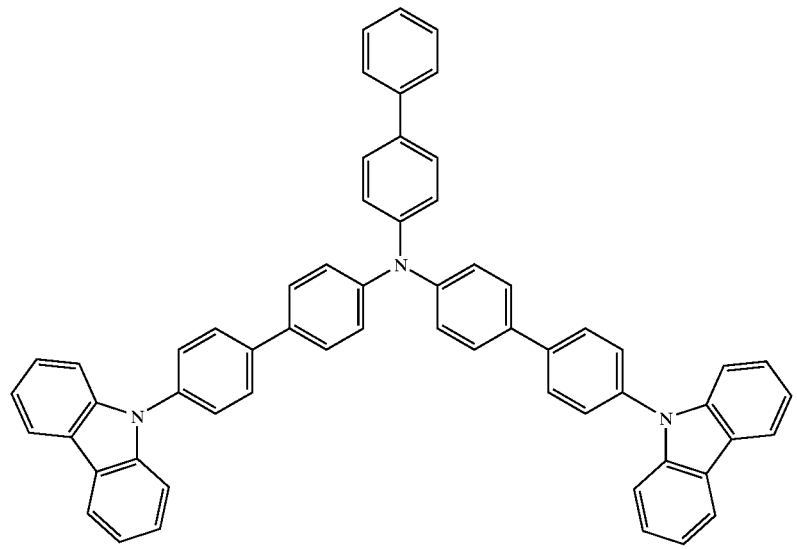
(H-21)
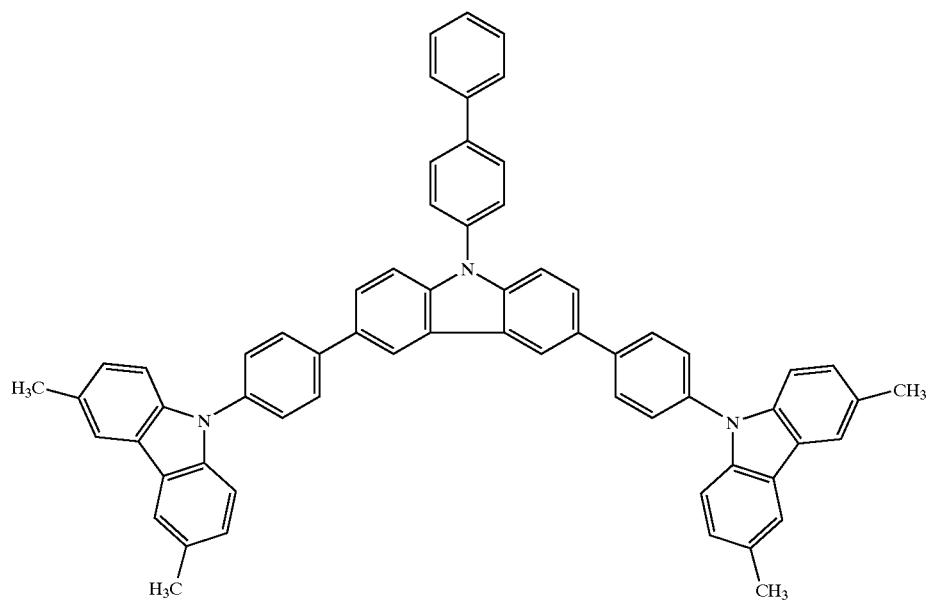
(H-22)
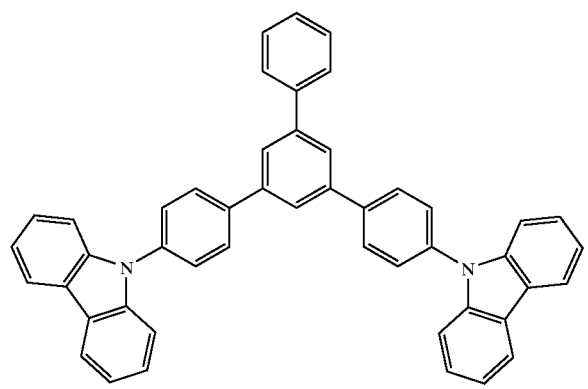
(H-23)
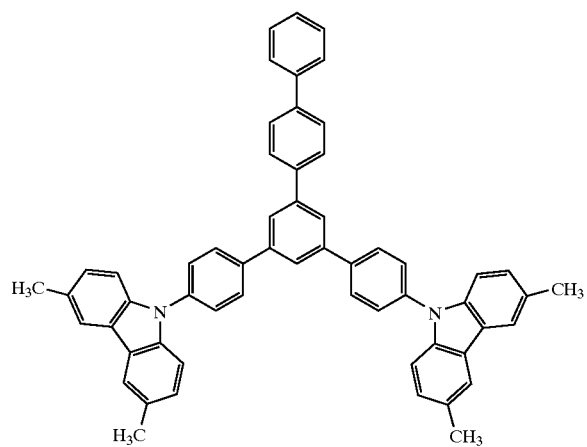

-continued
(H-24)
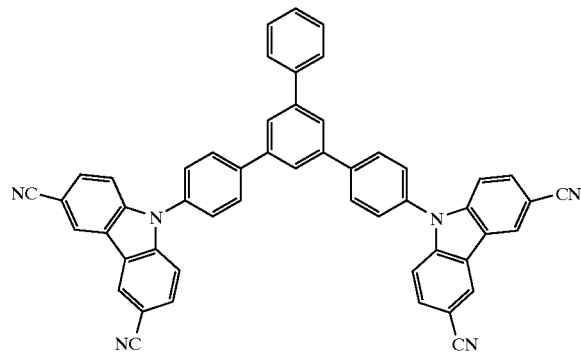
(H-25)
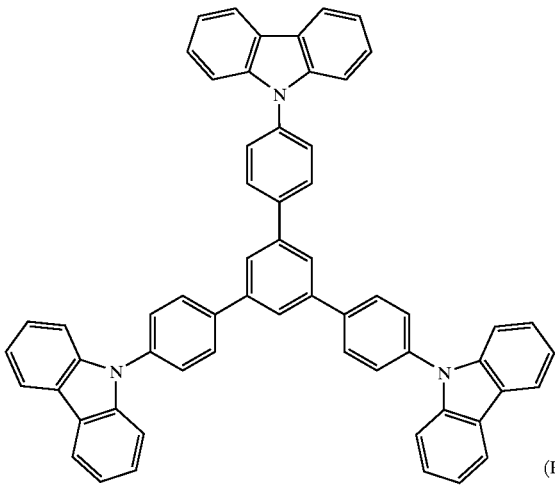
(H-26)
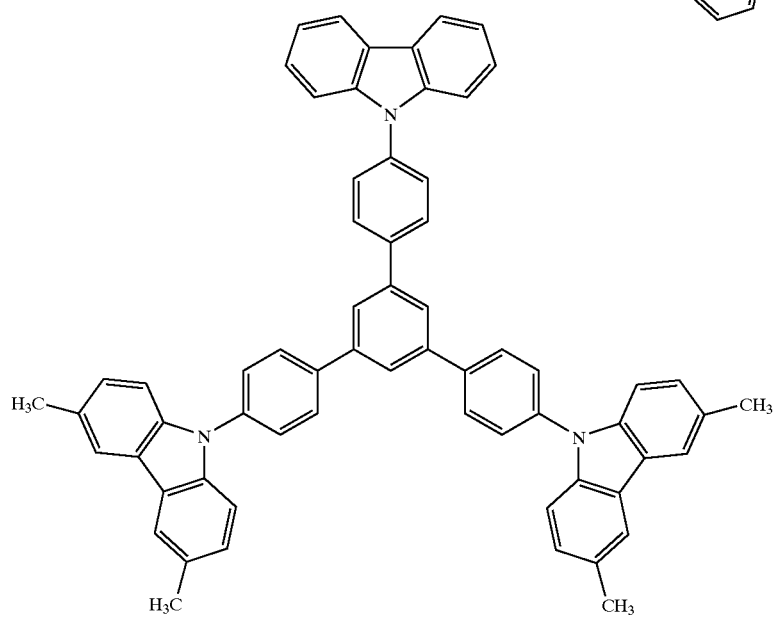
(H-27)
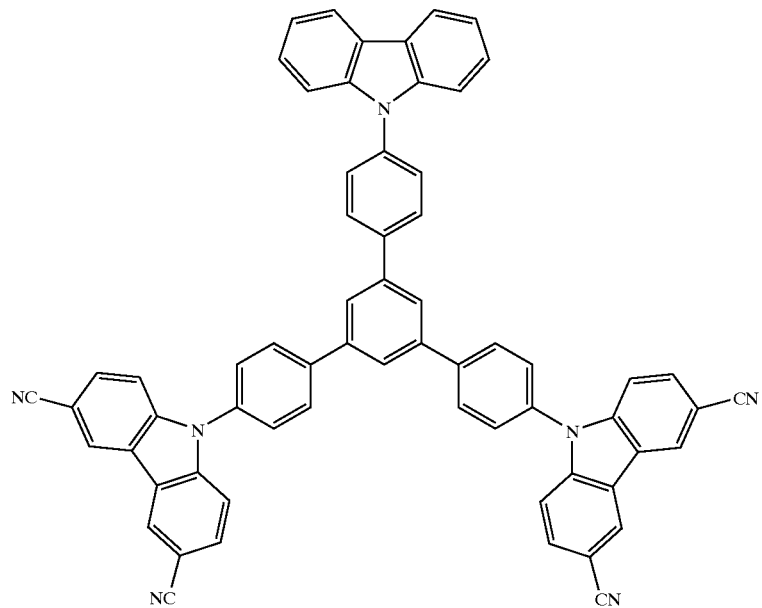

(H-28)
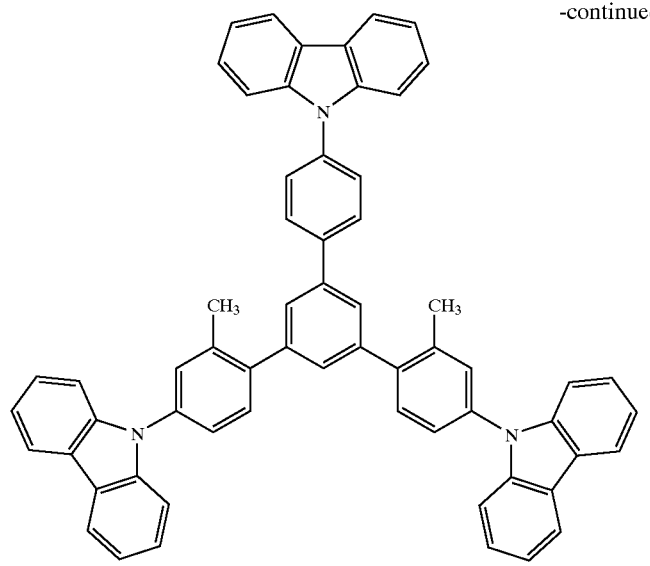
(H-29)
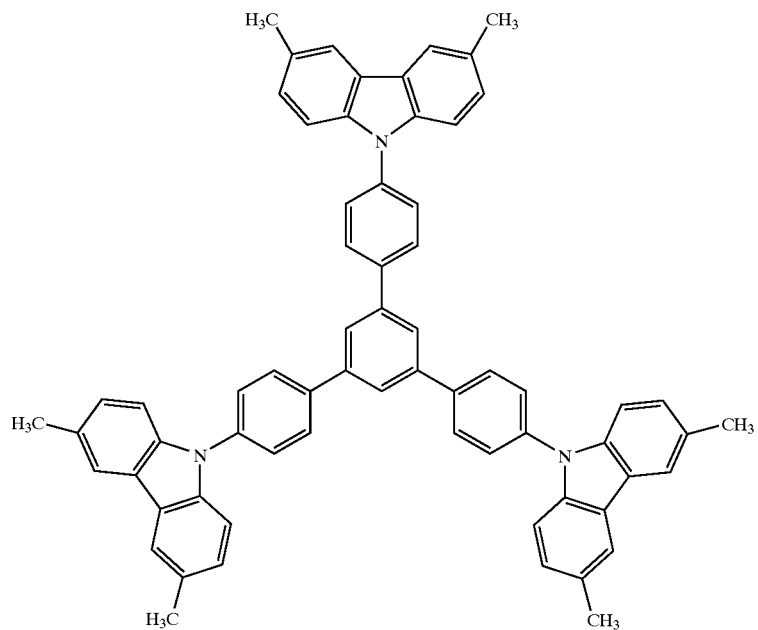
(H-30)
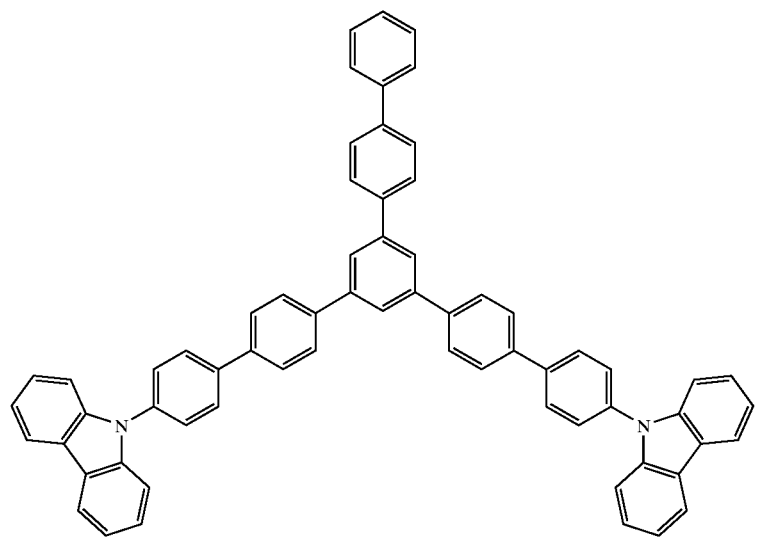

-continued
(H-31)
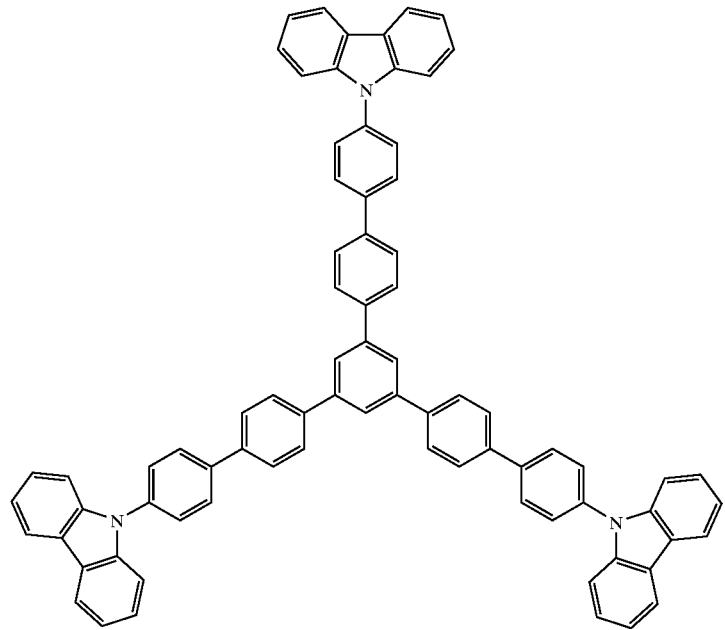
(H-32)
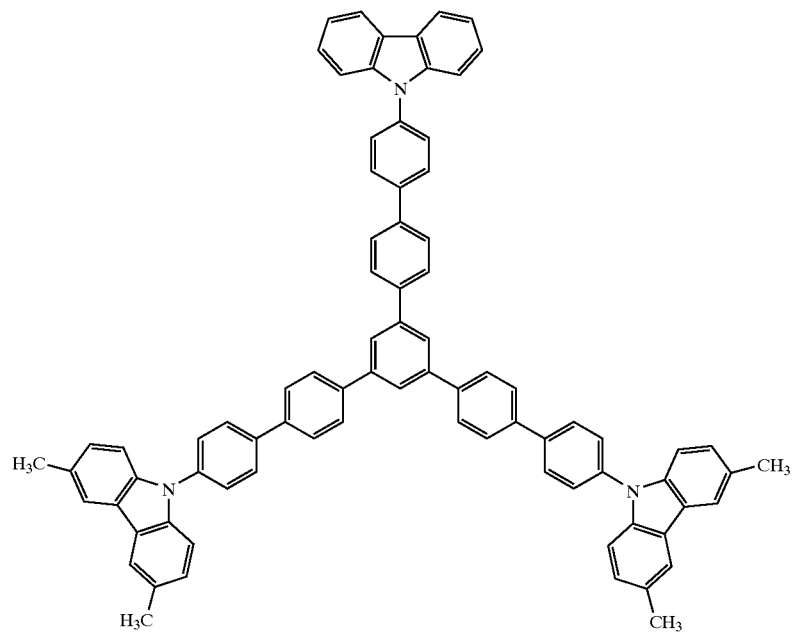

(H-33)

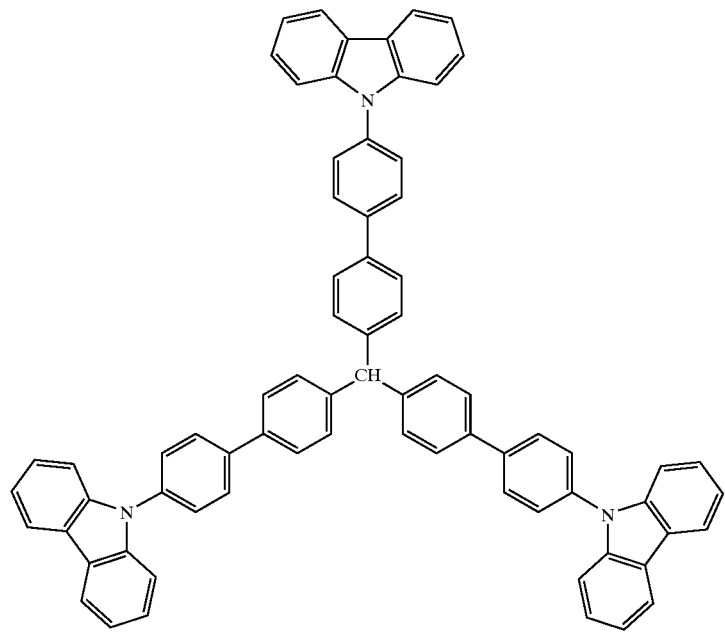

In the light-emitting layer, these compounds may be used individually or, if desired, in combination of two or more thereof.

In the organic electroluminescent device of the present invention, an organic metal complex compound represented by formula (II) may be used as the host material of the light-emitting layer. An organic metal complex represented by the following formula (II-1), a mixed ligand complex represented by the following formula (II-2) and a binuclear metal complex represented by the following formula (II-3) are particularly preferred.

[Organic Metal Complex]

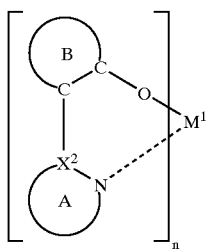

(II-1)

(wherein $M^1$ is a mono-, di- or trivalent metal, n, $X^2$ and the rings A and B have the same meanings as in formula (II));

[Mixed Ligand Complex]

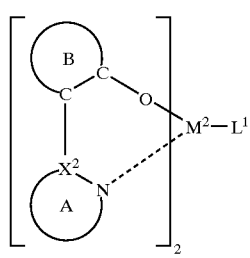

(II-2)

(wherein $M^2$ represents a trivalent metal, $X^2$ and the rings A and B have the same meanings as in formula (II), and $L^1$ represents the following formula (II-2a), (II-2b) or (II-2c)):

(II-2a)

(II-2b)

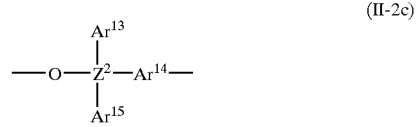

(II-2c)

(wherein $Ar^{11}$ to $Ar^{15}$ each represents an aromatic hydrocarbon ring group which may have a substituent or an aromatic heterocyclic group which may have a substituent, and $Z^2$ represents silicon or germanium);

[Binuclear Metal Complex]

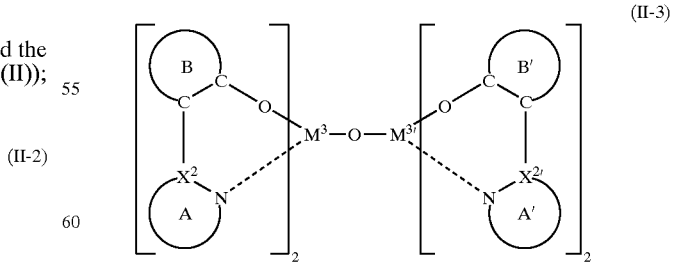

(II-3)

(wherein $M^3$ and $M^{3'}$ each represents a trivalent metal, $X^2$ and the rings A and B have the same meanings as in formula (II), $X^{2'}$ and the rings A' and B' have the same meanings as $X^2$ and the rings A and B, respectively).

A plurality of the following structural moieties:

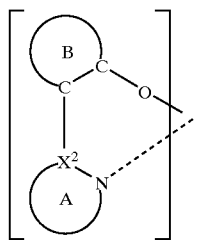

(in formula (II-3), the following structural moieties each present in a couple in one compound:

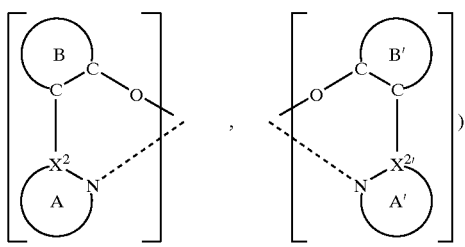

namely, the rings A, the rings B and X²s (in the case of formula (II-3), the rings A, the rings A', the rings B, the rings B', X₂s and X²'s), contained in one molecule of the compound represented by formula (II), (II-1), (II-2) or (II-3) may be the same or different. From the standpoint that the synthesis is facilitated, all of these are preferably the same.

Similarly, M³ and M³ in the compound represented by formula (II-3) may be the same or different and from the standpoint that the synthesis is facilitated, both of these are preferably the same.

The ring A, the ring A', the ring B and the ring B' in the compounds represented by formula (II), (II-1), (II-2) or (II-3) each is preferably selected from the following rings.
[Ring A and Ring A']
5-Membered or 6-membered nitrogen-containing aromatic heterocyclic rings which may have a substituent. One or two 5- or 6-membered aromatic hydrocarbon ring or aromatic heterocyclic ring may be condensed to the ring to form a condensed ring.
[Ring B and ring B']
6-Membered aromatic hydrocarbon rings or aromatic heterocyclic rings, which may have a substituent. One or two 5- or 6-membered aromatic hydrocarbon ring or aromatic heterocyclic ring may be condensed to the ring to form a condensed ring.

The ring A, the ring A', the ring B and the ring B' in the compounds represented by formula (II), (II-1), (II-2) or (II-3) each is more preferably a monocyclic ring and particularly preferably a ring selected from the following rings.
[Ring A and Ring A']
Diazole ring, thiazole ring, oxazole ring, thiadiazole ring, oxadiazole ring, triazole ring, pyridine ring, diazine ring and triazine ring, which may have a substituent.
[Ring B and Ring B']
Benzene ring, pyridine ring, diazine ring and triazine ring, which may have a substituent.

The ring A, the ring A', the ring B and the ring B' in the compounds represented by the formula (II), (II-1), (II-2) or (II-3) each is most preferably a ring selected from the following structural formulae:

[Ring A and Ring A']

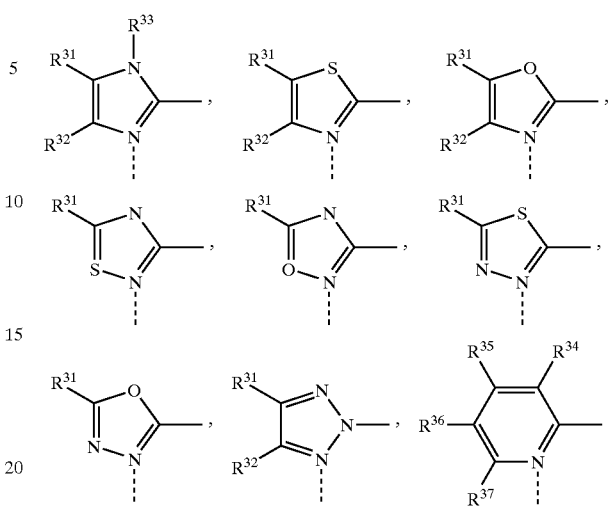

(wherein $R^{31}$ to $R^{37}$ each independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group, an aromatic hydrocarbon ring group or aromatic heterocyclic group which may have a substituent, or each of the pairs $R^{31}$ and $R^{32}$, $R^{31}$ and $R^{33}$, $R^{34}$ and $R^{35}$, $R^{35}$ and $R^{36}$, and $R^{36}$ and $R^{37}$ may combine with each other to form a ring).

[Ring B and Ring B']

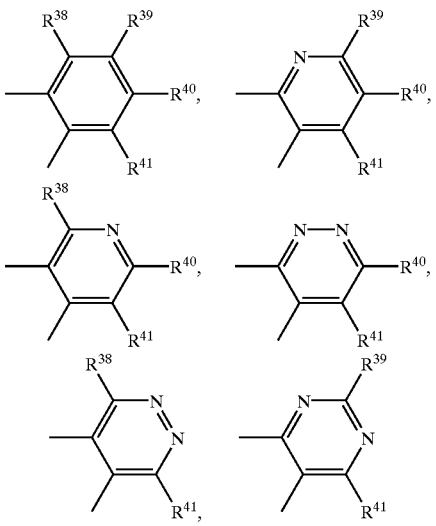

(wherein $R^{38}$ to $R^{41}$ each independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group, an aromatic hydrocarbon ring group which may have a substituent or an aromatic heterocyclic group that may have a substituent, or each of the pairs $R^{38}$ and $R^{39}$, $R^{39}$ and $R^{40}$, and $R^{40}$ and $R^{41}$ may combine with each other to form a ring).

In each structure of [Ring B and Ring B'] shown above, two bonds either may be bonded to either the oxygen atom or the atom X on the ring A or the ring A' insofar as the definitions of the ring B and ring B' structures in formulae (II) and (II-1) to (II-3) are satisfied.

$R^{31}$ to $R^{41}$ each specifically represents a hydrogen atom; a halogen atom; an alkyl group having from 1 to 6 carbon atoms such as methyl group or ethyl group; an aralkyl group such as benzyl group; an alkenyl group having from 2 to 6 carbon atoms such as vinyl group; a cyano group; an amino group; an acyl group; a carboxyl group; an alkoxy group having from 1 to 6 carbon atoms such as methoxy group or ethoxy group; an alkoxycarbonyl group having from 2 to 6 carbon atoms such as methoxycarbonyl group or ethoxycarbonyl group; an aryloxy group such as phenoxy group or benzyloxy group; a dialkylamino group such as diethylamino group or diisopropylamino group; a diaralkylamino group such as dibenzylamino group or diphenethylamino group; an α-haloalkyl group such as trifluoromethyl group; a hydroxyl group; an aromatic hydrocarbon ring group such as phenyl group or naphthyl group, which may have a substituent; or an aromatic heterocyclic group such as thienyl group or pyridyl group, which may have a substituent.

Examples of the substituent which the aromatic hydrocarbon ring group and the aromatic heterocyclic group each can have include a halogen atom such as fluorine atom; an alkyl group having from 1 to 6 carbon atoms such as methyl group and ethyl group; an alkenyl group having from 2 to 6 carbon atoms such as vinyl group; an alkoxycarbonyl group having from 2 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; a dialkylamino group such as dimethylamino group and diethylamino group; an acyl group such as acetyl group; a haloalkyl group such as trifluoromethyl group; and a cyano group.

Examples of the ring formed by combining each pair of the adjacent substituents $R^{31}$ and $R^{32}$, $R^{31}$ and $R^{33}$, $R^{34}$ and $R^{35}$, $R^{35}$ and $R^{36}$, $R^{36}$ and $R^{37}$, $R^{38}$ and $R^{39}$, $R^{39}$ and $R^{40}$, and $R^{40}$ and $R^{41}$ include a benzene ring and a cyclohexane ring.

$R^{31}$ to $R^{41}$ each is preferably a hydrogen atom, a halogen atom, an alkyl group, an alkoxy group, a haloalkyl group or an aromatic hydrocarbon group which may have a substituent, or each combine with the adjacent substituent to form a ring.

The metal M ($M^1$, $M^2$, $M^3$ and $M^{3'}$) in the compounds represented by formula (II) (II-1), (II-2) or (II-3) is not particularly limited insofar as the metal is selected from Groups 1, 2, 3, 12 and 13 of the periodic table, however, preferred examples thereof include zinc, aluminum, gallium, beryllium and magnesium.

Specific examples of the compounds represented by formula (II), (II-1), (II-2) or (II-3) are set forth below, however, the present invention is not limited thereto.

(H-40)

(H-41)

(H-42)

(H-43)

(H-44)

(H-45) 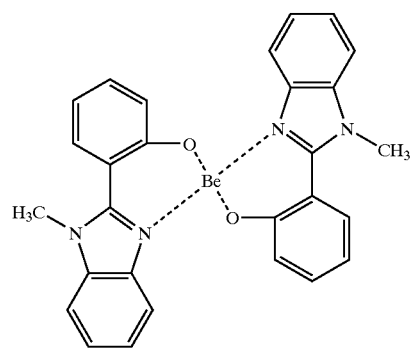
(H-46) 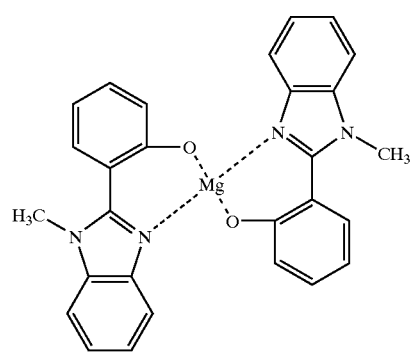
(H-47) 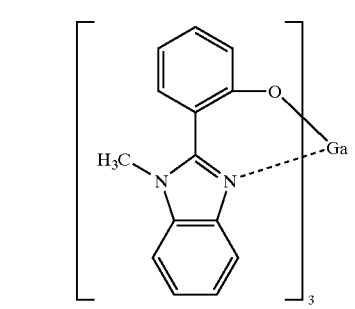
(H-48) 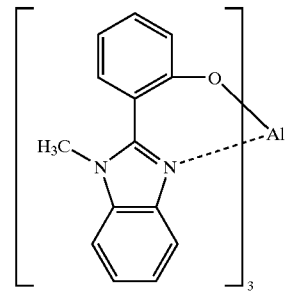
(H-49) 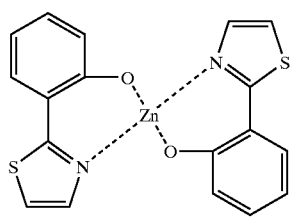
(H-50) 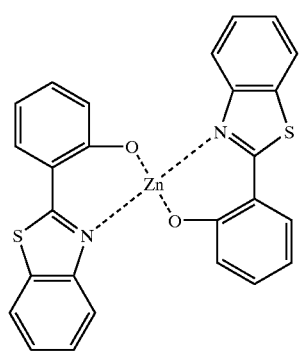
(H-51) 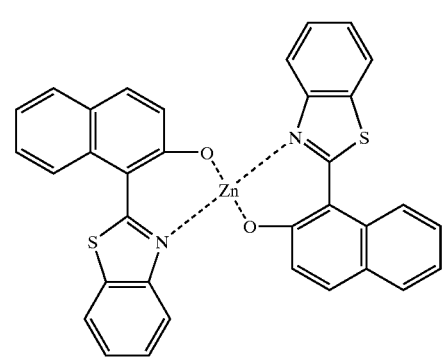
(H-52) 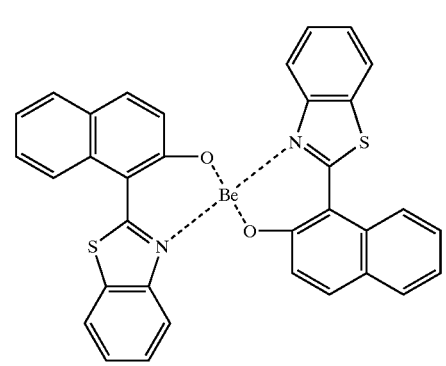
(H-53) 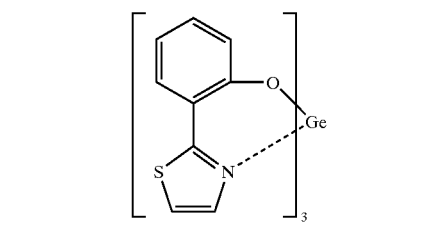
(H-54) 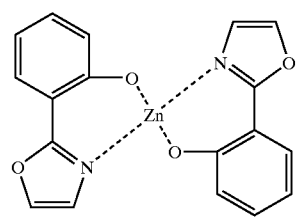

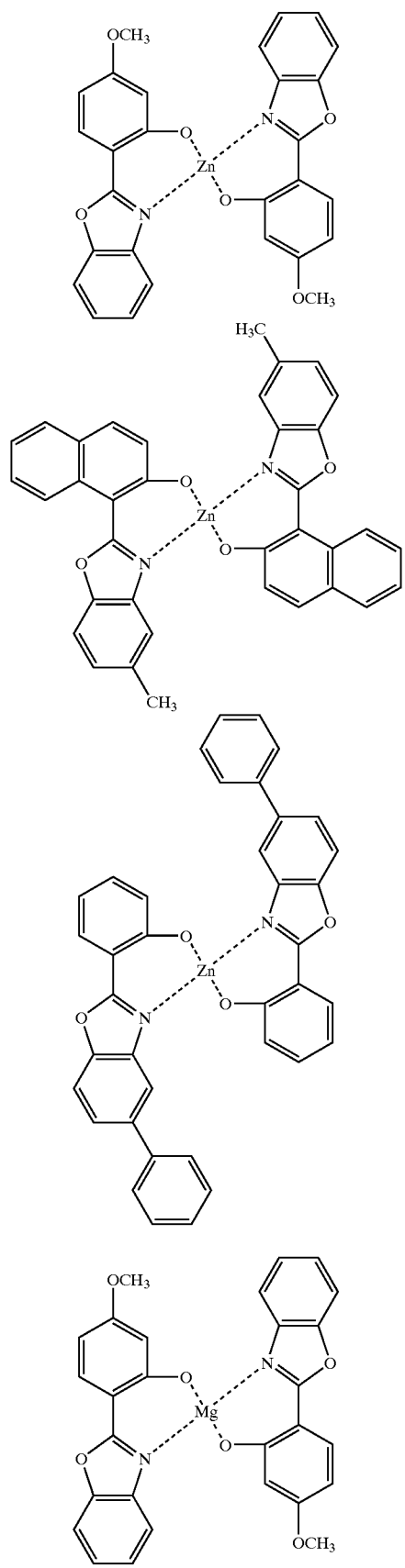

(H-65)

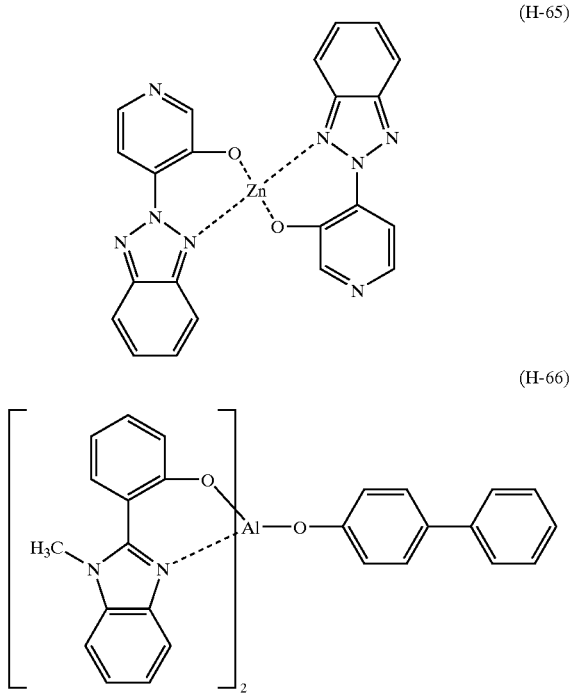

(H-66)

(H-67)

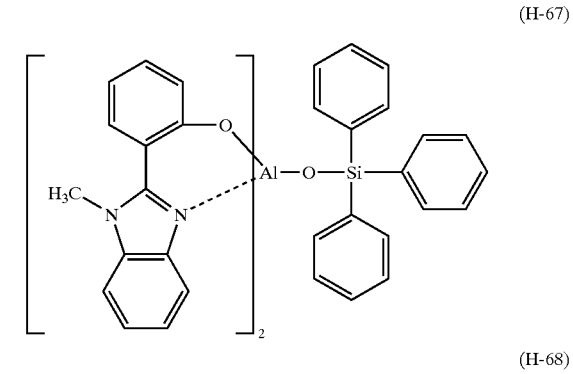

(H-68)

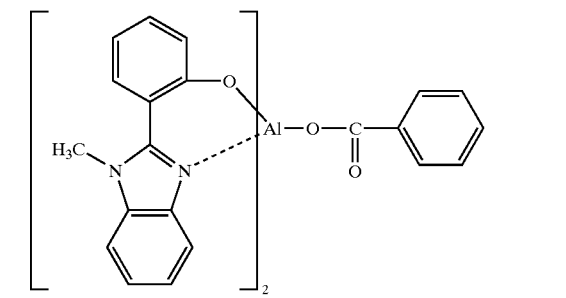

(H-69)

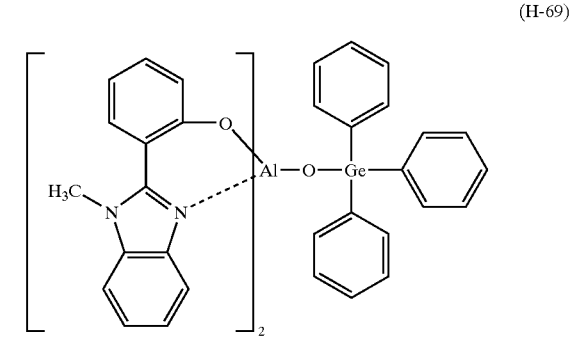

(H-70)

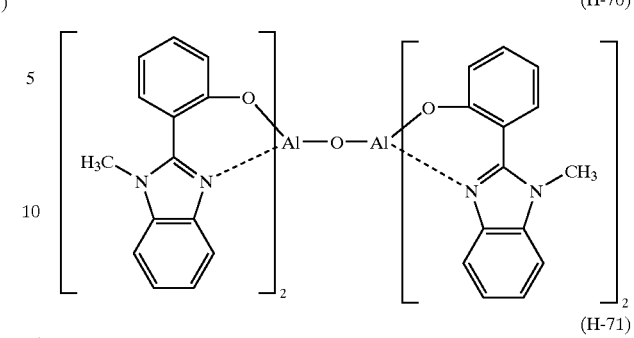

(H-71)

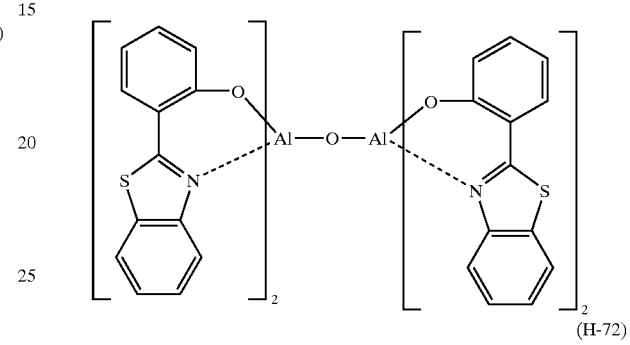

(H-72)

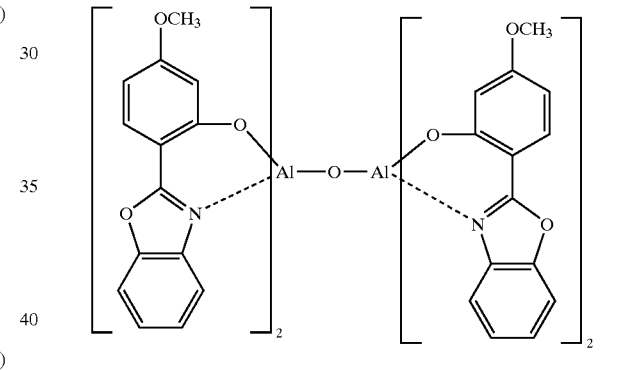

In the light-emitting layer, these compounds may be used individually as a main component or, if desired, may be used in combination.

In the organic electroluminescent device of the present invention, the host material used in the light-emitting layer may be a compound having a group represented by formula (III) (structural formula shown below):

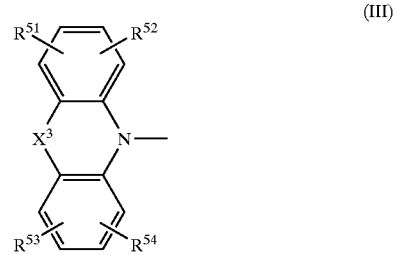

(III)

(wherein $R^{51}$ to $R^{54}$ each independently represents a hydrogen atom or an arbitrary substituent, each of the pairs $R^{51}$ and $R^{52}$, and $R^{53}$ and $R^{54}$ may combine to form a ring, and $X^3$ represents an oxygen atom or a sulfur atom).

Examples of the ring formed by combining each of the pairs $R^{51}$ and $R^{52}$, and $R^{53}$ and $R^{54}$ include a benzene ring and a cyclohexane ring.

$R^{51}$ to $R^{54}$ each specifically represents a hydrogen atom; a halogen atom; an alkyl group having from 1 to 6 carbon atoms such as methyl group or ethyl group; an aralkyl group such as benzyl group; an alkenyl group such as vinyl group; a cyano group; an amino group; an acyl group; an alkoxy group having from 1 to 6 carbon atoms such as methoxy group or ethoxy group; an alkoxycarbonyl group having from 1 to 6 carbon atoms such as methoxycarbonyl group or ethoxycarbonyl group; an aryloxy group such as phenoxy group or benzyloxy group; a dialkylamino group such as diethylamino group or diisopropylamino group; a diaralkylamino group such as dibenzylamino group or diphenethylamino group; an α-haloalkyl group such as trifluoromethyl group; a hydroxyl group; an aromatic hydrocarbon ring group such as phenyl group or naphthyl group, which may have a substituent; or an aromatic heterocyclic group such as thienyl group or pyridyl group, which may have a substituent. Examples of the substituent include a halogen atom such as fluorine atom; an alkyl group having from 1 to 6 carbon atoms such as methyl group and ethyl group; an alkenyl group such as vinyl group; an alkoxycarbonyl group having from 1 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; a dialkylamino group such as dimethylamino group and diethylamino group; an acyl group such as acetyl group; a haloalkyl group such as trifluoromethyl group; and a cyano group. Among these substituents, the alkyl, alkoxy or alkoxycarbonyl group having from 1 to 6 carbon atoms may be liner and branched. The same applies to the substituents exemplified below.

Specific preferred examples of the group represented by formula (III) are set forth below, however, the present invention is not limited thereto.

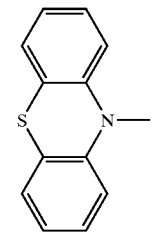

(S-1)

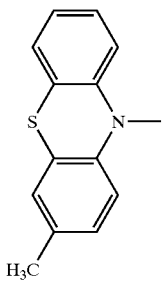

(S-2)

(S-3)

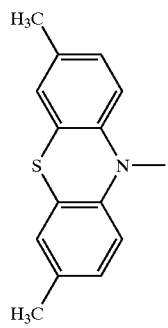

(S-4)

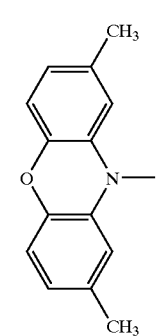

(S-5)

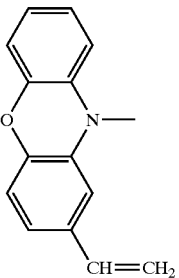

(S-6)

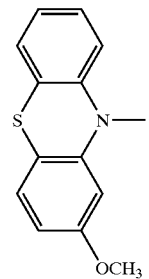

(S-7)

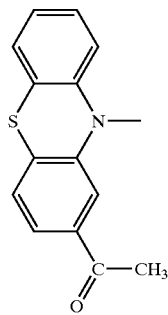

(S-8)

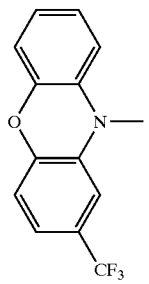 (S-9)

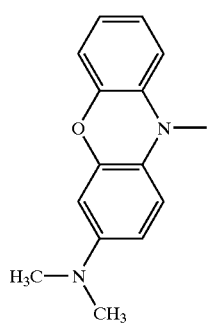 (S-10)

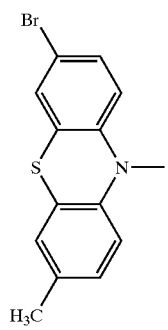 (S-11)

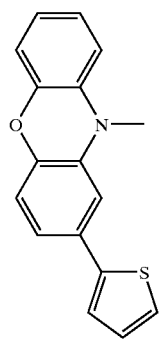 (S-12)

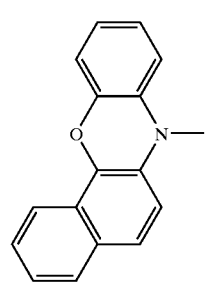 (S-13)

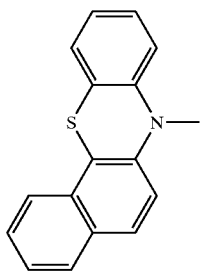 (S-14)

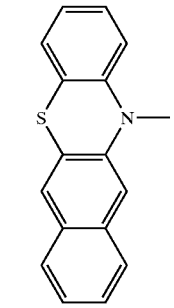 (S-15)

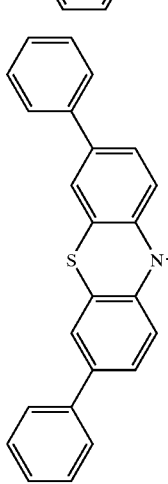 (S-16)

The compound having a group represented by formula (III) may be a low molecular compound or a polymer compound. In the case of a polymer compound, the group may be contained in the main chain or may be contained as a side chain.

This compound is preferably a low molecular compound having a molecular weight of approximately from 400 to 1,200. In the compound having a group represented by formula (III), the total number of rings as the entire compound is preferably from 6 to 20, more preferably from 7 to 18. The compound having a group represented by formula (III) is preferably a compound having from 2 to 3 units represented by formula (III) within the molecule.

In particular, the group represented by formula (III) is preferably (S-1) or (S-2).

The compound having a group represented by formula (III) is preferably a compound represented by the following formula (III-1) or (III-2):

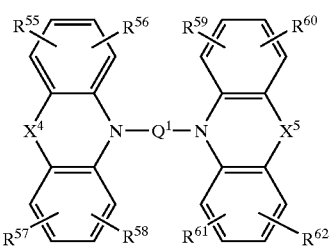

(III-1)

(wherein $R^{55}$ to $R^{62}$ each independently represents a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylamino group, an α-haloalkyl group, a hydroxyl group, or an aromatic hydrocarbon ring group or aromatic heterocyclic group which may have a substituent, each of the pairs $R^{55}$ and $R^{56}$, $R^{57}$ and $R^{58}$ $R^{59}$ and $R^{60}$, and $R^{61}$ and $R^{62}$ may combine with each other to form a ring, $X^4$ and $X^5$ each independently represents an oxygen group or a sulfur group, and $Q^1$ represents a divalent linking group comprising an aromatic hydrocarbon ring group or aromatic heterocyclic group which may have a substituent);

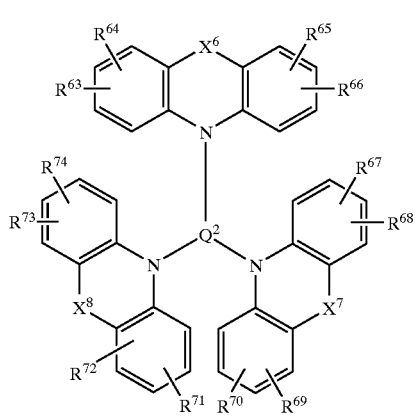

(III-2)

wherein $R^{63}$ to $R^{74}$ each independently represents a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylamino group, an α-haloalkyl group, a hydroxyl group, or an aromatic hydrocarbon ring group or aromatic heterocyclic group which may have a substituent, each of the adjacent substituents $R^{63}$ and $R^{64}$, $R^{65}$ and $R^{66}$, $R^{67}$ and $R^{68}$, $R^{69}$ and $R^{70}$, $R^{71}$ and $R^{72}$, and $R^{73}$ and $R^{74}$ may combine to form a ring, $X^6$ to $X^8$ each independently represents an oxygen atom or a sulfur atom, and $Q^2$ represents a trivalent linking group comprising an aromatic hydrocarbon ring group or aromatic heterocyclic group which may have a substituent).

In formula (III-1), $R^{55}$ to $R^{62}$ each independently represents a hydrogen atom; a halogen atom; an alkyl group having from 1 to 6 carbon atoms such as methyl group or ethyl group; an aralkyl group such as benzyl group; an alkenyl group such as vinyl group; a cyano group; an amino group; an acyl group; an alkoxy group having from 1 to 6 carbon atoms such as methoxy group or ethoxy group; an alkoxycarbonyl group having from 1 to 6 carbon atoms such as methoxycarbonyl group or ethoxycarbonyl group; an aryloxy group such as phenoxy group or benzyloxy group; a dialkylamino group such as diethylamino group or diisopropylamino group; a diaralkylamino group such as dibenzylamino group or diphenethylamino group; an α-haloalkyl group such as trifluoromethyl group; a hydroxyl group; an aromatic hydrocarbon ring group such as phenyl group or naphthyl group, which may have a substituent; or an aromatic heterocyclic group such as thienyl group or pyridyl group, which may have a substituent. Examples of the substituent include a halogen atom such as fluorine atom; an alkyl group having from 1 to 6 carbon atoms such as methyl group and ethyl group; an alkenyl group such as vinyl group; an alkoxycarbonyl group having from 1 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; a dialkylamino group such as dimethylamino group and diethylamino group; an acyl group such as acetyl group; a haloalkyl group such as trifluoromethyl group; and a cyano group. Each of the pairs $R^{55}$ and $R^{56}$, $R^{57}$ and $R^{58}$, $R^{59}$ and $R^{60}$ and $R^{61}$ and $R^{62}$ may combine with each other to form a benzene ring or a cyclohexane group. $X^4$ and $X^5$ each independently represents an oxygen group or a sulfur group. $Q^1$ represents a divalent linking group comprising an aromatic hydrocarbon ring group or aromatic heterocyclic group which may have a substituent. Preferred examples of the linking group $Q^1$ are set forth below.

(A-1)

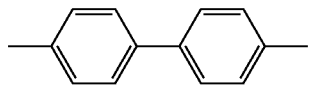

(A-2)

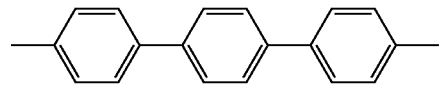

(A-3)

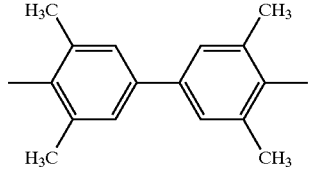

(A-4)

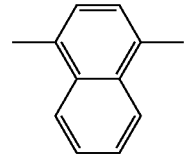

(A-5)

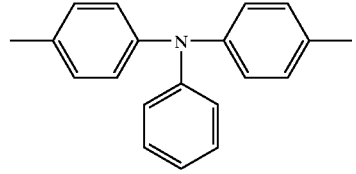

(A-6)

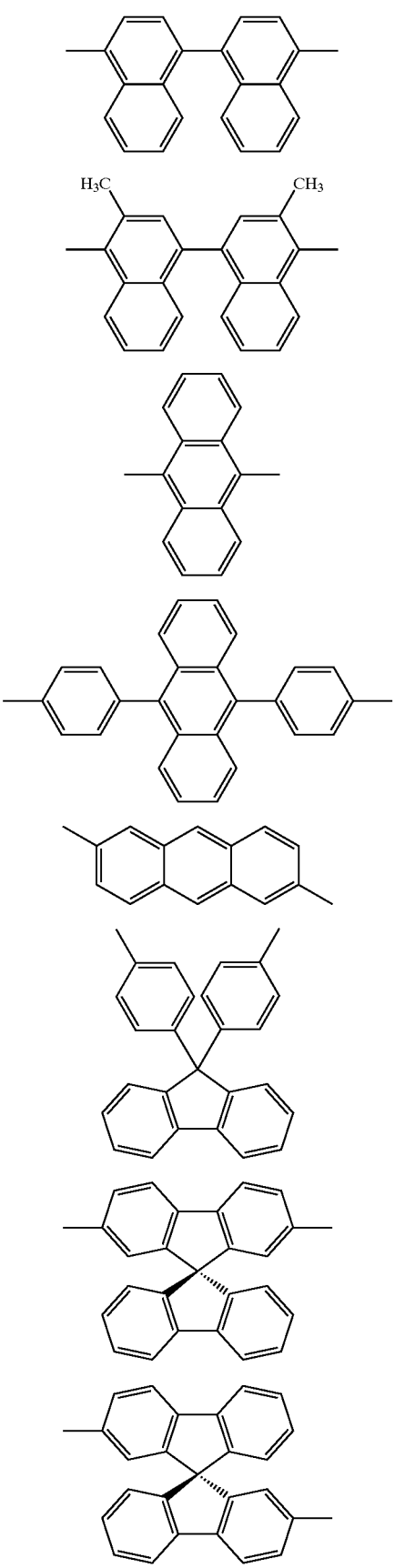

(A-7)
(A-8)
(A-9)
(A-10)
(A-11)
(A-12)
(A-13)
(A-14)

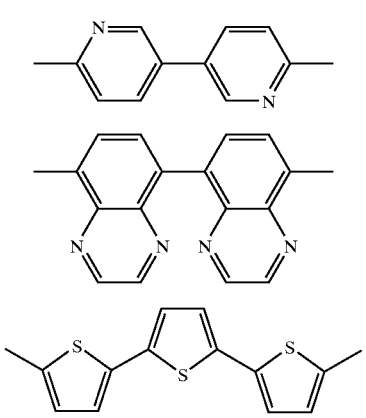

(A-15)
(A-16)
(A-17)

Among these, the linking group $Q^1$ is preferably (A-2), (A-6), (A-8), A-10) or (A-12). The compound is most preferably a compound having this linking group $Q^1$ and having the ring structure (S-1) or (S-2).

Specific preferred examples of the compound represented by formula (III-1) are shown in Table 1, however, the present invention is not limited thereto.

TABLE 1

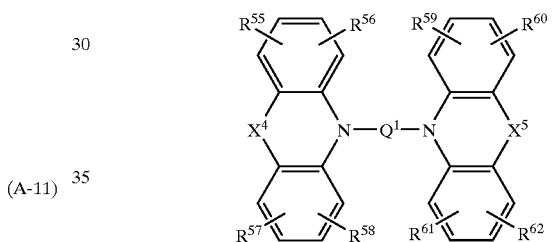

| Compound Number | $R^{55}$–$R^{58}$, Substituted Moiety | $R^{59}$–$R^{62}$, Substituted Moiety | Linking group $Q^1$ |
|---|---|---|---|
| (H-101) | (S-1) | (S-1) | (A-1) |
| (H-102) | (S-2) | (S-2) | (A-1) |
| (H-103) | (S-1) | (S-1) | (A-2) |
| (H-104) | (S-2) | (S-2) | (A-2) |
| (H-105) | (S-3) | (S-3) | (A-2) |
| (H-106) | (S-1) | (S-2) | (A-2) |
| (H-107) | (S-4) | (S-4) | (A-2) |
| (H-108) | (S-5) | (S-5) | (A-2) |
| (H-109) | (S-6) | (S-6) | (A-2) |
| (H-110) | (S-7) | (S-7) | (A-2) |
| (H-111) | (S-8) | (S-8) | (A-2) |
| (H-112) | (S-2) | (S-9) | (A-2) |
| (H-113) | (S-10) | (S-10) | (A-2) |
| (H-114) | (S-11) | (S-11) | (A-2) |
| (H-115) | (S-12) | (S-12) | (A-2) |
| (H-116) | (S-13) | (S-13) | (A-2) |
| (H-117) | (S-13) | (S-2) | (A-2) |
| (H-118) | (S-14) | (S-14) | (A-2) |
| (H-119) | (S-13) | (S-14) | (A-2) |
| (H-120) | (S-15) | (S-15) | (A-2) |
| (H-121) | (S-2) | (S-16) | (A-2) |
| (H-122) | (S-16) | (S-16) | (A-2) |
| (H-123) | (S-1) | (S-1) | (A-3) |
| (H-124) | (S-2) | (S-2) | (A-3) |
| (H-125) | (S-1) | (S-1) | (A-4) |
| (H-126) | (S-2) | (S-2) | (A-4) |
| (H-127) | (S-2) | (S-2) | (A-5) |
| (H-128) | (S-1) | (S-1) | (A-6) |
| (H-129) | (S-2) | (S-2) | (A-6) |
| (H-130) | (S-3) | (S-3) | (A-6) |
| (H-131) | (S-1) | (S-1) | (A-7) |
| (H-132) | (S-2) | (S-2) | (A-7) |

TABLE 1-continued

| Compound Number | R⁵⁵–R⁵⁸, Substituted Moiety | R⁵⁹–R⁶², Substituted Moiety | Linking group Q¹ |
|---|---|---|---|
| (H-133) | (S-1) | (S-1) | (A-8) |
| (H-134) | (S-2) | (S-2) | (A-8) |
| (H-135) | (S-3) | (S-3) | (A-8) |
| (H-136) | (S-1) | (S-1) | (A-9) |
| (H-137) | (S-2) | (S-2) | (A-9) |
| (H-138) | (S-1) | (S-1) | (A-10) |
| (H-139) | (S-2) | (S-2) | (A-10) |
| (H-140) | (S-1) | (S-2) | (A-10) |
| (H-141) | (S-3) | (S-3) | (A-10) |
| (H-142) | (S-4) | (S-4) | (A-10) |
| (H-143) | (S-7) | (S-7) | (A-10) |
| (H-144) | (S-10) | (S-10) | (A-10) |
| (H-145) | (S-13) | (S-13) | (A-10) |
| (H-146) | (S-14) | (S-14) | (A-10) |
| (H-147) | (S-1) | (S-2) | (A-11) |
| (H-148) | (S-2) | (S-2) | (A-11) |
| (H-149) | (S-1) | (S-1) | (A-12) |
| (H-150) | (S-2) | (S-2) | (A-12) |
| (H-151) | (S-2) | (S-2) | (A-13) |
| (H-152) | (S-2) | (S-2) | (A-14) |
| (H-153) | (S-2) | (S-2) | (A-15) |
| (H-154) | (S-1) | (S-1) | (A-16) |
| (H-155) | (S-2) | (S-2) | (A-17) |

In formula (III-2), $R^{63}$ to $R^{74}$ each independently represents a hydrogen atom; a halogen atom; an alkyl group having from 1 to 6 carbon atoms such as methyl group or ethyl group; an aralkyl group such as benzyl group; an alkenyl group such as vinyl group; a cyano group; an amino group; an acyl group; an alkoxy group having from 1 to 6 carbon atoms such as methoxy group or ethoxy group; an alkoxycarbonyl group having from 1 to 6 carbon atoms such as methoxycarbonyl group or ethoxycarbonyl group; an aryloxy group such as phenoxy group or benzyloxy group; a dialkylamino group such as diethylamino group or diisopropylamino group; a diaralkylamino group such as dibenzylamino group or diphenethylamino group; an α-haloalkyl group such as trifluoromethyl group; a hydroxyl group; an aromatic hydrocarbon ring group such as phenyl group or naphthyl group, which may have a substituent; or an aromatic heterocyclic group such as thienyl group or pyridyl group, which may have a substituent. Examples of the substituent include a halogen atom such as fluorine atom; an alkyl group having from 1 to 6 carbon atoms such as methyl group and ethyl group; an alkenyl group such as vinyl group; an alkoxycarbonyl group having from 1 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; a dialkylamino group such as dimethylamino group and diethylene group; an acyl group such as acetyl group; a haloalkyl group such as trifluoromethyl group; and a cyano group. Each of the pairs $R^{63}$ and $R^{64}$, $R^{65}$ and $R^{66}$, $R^{67}$ and $R^{68}$, $R^{69}$ and $R^{70}$, $R^{71}$ and $R^{72}$, and $R^{73}$ and $R^{74}$ may combine with each other ti form a benzene ring or a cyclohexane group. $X^6$ to $X^8$ each independently represents an oxygen group or a sulfur group, and $Q^2$ represents a trivalent linking group comprising an aromatic hydrocarbon ring group or aromatic heterocyclo group which may have a substituent. Preferred examples of the linking group $Q^2$ are set forth below.

(B-1)

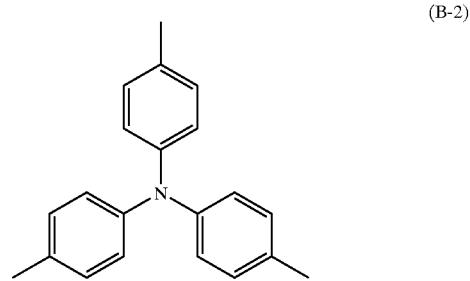

(B-2)

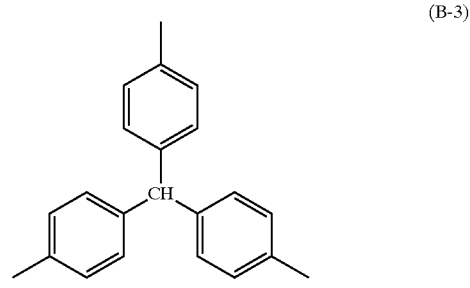

(B-3)

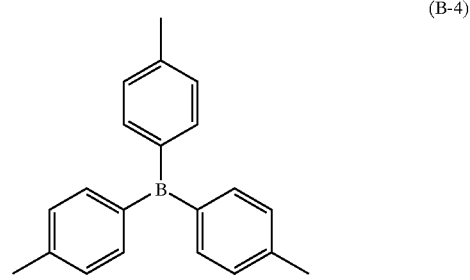

(B-4)

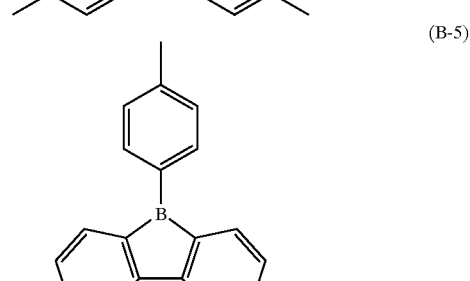

(B-5)

(B-6)

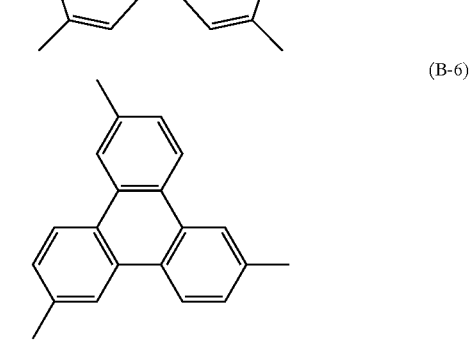

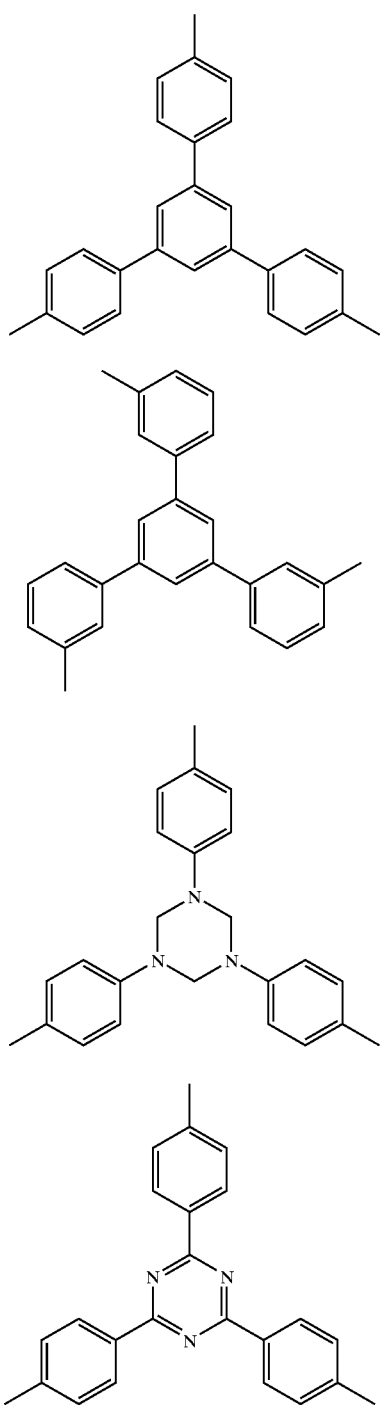

TABLE 2

| Compound No. | $R^{63}-R^{66}$, Substituted Moiety | $R^{67}-R^{70}$, Substituted Moiety | $R^{71}-R^{74}$, Substituted Moiety | Linking Group $Q^2$ |
|---|---|---|---|---|
| (H-201) | (S-1) | (S-1) | (S-1) | (B-1) |
| (H-202) | (S-2) | (S-2) | (S-2) | (B-1) |
| (H-203) | (S-1) | (S-1) | (S-1) | (B-2) |
| (H-204) | (S-2) | (S-2) | (S-2) | (B-2) |
| (H-205) | (S-3) | (S-3) | (S-3) | (B-2) |
| (H-206) | (S-1) | (S-1) | (S-2) | (B-2) |
| (H-207) | (S-4) | (S-4) | (S-4) | (B-2) |
| (H-208) | (S-13) | (S-13) | (S-13) | (B-2) |
| (H-209) | (S-14) | (S-14) | (S-14) | (B-2) |
| (H-210) | (S-15) | (S-15) | (S-15) | (B-2) |
| (H-211) | (S-16) | (S-16) | (S-16) | (B-2) |
| (H-212) | (S-1) | (S-1) | (S-1) | (B-3) |
| (H-213) | (S-2) | (S-2) | (S-2) | (B-3) |
| (H-214) | (S-1) | (S-1) | (S-1) | (B-4) |
| (H-215) | (S-13) | (S-13) | (S-13) | (B-4) |
| (H-216) | (S-1) | (S-1) | (S-1) | (B-5) |
| (H-217) | (S-2) | (S-2) | (S-2) | (B-5) |
| (H-218) | (S-2) | (S-2) | (S-2) | (B-6) |
| (H-219) | (S-4) | (S-4) | (S-4) | (B-6) |
| (H-220) | (S-1) | (S-1) | (S-1) | (B-7) |
| (H-221) | (S-2) | (S-2) | (S-2) | (B-7) |
| (H-222) | (S-3) | (S-3) | (S-3) | (B-7) |
| (H-223) | (S-7) | (S-7) | (S-7) | (B-7) |
| (H-224) | (S-1) | (S-2) | (S-2) | (B-7) |
| (H-225) | (S-10) | (S-10) | (S-10) | (B-7) |
| (H-226) | (S-13) | (S-13) | (S-13) | (B-7) |
| (H-227) | (S-14) | (S-14) | (S-14) | (B-7) |
| (H-228) | (S-15) | (S-15) | (S-15) | (B-7) |
| (H-229) | (S-16) | (S-16) | (S-16) | (B-7) |
| (H-230) | (S-1) | (S-1) | (S-1) | (B-8) |
| (H-231) | (S-2) | (S-2) | (S-2) | (B-8) |
| (H-232) | (S-1) | (S-1) | (S-1) | (B-9) |
| (H-233) | (S-2) | (S-2) | (S-2) | (B-9) |
| (H-234) | (S-1) | (S-1) | (S-1) | (B-10) |
| (H-235) | (S-2) | (S-2) | (S-2) | (B-10) |
| (H-236) | (S-13) | (S-13) | (S-13) | (B-10) |
| (H-237) | (S-14) | (S-14) | (S-14) | (B-10) |

Among these, the linking group $Q^2$ is preferably (B-1), (B-2) or (B-7). The compound is most preferably a compound having this linking group and having the ring structure (S-1) or (s-2).

Specific preferred examples of the compound represented by formula (III-2) are shown in Table 2, however, the present invention is not limited thereto.

In the light-emitting layer, only one compound having a group represented by formula (III) may be contained or two or more thereof may be contained.

In addition to formulae (I) to (III), the host material which can be used includes the following compounds.

TPBI

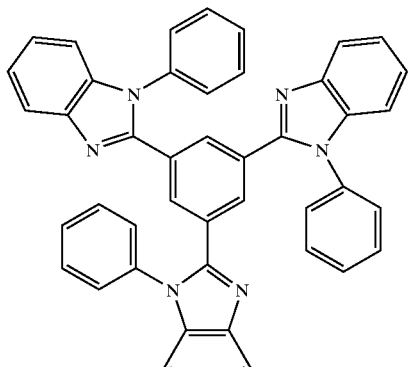

PVK

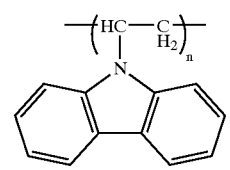

BCP

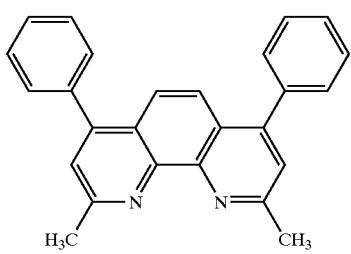

OXD-7

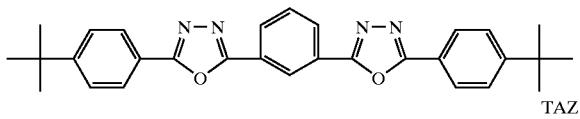

TAZ

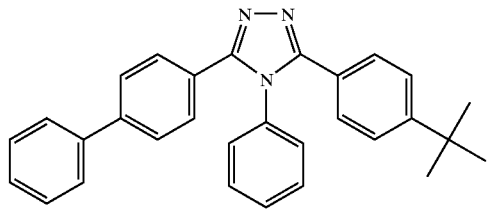

For the host material, a plurality of compounds which can be represented by the same formula may be used in combination as described above, or compounds which cannot be represented by the same formula may also be used in combination.

In the organic electroluminescent device of the present invention, the host material of the light-emitting layer is most preferably the compound represented by formula (I).

The constituent element (2) of the present invention, namely, Compound A capable of phosphorescence emission at room temperature is described below.

Compound A preferably has an excited triplet level lying between the excited triplet level of the host material and the excited triplet level (when Compound B is a phosphorescent compound) or excited singlet level (when Compound B is a fluorescent compound) of Compound B which is described later.

In view of the structure, an organic metal complex containing a metal selected from Groups 7 to 11 of the periodic table is preferred.

From the standpoint that the charge transfer between the center metal and the ligand readily occurs, the metal is preferably a metal of the fifth or sixth period of the periodic table. Specific examples thereof include ruthenium, rhodium, palladium, silver, rhenium, osmium, iridium, platinum and gold.

Examples of the complex thereof include the compounds represented by the following formula (IV):

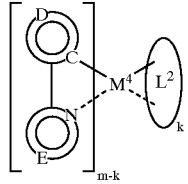

(IV)

(wherein the ring D represents an aromatic hydrocarbon ring which may have a substituent or an aromatic heterocyclic ring which may have a substituent, the ring E represents a nitrogen-containing aromatic heterocyclic ring which may have a substituent, a group on the ring D and a group on the ring E may combine to form a ring condensed to these rings, $M^4$ represents a metal selected from Groups 7 to 11 of the periodic table, $L^2$ represents an arbitrary bidentate ligand, m represents a valence number of $M^4$, and k represents an integer satisfying $0 \leq k < m$).

In the ligand

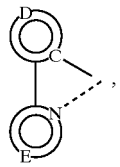

the ring D represents an aromatic hydrocarbon ring or aromatic heterocyclic ring which may have a substituent, preferably a phenyl group, a naphthyl group, an anthryl group, a thienyl group, a pyridyl group, a furyl group, a benzothienyl group, a benzofuryl group, a quinolyl group or an isoquinolyl group.

Examples of the substituent which these aromatic hydrocarbon ring groups and aromatic heterocyclic groups may have include a halogen atom such as fluorine atom; an alkyl group having from 1 to 6 carbon atoms such as methyl group and ethyl group; an alkenyl group having from 2 to 6 carbon atoms such as vinyl group; an alkoxycarbonyl group having from 2 to 6 carbon atoms such as methoxycarbonyl group and ethoxycarbonyl group; an alkoxy group having from 1 to 6 carbon atoms such as methoxy group and ethoxy group; an aromatic hydrocarbon ring group such as phenyl group and naphthyl group; an aryloxy group such as phenoxy group and benzyloxy group; a dialkylamino group such as dimethylamino group and diethylamino group; an acyl group such as acetyl group; a haloalkyl group such as trifluoromethyl group; and a cyano group.

The ring E represents a nitrogen-containing aromatic heterocyclic group, preferably a pyridyl group, a pyrimidyl group, a pyrazine group, a triazine group, a benzothiazole group, a benzoxazole group, a benzimidazole, a quinolyl group, an isoquinolyl group, a quinoxaline group or phenanthridine group, which may have a substituent.

Examples of the substituent which this aromatic heterocyclic group may have include a halogen atom such as fluorine atom; an alkyl group having from 1 to 6 carbon atoms such as methyl group and ethyl group; an alkenyl group having from 2 to 6 carbon atoms such as vinyl group; an alkoxycarbonyl group having from 2 to 6 carbon atoms such as methoxycarbonyl group and ethoxycarbonyl group; an alkoxy group having from 1 to 6 carbon atoms such as methoxy group and ethoxy group; an aromatic hydrocarbon ring group such as phenyl group and naphthyl group; an aryloxy group such as phenoxy group and benzyloxy group; a dialkylamino group such as dimethylamino group and diethylamino group; an acyl group such as acetyl group; a haloalkyl group such as trifluoromethyl group; and a cyano group.

The substituent of the ring D and the substituent of the ring E may combine to form one condensed ring as a whole. Examples of the condensed ring include 7,8-benzoquinoline.

More preferred examples of the substituent of the ring D and the ring E include an alkyl group, an alkoxy group, an aromatic hydrocarbon ring group and a cyano group.

Examples of the ligand include the following structures, however, the present invention is not limited thereto. In the following examples, the substituents in the ring D and the ring E are omitted but, as described above, these rings may have a substituent.

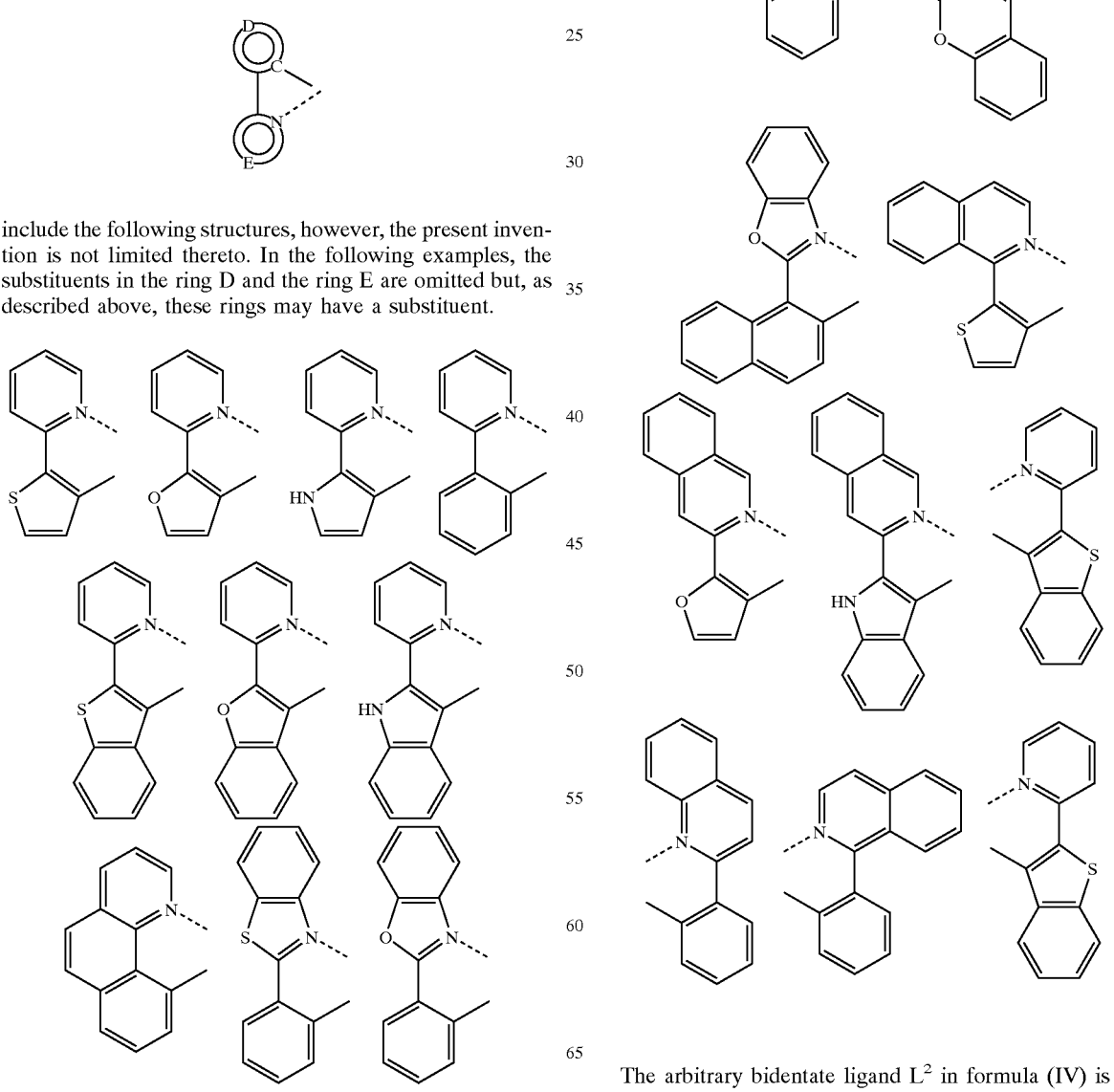

The arbitrary bidentate ligand $L^2$ in formula (IV) is not particularly limited insofar as it is a monovalent bidentate ligand, however, when the steric hindrance is considered, the ligand is preferably not so bulky and examples thereof include the following ligands.

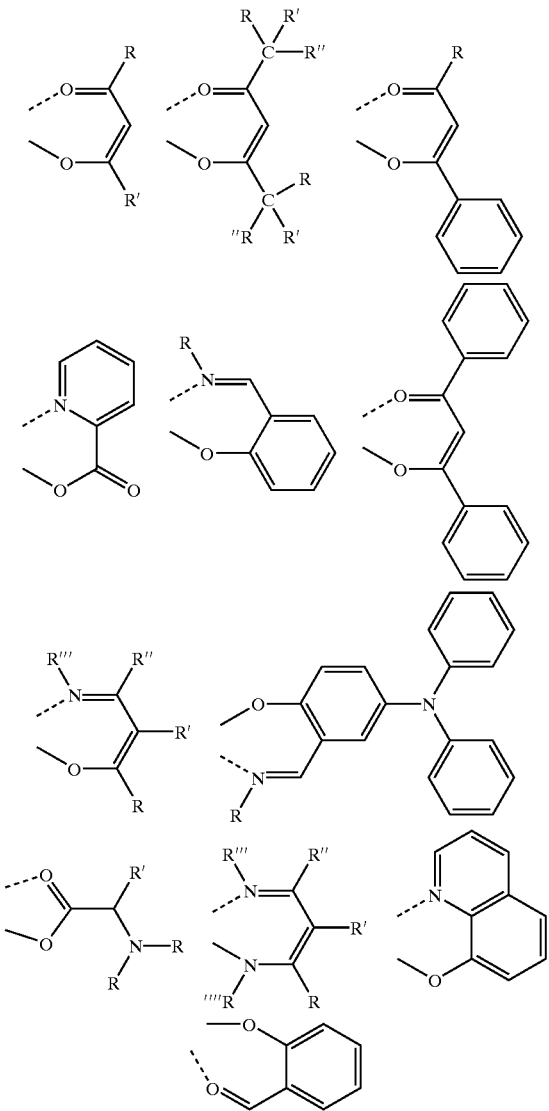

(wherein R, R', R" and R"' each independently represents an alkyl group having from 1 to 4 carbon atoms or a haloalkyl group having from 1 to 4 carbon atoms, and the substituents in the aromatic hydrocarbon ring and the aromatic heterocyclic ring are omitted.)

Among the ligands $L^2$, the following ligands are particularly preferred.

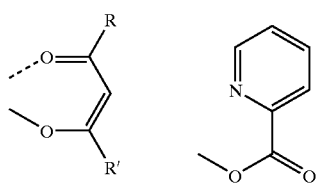

As long as the valence number of the center metal $M^4$ in formula (IV) is satisfied, any combination of the ligand containing the ring D and the ring E with the arbitrary ligand $L^2$ may be used and how many ligands may be coordinated, however, the compound represented by the following formula (IV-1) or (IV-2) is preferred:

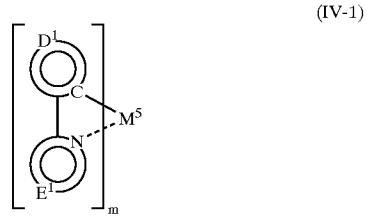

(IV-1)

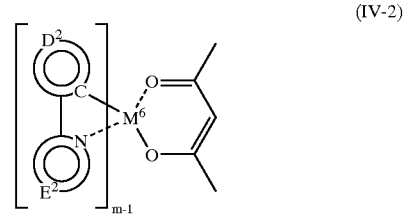

(IV-2)

(wherein the rings $D^1$ and $D^2$ have the same meanings as the ring D in formula (IV), the rings $E^1$ and $E^2$ have the same meanings as the ring E in formula (IV), $M^5$ and $M^6$ have the same meanings as $M^4$ in formula (IV) and m has the same meaning as in formula (IV)).

Specific examples of the phosphorescent Compound A represented by formula (IV) are set forth below, however, the present invention is not limited thereto.

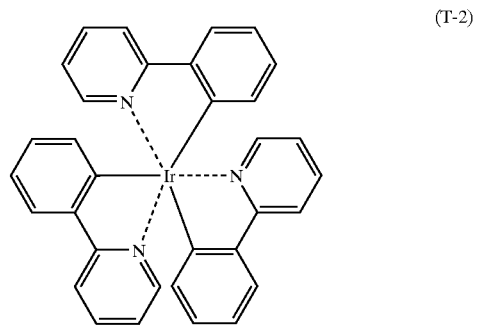

(T-2)

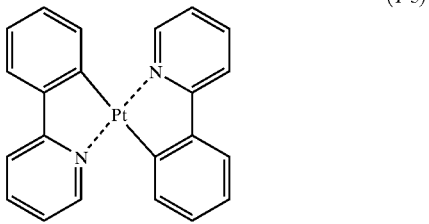

(T-3)

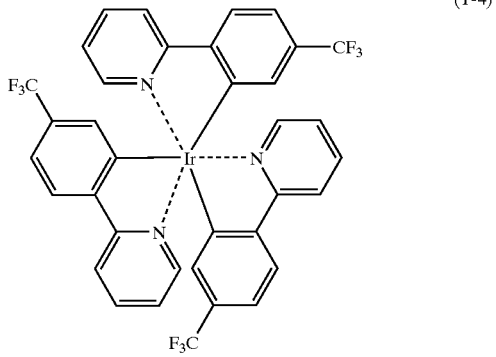

(T-4)

(T-5)
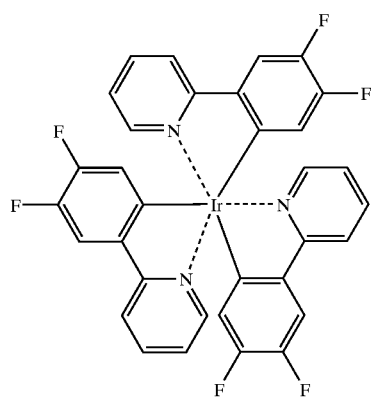
(T-24)
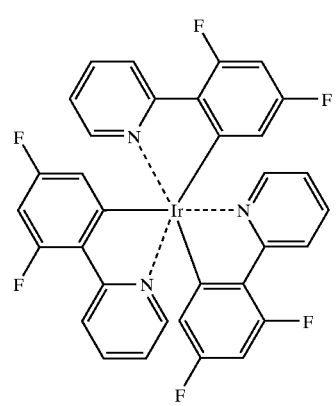
(T-6)
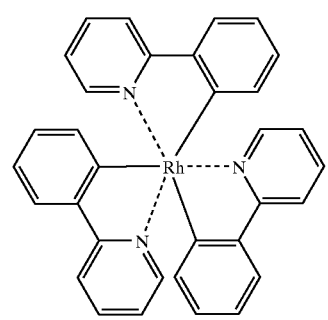
(T-16)
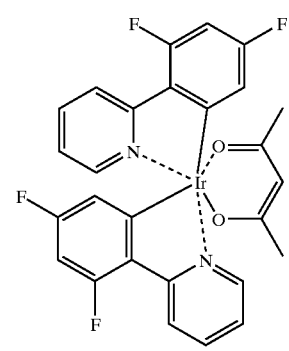
(T-7)
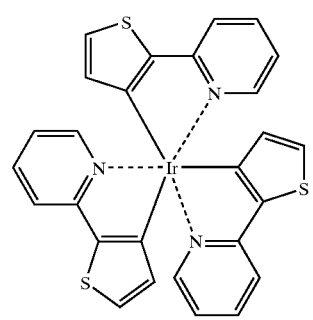
(T-17)
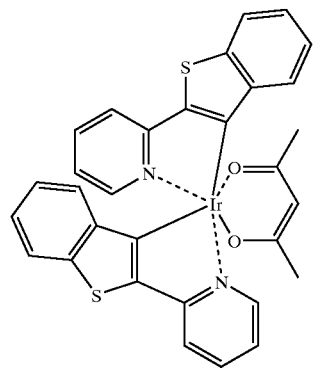
(T-8)
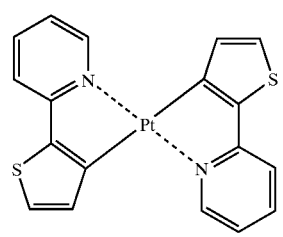
(T-9)
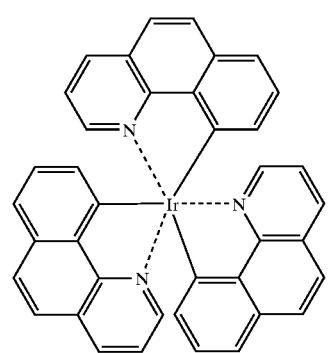
(T-18)
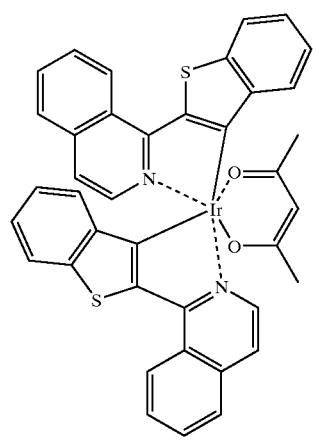

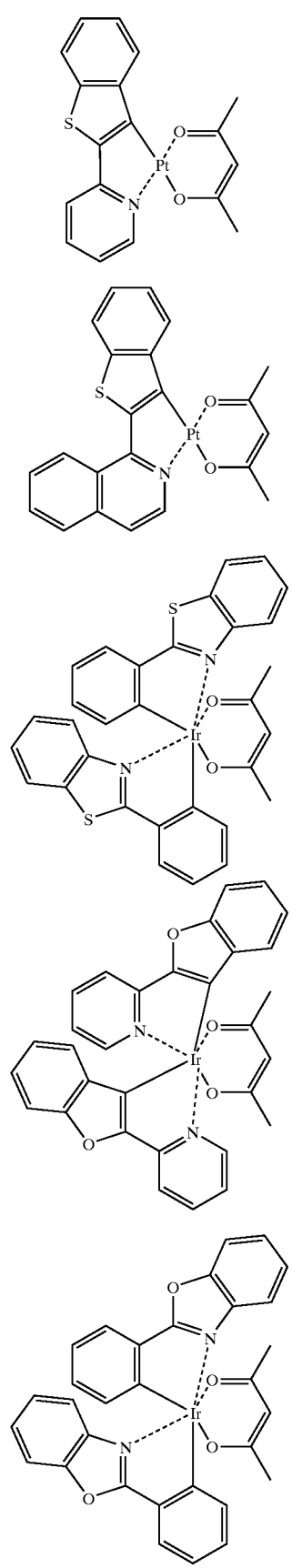
(T-19)
(T-20)
(T-21)
(T-22)
(T-23)
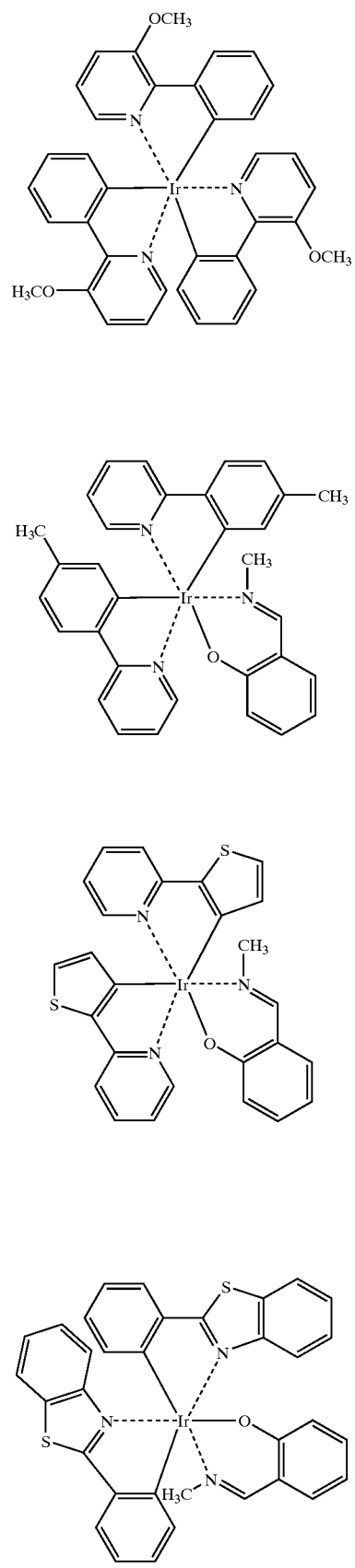

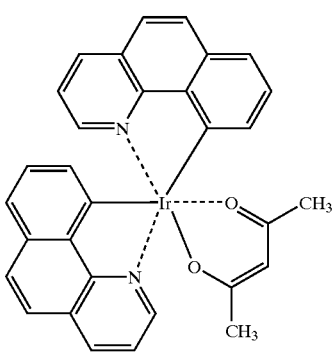
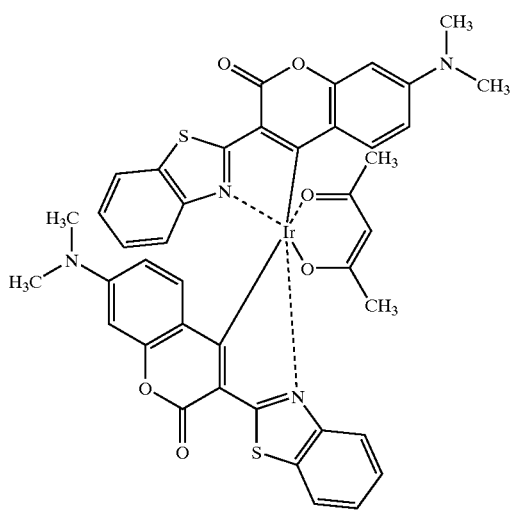
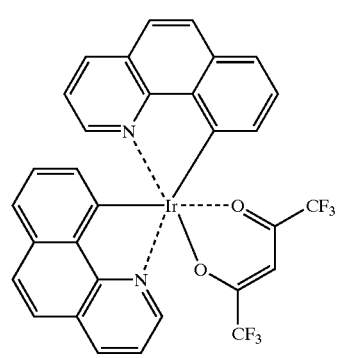
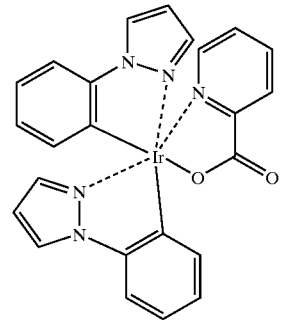
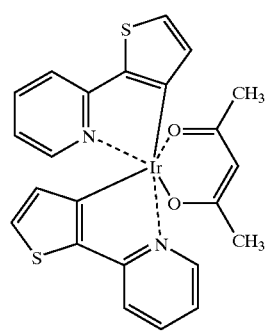
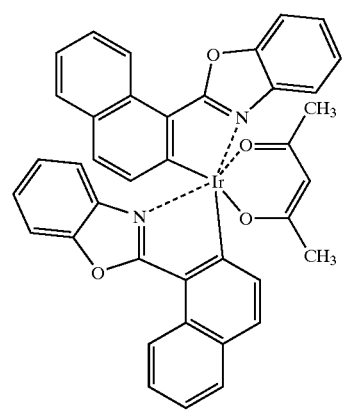
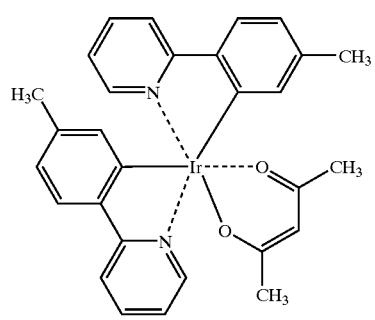
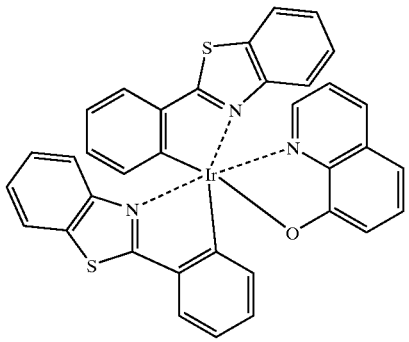

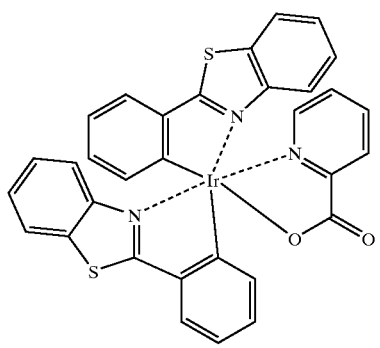
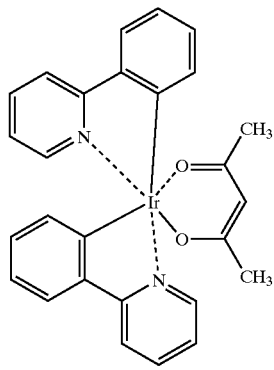
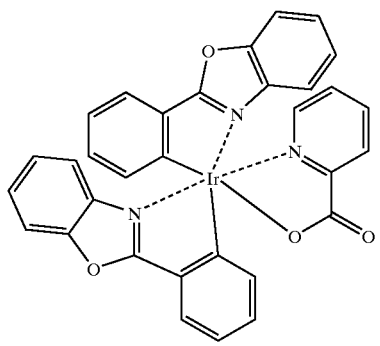
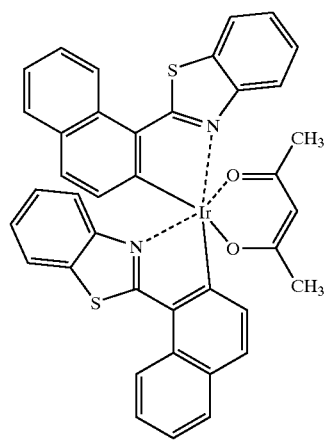
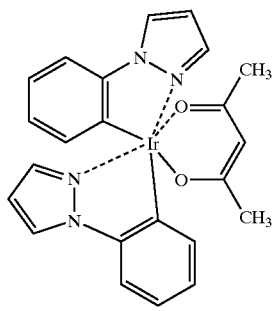
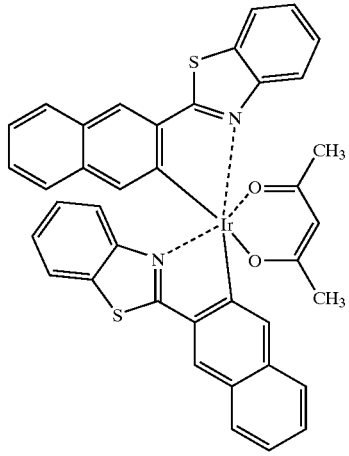
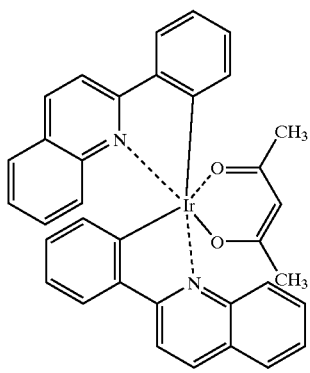
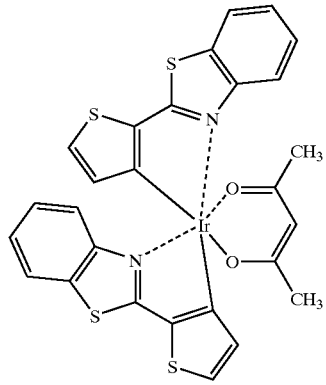

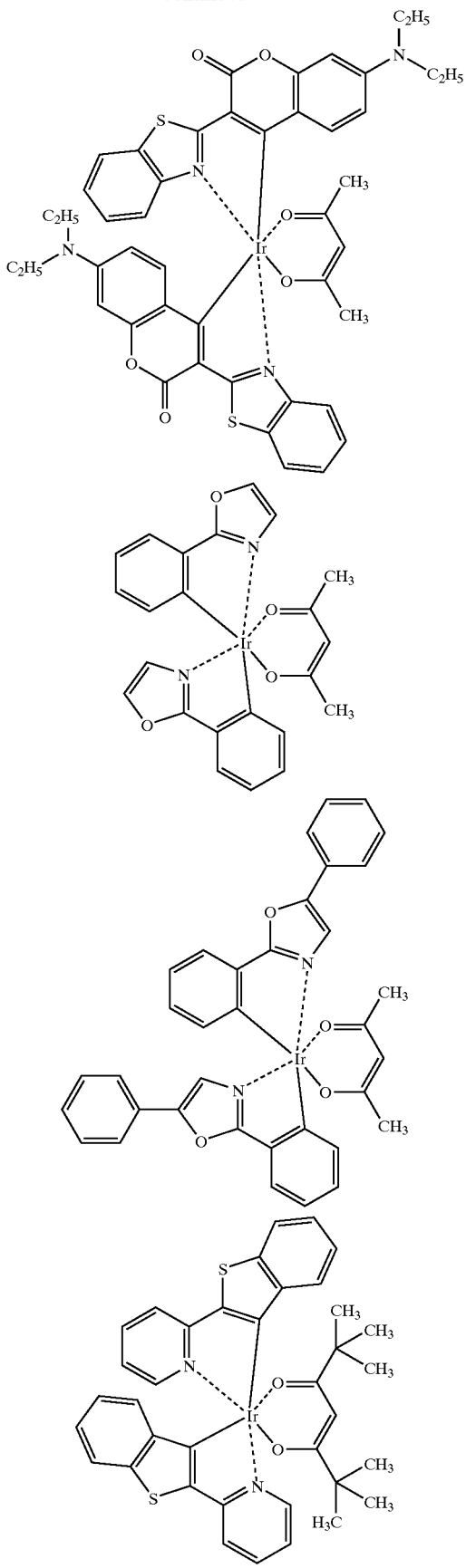
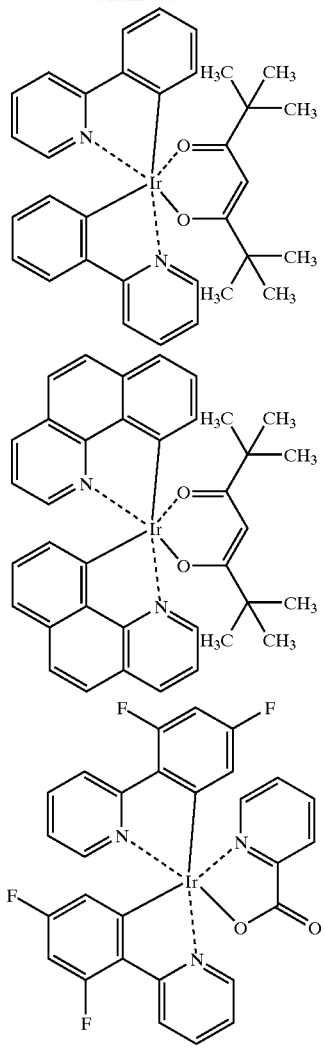

For Compound B, an organic metal complex represented by the following formula (V) can be used in addition to the organic metal complex represented by formula (IV).

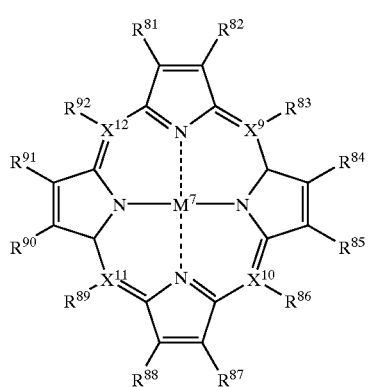

(V)

(wherein $R^{81}$ to $R^{92}$ each independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group or an aromatic hydrocarbon ring group or aromatic heterocyclic group which may have a substituent, each of the pairs $R^{81}$ and $R^{82}$, $R^{84}$ and $R^{85}$, $R^{87}$ and $R^{88}$, and $R^{90}$ and $R^{91}$ may combine with each other to form a ring, $M^7$ represents a metal selected from Groups 7 to 11 of the periodic table, $X^9$ to $X^{12}$ each represents carbon or nitrogen, provided that when any one of $X^9$ to $X^{12}$ is a nitrogen atom, $R^{83}$, $R^{86}$, $R^{89}$ or $R^{92}$ bonded to nitrogen atom is absent).

Similarly to $M^5$ and $M^6$ in formulae (IV-1) and (IV-2), $M^7$ in formula (V) is preferably a metal of the fifth or sixth period of the periodic table. Specific examples thereof include ruthenium, rhodium, palladium, silver, rhenium, osmium, iridium, platinum and gold. Among these, preferred are divalent metals such as platinum and palladium.

Specific examples of the organic metal complex represented by formula (V) are set forth below, however, the present invention is not limited thereto.

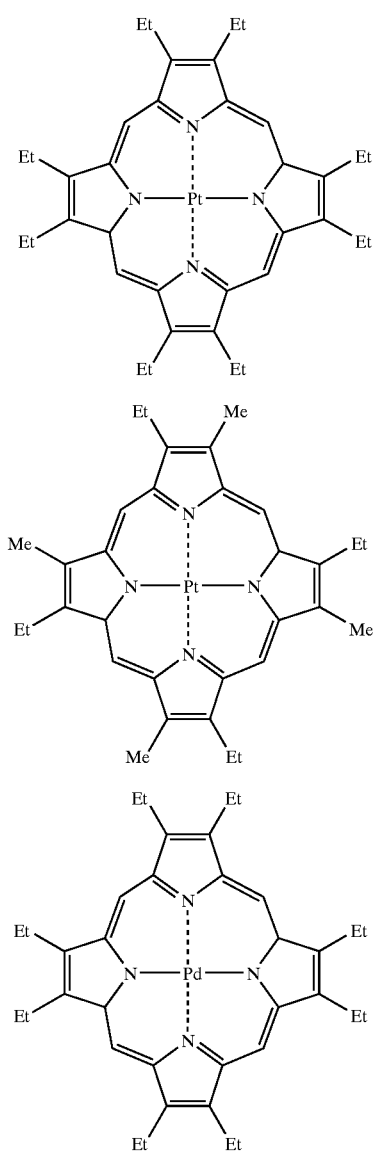

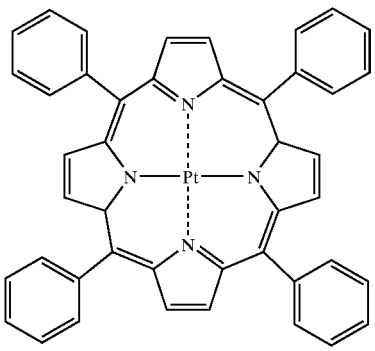

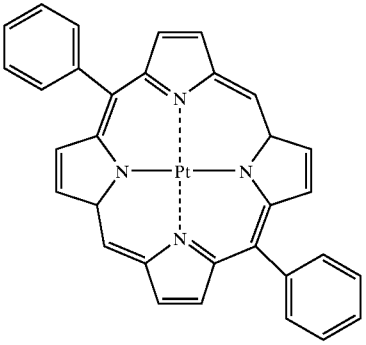

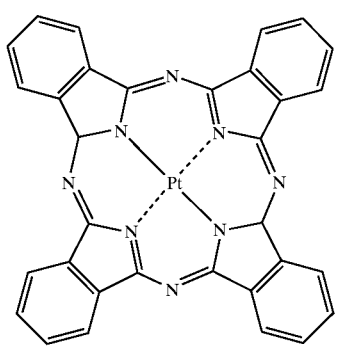

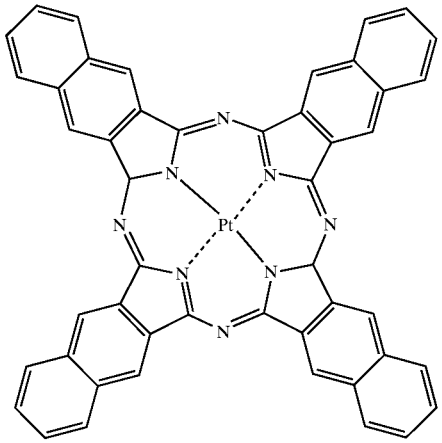

The constituent element (3) of the present invention, that is, Compound B capable of phosphorescence emission or fluorescence emission at room temperature is described below.

The case where Compound B is a phosphorescent compound is described below.

The organic electroluminescent device of the present invention is characterized in that Compound A fills the role of sensitizer in the light-emitting layer and therefore, the light emission attributable to Compound B is intensified. Accordingly, it is important that the phosphorescent Compound B has an excited triplet level in the energy state lower than the excited triplet level of the phosphorescent Compound A.

Examples of the phosphorescent Compound B include the same compounds as described above for Compound A. Among those, a compound having an energy level satisfying the above-described relationship with Compound A is preferably selected.

In view of the energy transfer, at least one complex containing iridium is preferably contained as Compound A or B. In particular, it is preferred to contain at least one iridium complex as Compound A and also at least one iridium complex as Compound B or to contain at least one iridium complex as either one of Compound A and Compound B and contain at least one platinum complex as the other compound.

As described above, in order to realize the smooth energy transfer from Compound A to Compound B, it is important that the maximum light emission wavelength of Compound B is longer than the maximum light emission wavelength of Compound A. The term "the maximum light emission wavelength of Compound A" means the maximum light emission wavelength at a phosphorescence emission spectrum of Compound A. The term "the maximum light emission wavelength of Compound B" means the maximum light emission wavelength at a phosphorescence emission spectrum when Compound B is a phosphorescent compound, and the maximum light emission wavelength at a fluorescence emission spectrum when Compound B is a fluorescent compound.

The conditions for measuring the maximum emission wavelength of Compound A or Compound B are not particularly limited, the maximum emission wavelength of Compound A and Compound B may be measured under the same conditions and the thus obtained value for Compound A may be compared with that for Compound B. For example, Compound A is compared with Compound B with respect to light emission spectra of solutions dissolving Compound A or B in the same solvent, single-layer films made from each compound alone, organic electroluminescent devices having the same structure except for doping each compound to the light-emitting layer, or the like.

The case where Compound B is a fluorescent compound is described below.

In the organic electroluminescent device of the present invention, for letting Compound A to fill the role of sensitizer in the light-emitting layer, it is important, as described above, that the fluorescent Compound B has an excited singlet level in the energy state lower than the excited triplet level of Compound A. Examples of the fluorescent Compound B include compounds which present blue light emission, such as perylene, pyrene, anthracene and derivatives thereof; compounds which present green light emission, such as quinacridone derivatives and coumarin derivatives; compounds which present yellow light emission, such as rubrene and perimidone derivatives; and compounds which present red light emission, such as coumarin derivatives, benzopyran derivatives, rhodamine derivatives, phenoxazone derivatives, benzothioxanthene derivatives and azabenzothioxanthene.

In addition to these fluorescent compounds, the fluorescent compounds described in *Laser Kenkyu* (*Laser Research*), Vol. 8, pages 694, 803 and 958 (1980); and *ibid.*, Vol. 9, page 85 (1981) can be used as the fluorescent Compound B according to host material and the phosphorescent Compound A.

Among these, the fluorescent compounds presenting green light emission, yellow light emission or red light emission are preferred.

The construction of the organic electroluminescent device of the present invention is described below by referring to the drawings, however, the present invention is not limited thereto.

Figure 2:
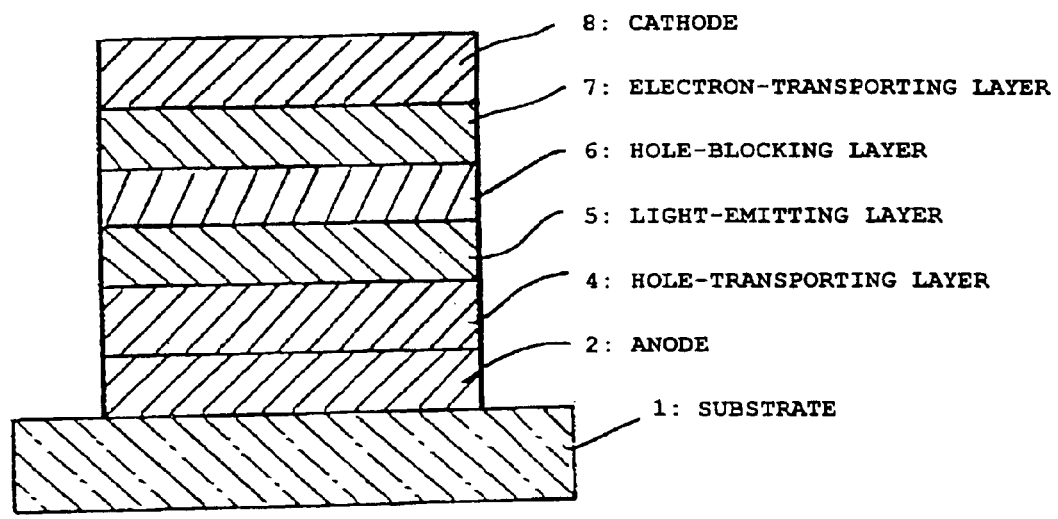
FIG. 2 is a schematic sectional view showing another example of the organic electroluminescent device according to the present invention.
Figure 3:
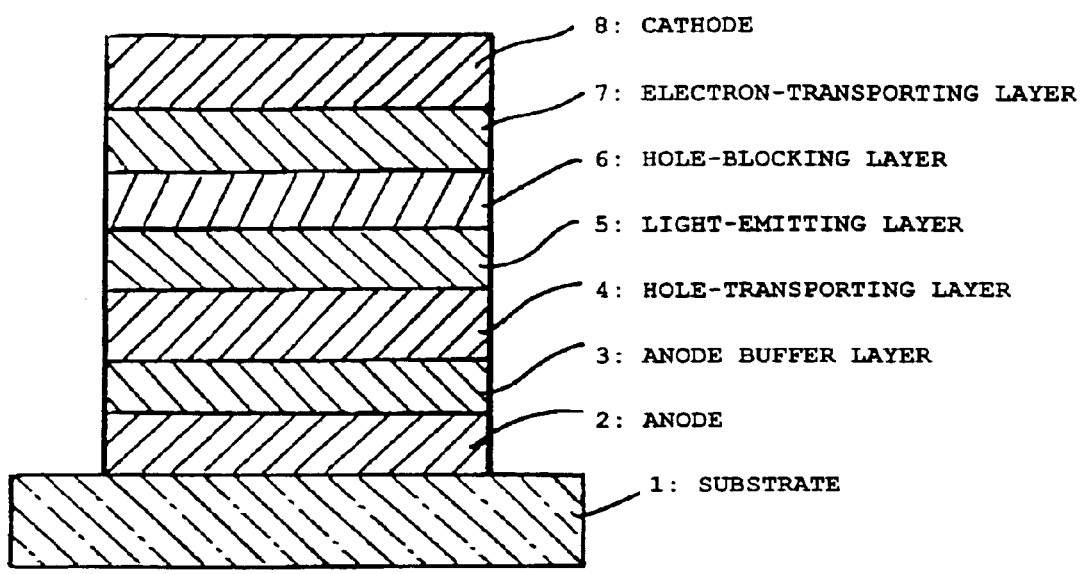
FIG. 3 is a schematic sectional view showing another example of the organic electroluminescent device according to the present invention.

FIGS. 1 to 3 each is a sectional view schematically showing an embodiment of the organic electroluminescent device of the present invention, where 1 denotes a substrate, 2 denotes an anode, 3 denotes an anode buffer layer, 4 denotes a hole-transporting layer, 5 denotes a light-emitting layer, 6 denotes a hole-blocking layer, 7 denotes an electron-transporting layer and 8 denotes a cathode. The construction is described mainly by referring to the device shown in FIG. 1.

The substrate 1 works out to a support of the organic electroluminescent device and for example, a plate of quartz or glass, a metal sheet or foil, or a plastic film or sheet is used therefor. Particularly, a glass plate or a transparent synthetic resin plate such as polyester, polymethacrylate, polycarbonate or polysulfone is preferred. In the case of using a synthetic resin substrate, it is necessary to take notice of the gas-barrier property. If the substrate has excessively low gas-barrier property, the organic electroluminescent device may disadvantageously deteriorate due to outside air passing through the substrate. Accordingly, a dense silicon oxide film or the like is provided at least on one surface of the synthetic resin substrate to ensure the gas-barrier property and this is one of the preferred methods.

On the substrate 1, an anode 2 is provided. The anode 2 fills the role of injecting holes into the hole-transporting layer 4. This anode 2 is generally composed of a metal such as aluminum, gold, silver, nickel, palladium or platinum, a metal oxide such as indium oxide and/or tin oxide, a metal halide such as copper iodide, a carbon black or an electrically conductive polymer such as poly(3-methyl thiophene), polypyrrole or polyaniline. The anode 2 is usually formed by sputtering or vacuum vapor deposition. In the case where a metal fine particle of silver, a fine particle of copper iodide, carbon black, an electrically conductive metal oxide fine particle or an electrically conductive polymer fine particle is used, the anode 2 can be formed by dispersing this in an appropriate binder resin solution and applying the dispersion solution on the substrate 1. Furthermore, in the case of using an electrically conductive polymer, the anode 2 can be provided by forming a thin film directly on the substrate 1 using electrolytic polymerization or by coating the electrically conductive polymer on the substrate 1 (see, *Appl. Phys. Lett.*, Vol. 60, page 2711 (1992)).

The anode 2 may also be a stacked layer structure formed by stacking layers comprising different materials.

The thickness of the anode 2 varies depending on the required transparency. In the case where the transparency is necessary, the transmittance of visible ray is usually set to 60% or more, preferably 80% or more, and in this case, the thickness is usually from 5 to 1,000 nm, preferably on the order of 10 to 500 nm. In the case where the transparency is not required, the anode 2 may have substantially the same thickness as the substrate 1. On this anode 2, a different electrically conductive material can also be further stacked.

On the anode 2, a hole-transporting layer 4 is provided. The material for the hole-transporting layer 4 is required to ensure high efficiency in the hole injection from the anode 2 and efficient transportation of the injected holes. To satisfy these requirements, the material is required to have a small ionization potential, a high transparency to visible ray, a high hole mobility, excellent stability and difficulty of generating impurities serving as a trap during the production or use. Since the hole-transporting layer 4 contacts with the light-emitting layer 5, the material is also required not to quench the light emission from the light-emitting layer 5 or not to form an exciplex between the hole-transporting layer 4 and the light-emitting layer 5 and thereby reduce the efficiency. In addition to these general requirements, when an application to a display for the mounting on vehicles is considered, since the device is further required to have heat resistance, the material preferably has a Tg of 75° C. or more, more preferably 85° C. or more.

Examples of the hole-transporting material include aromatic diamines containing two or more tertiary amines and having two or more condensed aromatic rings substituted to nitrogen atoms, represented by 4,4'-bis[N-(1-naphthyl)-N-phenylamino]biphenyl (see, JP-A-5-234681); aromatic amine compounds having a star burst structure, such as 4,4',4''-tris(1-naphthylphenylamino)triphenylamine (see, *J. Lumin.*, Vol. 72–74, page 985 (1997)); aromatic amine compounds comprising a tetramer of triphenylamine (see, *Chem. Commun.*, page 2175 (1996)); and spiro compounds such as 2,2', 7,7'-tetrakis(diphenylamino)-9,9'-spirobifluorene (see, *Synth. Metals*, Vol. 91, page 209 (1997)). These compounds may be used individually or, if desired, in combination.

In addition to the above-described compounds, examples of the material for the hole-transporting layer 4 include polymer materials such as polyvinylcarbazole, polyvinyltriphenylamine (see, JP-A-7-53953), polyarylene ether sulfone containing tetraphenylbenzidine (see, *Polym. Adv. Tech.*, Vol. 7, page 33 (1996)).

In the case of forming the hole-transporting layer 4 by the coating method, one or more hole-transporting material is, if desired, after adding additives which do not become a trap for the holes, such as binder resin and coatability improving agent, dissolved to prepare a coating solution and the coating solution is coated on the anode 2 by spin coating or the like and dried to form the hole-transporting layer 4. Examples of the binder resin include polycarbonate, polyarylate and polyester. If the amount of the binder resin added is large, the hole mobility is reduced. Therefore, the amount added thereof is preferably as low as possible and in terms of the content in the hole-transporting layer 4, preferably 50% by weight or less.

In the case of forming the hole-transporting layer 4 by the vacuum vapor deposition method, the hole-transport material is placed in a crucible disposed within a vacuum container, the inside of the vacuum chamber is evacuated to about $10^4$ Pa by an appropriate vacuum pump and then the crucible is heated to evaporate the hole-transport material, whereby the hole-transporting layer 4 is formed on the substrate 1 having formed thereon the anode 2 and being disposed to face the crucible.

The thickness of the hole-transporting layer 4 is usually from 5 to 300 nm, preferably from 10 to 100 nm. In order to uniformly form such a thin film, the vacuum vapor deposition method is generally used in many cases.

On the hole-transporting layer 4, the light-emitting layer 5 is provided. The light-emitting layer 5 comprises at least (1) a host material having electron-transporting property or hole-transporting property, (2) Compound A capable of phosphorescence emission at room temperature and (3) Compound B capable of phosphorescence emission or fluorescence emission at room temperature. Between the electrodes applied with an electric field, a hole injected from the anode 2 and transferring through the hole-transporting layer 4 and an electron injected from the cathode 8 and transferring through the hole-blocking layer 6 are recombined and thereby the light-emitting layer is excited and emits strong light. The maximum light emission wavelength in the light emission spectrum is attributable to the above-described Compound B.

The light-emitting layer 5 may contain components other than the above-described (1) to (3) within the range of not impairing the performance of the present invention.

The content of Compound A capable of phosphorescence emission is preferably from 0.1 to 30% by weight based on the entire light-emitting layer. If the content is less than 0.1% by weight, Compound A may fail in sufficiently contributing to the improvement of light emission efficiency of the device, whereas if it exceeds 30% by weight, concentration quenching may occur to cause reduction of the light emission efficiency.

In the case of using a compound capable of phosphorescence emission as Compound B, the content thereof is also preferably from 0.1 to 30% by weight based on the entire light-emitting layer but more preferably, the total amount of Compounds A and B is from 0.1 to 30% by weight based on the entire light-emitting layer. In view of the energy transfer, the ratio of Compound B to Compound A (compound B)/(compound A) is preferably from 0.3 to 3 (molar ratio).

In the case of using a compound capable of fluorescence emission as Compound B, the content thereof is preferably from 0.05 to 10% by weight, more preferably from 0.05 to 2% by weight, based on the entire light-emitting layer.

Compound A and Compound B may be uniformly distributed within the light-emitting layer or may be non-uniformly present by having a distribution in the film thickness direction.

The thickness of the light-emitting layer 5 is usually from 10 to 200 nm, preferably from 20 to 100 nm. This thin film is formed by the same method as the hole-transporting layer 4.

The hole-blocking layer 6 is stacked on the light-emitting layer 5 to come into contact with the interface of the light-emitting layer 5 in the cathode side and fills the role of inhibiting the holes transferring from the hole-transporting layer 4, from reaching the cathode 8. The hole-blocking layer 6 is formed of a compound capable of transporting the electrons injected from the cathode 8 toward the direction of the light-emitting layer 5 with good efficiency. The material constituting the hole-blocking layer 6 is required to have high electron mobility and low hole mobility. The hole-blocking layer 6 has a function of enclosing holes and electrons within the light-emitting layer 5 and thereby improving the light emission efficiency.

Preferred examples of the hole-blocking material satisfying these requirements include mixed ligand complexes represented by the following formula (VI)

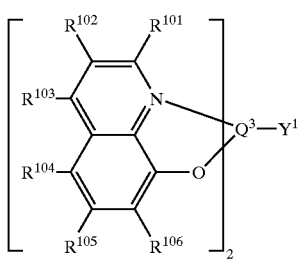

(VI)

(wherein $R^{101}$ to $R^{106}$ each represents a hydrogen atoms or an arbitrary substituent, $Q^3$ represents a metal atom selected from aluminum, gallium and indium, and $Y^1$ is represented by any one of the following formulae (VI-1), (VI-2) and (VI-3):

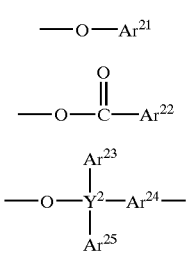

(VI-1)

(VI-2)

(VI-3)

(wherein $Ar^{21}$ to $Ar^{25}$ each represents an aromatic hydrocarbon ring group which may have a substituent or an aromatic heterocyclic group which may have a substituent, and $Y^2$ represents silicon or germanium).

In formula (VI), $R^{101}$ to $R^{106}$ each independently represents a hydrogen atom or an arbitrary substituent, preferably a hydrogen atom; a halogen atom such as chlorine or bromine; an alkyl group having from 1 to 6 carbon atoms such as methyl group or ethyl group; an aralkyl group such as benzyl group; an alkenyl group having from 2 to 6 carbon atoms such as vinyl group; a cyano group; an amino group; an acyl group; an alkoxy group having from 1 to 6 carbon atoms such as methoxy group or ethoxy group; an alkoxycarbonyl group having from 2 to 6 carbon atoms such as methoxycarbonyl group or ethoxycarbonyl group; a carboxyl group; an aryloxy group such as phenoxy group or benzyloxy group; an alkylamino group such as diethylamino group or diisopropylamino group; an aralkylamino group such as dibenzylamino group or diphenethylamino group; a haloalkyl group such as trifluoromethyl group; a hydroxyl group; an aromatic hydrocarbon ring group such as phenyl group or naphthyl group, which may have a substituent; or an aromatic heterocyclic group such as thienyl group or pyridyl group, which may have a substituent.

Examples of the substituent which these aromatic hydrocarbon ring group and aromatic heterocyclic group can have include a halogen atom such as fluorine atom; an alkyl group having from 1 to 6 carbon atoms such as methyl group and ethyl group; an alkenyl group having from 2 to 6 carbon atoms such as vinyl group; an alkoxycarbonyl group having from 2 to 6 carbon atoms such as methoxycarbonyl group and ethoxycarbonyl group; an alkoxy group having from 1 to 6 carbon atoms such as methoxy group and ethoxy group; an aryloxy group such as phenoxy group and benzyloxy group; an alkylamino group such as dimethylamino group and diethylamino group; an acyl group such as acetyl group; a haloalkyl group such as trifluoromethyl group; and a cyano group.

$R^{101}$ to $R^{106}$ each is more preferably a hydrogen atom, an alkyl group, a halogen atom or a cyano group. $R^{104}$ is particularly preferably a cyano group.

Specific examples of $Ar^{21}$ to $Ar^{25}$ in formula (VI) include an aromatic hydrocarbon ring group such as phenyl group, biphenyl group and naphthyl group, which may have a substituent, and an aromatic heterocyclic group such as thienyl group and pyridyl group. Among these, preferred are those resulting from condensation of two or three 5-membered rings, 6-membered rings or 5-membered and/or 6-membered rings, or those resulting from direct bonding of two or more of these rings. Between the aromatic hydrocarbon ring group and the aromatic heterocyclic group, the aromatic hydrocarbon ring group is preferred.

Examples of the substituent which $Ar^{21}$ to $Ar^{25}$ can have include the same groups as described above for the substituent of the aromatic hydrocarbon ring group or aromatic heterocyclic group represented by, for example, $R^{101}$ ti $R^{106}$.

Specific preferred examples of the compound represented by formula (VI) are set forth below, however, the present invention is not limited thereto.

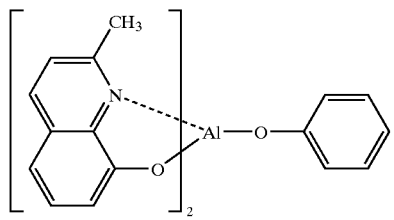

(HB-1)

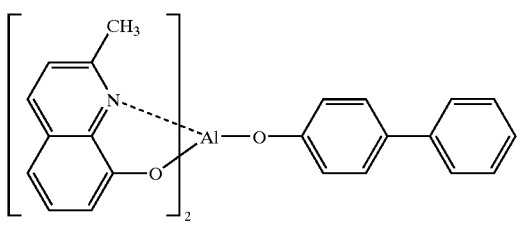

(HB-2)

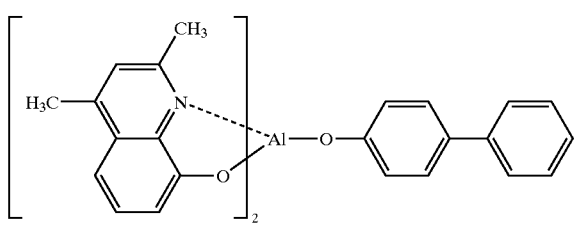

(HB-3)

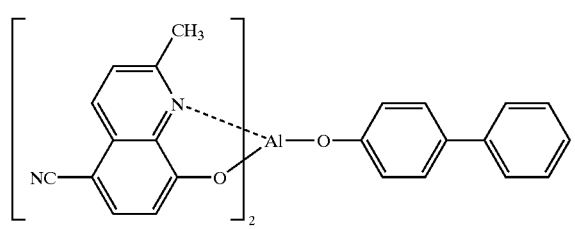

(HB-4)

(HB-5)
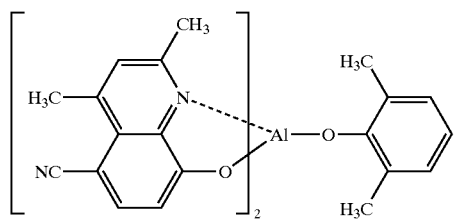
(HB-6)
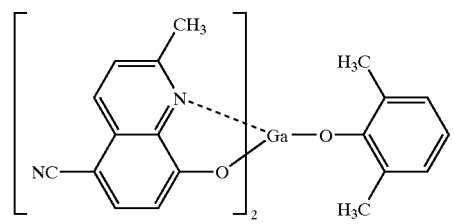
(HB-7)
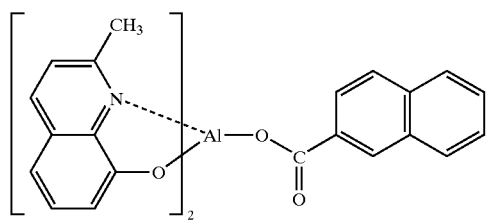
(HB-8)
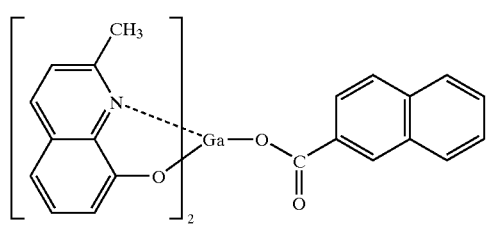
(HB-9)
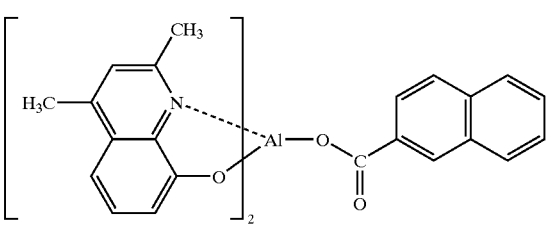
(HB-10)
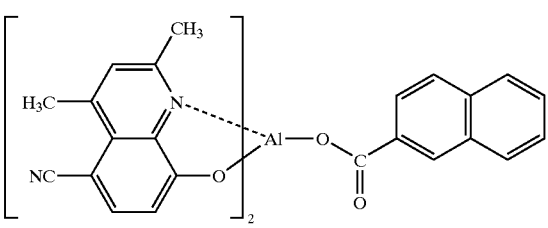
(HB-11)
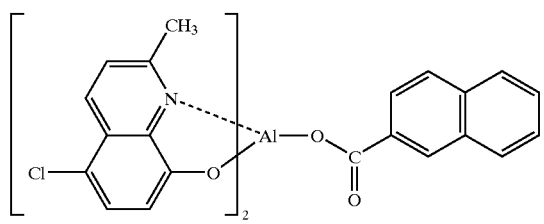
(HB-12)
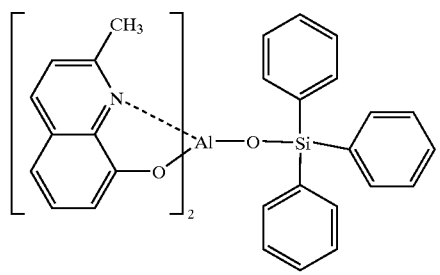
(HB-13)
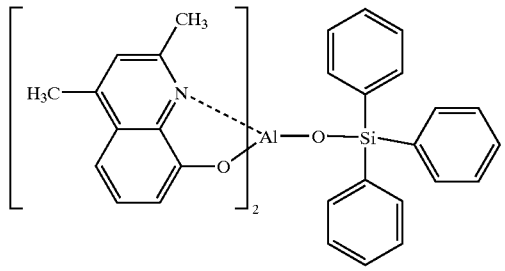
(HB-14)
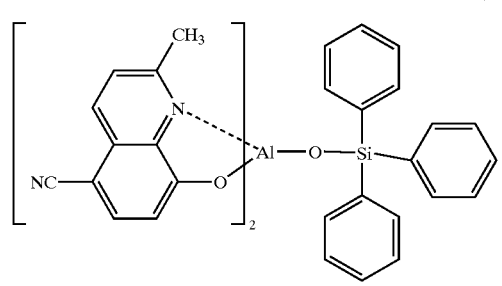
(HB-15)
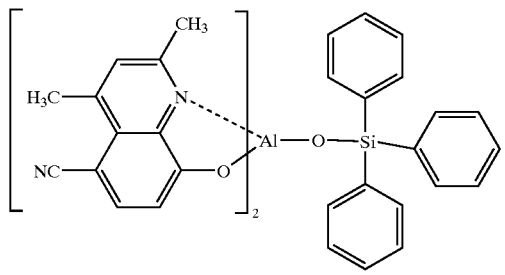

-continued (HB-16)
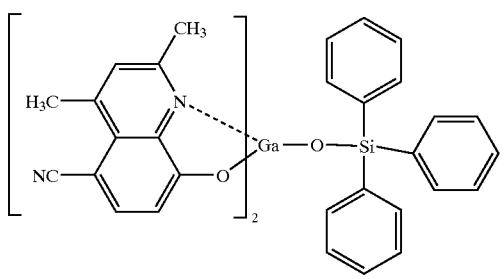

(HB-17)
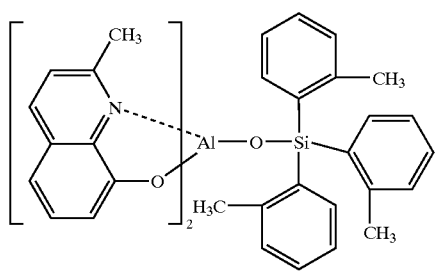

(HB-18)
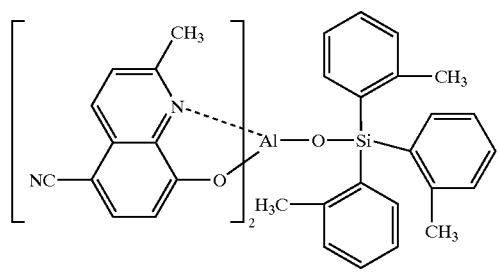

(HB-19)

(HB-20)
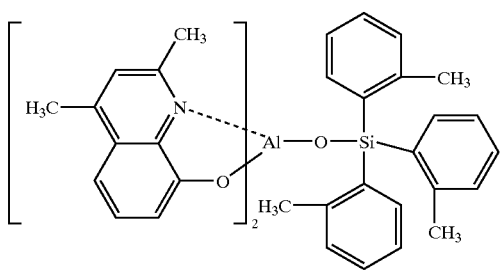

For the hole-blocking material, a compound having at least one 1,2,4-triazole ring residue represented by the following structural formula can also be used, in addition to the mixed ligand complex of formula (VI).

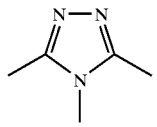

Specific examples of the compound having at least one 1,2,4-triazole ring residue represented by the structural formula shown above are set forth below, however, the present invention is not limited thereto.

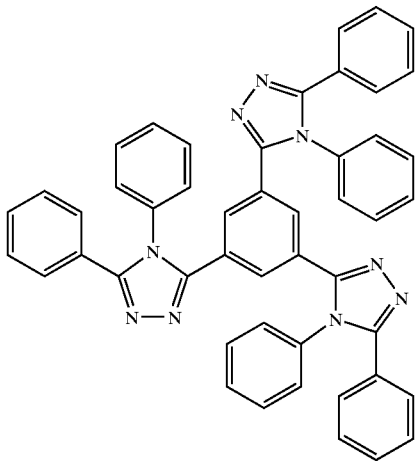

Although not shown in the structural formulae above, the benzene ring and the naphthalene ring in these compounds each may further have a substituent. Examples of the substituent include the same groups as described above for the substituent of the aromatic hydrocarbon ring group or aromatic heterocyclic group represented by, for example, $R^{101}$ to $R^{106}$.

For the hole-blocking material, a compound having at least one phenanthroline ring represented by the structural formula shown below can also be used.

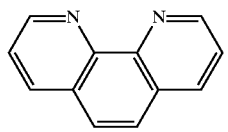

Specific examples of the compound having at least one phenanthroline ring represented by the structural formula shown above are set forth below, however, the present invention is not limited thereto.

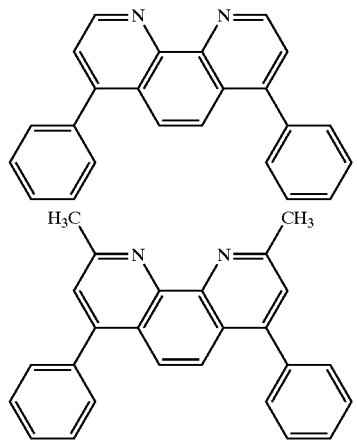

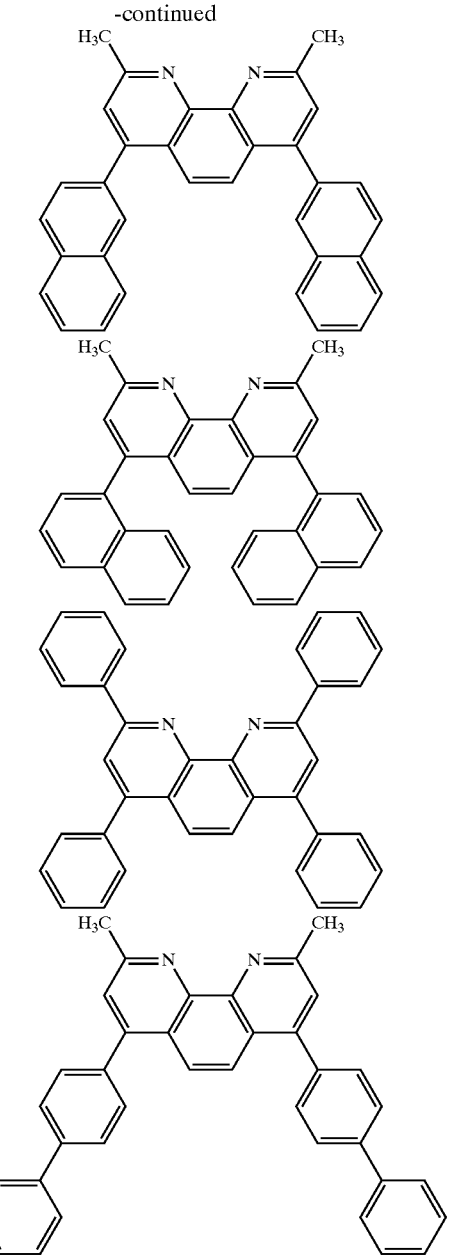

Similarly to the compound having a 1,2,4-triazole ring residue, these compounds may also have a substituent other than those described in the structural formula and in this case, examples of the substituent include the same groups as described above for the substituent of the aromatic hydrocarbon ring group or aromatic heterocyclic group represented by, for example, $R^{101}$ to $R^{106}$.

The above-described compounds as the hole-blocking material may be used individually or, if desired, in combination of two or more thereof in the hole-blocking layer 6.

The thickness of the hole-blocking layer 6 is usually from 0.3 to 100 nm, preferably from 0.5 to 50 nm. The hole-blocking layer 6 can be formed by the same method as the hole-transporting layer 4 but is usually formed by the vacuum vapor deposition method.

The cathode 8 fills the role of injecting electrons into the light-emitting layer 5 through the hole-blocking layer 6. The material used as the cathode B may be a material used for the anode 2, however, for performing the electron injection with good efficiency, a metal having a low work function is preferred and an appropriate metal such as tin, magnesium, indium, calcium, aluminum or silver, or an alloy thereof is used. Specific examples thereof include alloy electrodes having a low work function, such as magnesium-silver alloy, magnesium-indium alloy and aluminum-lithium alloy.

The film thickness of the cathode 8 is usually the same as the thickness of the anode 2.

For the purpose of protecting the cathode composed of a low work function metal, a metal layer having a high work function and being stable to air is further stacked on the cathode and this is preferred from the standpoint of increasing the stability of the device. For this purpose, a metal such as aluminum, silver, copper, nickel, chromium, gold and platinum is used.

For the purpose of further improving the light emission efficiency of the device, it is considered to provide an electron-transporting layer 7 between the hole-blocking layer 6 and the cathode 8 as shown in FIG. 2. The electron-transporting layer 7 is formed of a compound which can effectively transport, between the electrodes applied with an electric field, the electrons injected from the cathode 8 toward the direction of the hole-blocking layer 6.

Accordingly, the electron-transport compound used for the electron-transporting layer 7 must be a compound ensuring highly efficient electron injection from the cathode 8, having high electron mobility and being capable of transporting the injected electrons with good efficiency.

Examples of the material satisfying these requirements include metal complexes such as aluminum complex of 8-hydroxyquinoline (see, JP-A-59-194393), metal complexes of 10-hydroxybenzo[h]quinoline, oxadiazole derivatives, distyrylbiphenyl derivatives, xylol derivatives, 3- or 5-hydroxyflavone metal complexes, benzoxazole metal complexes, benzothiazole metal complexes, trisbenzimidazolylbenzene (see, U.S. Pat. No. 5,645,948), quinoxaline compounds (see, JP-A-6-207169), phenanthroline derivatives (see, JP-A-5-331459), 2-tert-butyl-9,10-N,N'-dicyanoanthraquinonediimine, n-type hydrogenated amorphous silicon carbide, n-type zinc sulfide and n-type zinc selenide.

The film thickness of the electron-transporting layer 6 is usually from 5 to 200 nm, preferably from 10 to 100 nm.

The electron-transporting layer 7 is formed by stacking it on the hole-blocking layer 6 using a coating method or a vacuum vapor deposition method in the same manner as in the formation of the hole-transporting layer 4. A vacuum vapor deposition method is usually used.

For the purpose of further elevating the efficiency of hole injection and improving the adhesion of the entire organic layer to the anode 2, an anode buffer layer 3 is interposed between the hole-transporting layer 4 and the anode 2 as shown in FIG. 3. By interposing the anode buffer layer 3, an effect of lowering the initial driving voltage of the device and at the same time, suppressing the voltage elevation on continuous driving of the device with a constant current can be obtained. The material used for the anode buffer layer 3 is required to have a capability of highly uniformly forming a thin film in good contact with the anode 2 and to be thermally stable, that is, to have a high melting point and a high glass transition temperature, specifically, a melting point of 300° C. or more and a glass transition temperature of 100° C. or more. Furthermore, the material is required to have a low ionization potential for facilitating the hole injection from the anode 2 and to have a high hole mobility.

For satisfying these requirements, phthalocyanine compounds such as copper phthalocyanine (see, JP-A-63-295695); organic compounds such as polyaniline (see, *Appl. Phys. Lett.*, Vol. 64, page 1245 (1994)) and polythiophene (see, *Optical Materials*, Vol. 9, page 125 (1998)); sputter-carbon film (see, Svnth. Met., Vol. 91, page 73 (1997)); and metal oxides such as vanadium oxide, ruthenium oxide and molybdenum oxide (see, *J. Phys. D*, Vol. 29, page 2750 (1996)) have been heretofore reported.

The thin film as the anode buffer layer 3 can be formed in the same manner as the hole-transporting layer 4, however, in the case of an inorganic material, sputtering, electron beam deposition and plasma CVD can be used in addition.

The film thickness of the anode buffer layer 3 formed as such is usually from 3 to 100 nm, preferably from 5 to 50 nm.

For elevating the efficiency of the device, it is also an effective method to interpose an ultra-thin insulating film (film thickness: from 0.1 to 5 nm) of LiF, $MgF_2$ or $Li_2O$ into the interface between the cathode 8 and the light-emitting layer 5 or between the cathode 8 and the electron-transporting layer 7 (see, *Appl. Phys. Lett.*, Vol. 70, page 152 (1997); JP-A-10-74586; and *IEEE Trans. Electron. Devices*, Vol. 44, page 1245 (1997)).

A construction reverse to FIG. 1 may also be used, that is, a cathode 8, a hole-blocking layer 6, a light-emitting layer 5, a hole-transporting layer 4 and an anode 2 can be stacked in this order on a substrate. As described above, the organic electroluminescent device of the present invention can also be provided between two substrates with at least one substrate having high transparency. Similarly, respective layers may also be stacked to have a construction reverse to the layer construction shown in FIGS. 2 and 3. Furthermore, an arbitrary layer may also be provided between the anode or cathode and the light-emitting layer, in addition to those layers shown in FIGS. 1, 2 and 3.

The present invention can be applied in any case where the organic electroluminescent device is a single device, a device constructed to have an arrayed disposition or a device having a construction such that the anode and the cathode are disposed like a X-Y matrix.

The present invention is described in greater detail below by referring to Examples, however, the present invention is not limited to these Examples insofar as the gist thereof is observed.

EXAMPLE 1

An organic electroluminescent device having a structure shown in FIG. 3 was fabricated by the following method.

A glass substrate 1 having deposited thereon an indium-tin oxide (ITO) transparent electrically conductive film to a thickness of 150 nm (an electron beam film formation product, produced by GEOMATIC; sheet resistance: 15 Ω) was patterned to have 2 mm-width stripes using normal photolithography technique and hydrochloric acid etching to form an anode 2. The ITO substrate after the pattern formation was washed in the order of ultrasonic washing with acetone, washing with pure water and ultrasonic washing with isopropyl alcohol, then dried by blowing nitrogen and finally washed with ultraviolet ozone. The thus-treated substrate was disposed within a vacuum vapor deposition apparatus and the apparatus was roughly evacuated by means of an oil-sealed rotary pump and then evacuated using an oil-diffusion pump equipped with a liquid nitrogen trap until the degree of vacuum within the apparatus decreased to $2 \times 10^{-6}$ Torr (about $2.7 \times 10^{-4}$ Pa) or less.

Subsequently, copper phthalocyanine (crystal form: β-type) shown below was placed in a molybdenum boat disposed within the apparatus and heated to perform the vapor deposition at a vacuum degree of 1.4×10⁻⁶ Torr (about 1.9×10⁻⁴ Pa) and a deposition rate of 0.1 nm/sec, thereby forming an anode buffer layer 3 having a film thickness of 10 nm.

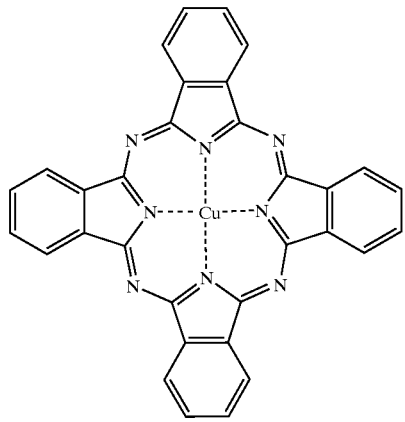

Thereafter, 4,4'-bis[N-(1-naphthyl)-N-phenylamino]-biphenyl shown below was placed in a ceramic crucible disposed within the above-described apparatus and heated by means of a tantalum wire heater in the periphery of the crucible to perform the vapor deposition. At this time, the temperature of the crucible was controlled within the range from 270 to 260° C. By the vapor deposition at a vacuum degree of 9.0×10⁻⁷ Torr (about 1.2×10⁻⁴ Pa) and a deposition rate of 0.2 nm/sec, the hole-transporting layer 4 having a film thickness of 60 nm was formed.

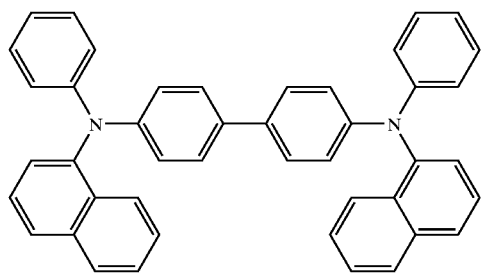

Subsequently, Compound (H-1) as the main component of the light-emitting layer 5 and phosphorescent organic metal complexes as sub-components, namely, Iridium Complex (T-2) and Platinum Complex (T-8), were placed in separate ceramic crucibles and the film formation was performed by the ternary concurrent vapor deposition method. Under the conditions controlled to a crucible temperature of 250 to 260° C. and a deposition rate of 0.1 nm/sec for Compound (H-1), to a crucible temperature of 250 to 260° C. for Iridium Complex (T-2) and to 260 to 275° C. for Platinum Complex (T-8), a light-emitting layer 5 having a film thickness of 30 nm and containing 5% by weight of Iridium Complex (T-2) and 5% by weight of Platinum Complex (T-8) was stacked on the hole-transporting layer 4. At the vapor deposition, the degree of vacuum was 1.3×10⁻⁶ Torr (about 1.7×10⁻⁴ Pa).

Furthermore, a hole-blocking layer 6 was stacked by depositing Compound (HB-12) to a film thickness of 10 nm at a crucible temperature of 220° C. and a deposition rate of 0.1 nm/sec. At the vapor deposition, the degree of vacuum was 7.0×10⁻⁷ Torr (about 0.9×10⁻⁴ Pa)

On this hole-blocking layer 6, an electron-transporting layer 7 was stacked by depositing 8-hydroquinoline complex of aluminum (Al (C₉H₆NO)₃) having a structural formula shown below in the same manner. At this time, the crucible temperature of the 8-hydroquinoline complex of aluminum was controlled to 300 to 310° C. The vapor deposition was performed at a vacuum degree of 6.0×10⁻⁷ Torr (about 0.9×10⁻⁴ Pa) and a deposition rate of 0.2 nm/sec to a film thickness of 35 nm.

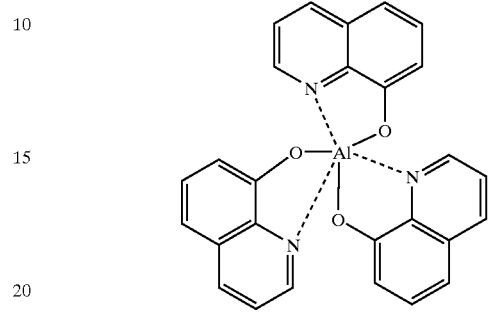

At the time of vacuum depositing those hole-transporting layer 4, light-emitting layer 5, hole-blocking layer 6 and electron-transporting layer 7, the substrate temperature was kept at room temperature.

The device treated until the electron-transporting layer 7 was deposited was once taken out from the vacuum deposition apparatus into the atmosphere and a shadow mask having 2 mm-width stripes as a mask for the cathode deposition was closely contacted with the device such that the stripes run orthogonally to the ITO stripes of the anode 2. Then, the device was disposed within another vacuum deposition apparatus and the apparatus was evacuated in the same manner as in the formation of the organic layer until the degree of vacuum within the apparatus decreased to 2×10⁻⁶ Torr (about 2.7×10⁻⁴ Pa) or less.

Thereafter, using magnesium fluoride (MgF₂) placed in a molybdenum boat, a film as a cathode 8 was formed on the electron-transporting layer 7 to a thickness of 1.5 nm at a deposition rate of 0.1 nm/sec and a vacuum degree of 7.0×10⁶ Torr (about 9.3×10⁻⁴ Pa). Subsequently, aluminum was similarly heated in a molybdenum boat to form an aluminum layer having a film thickness of 40 nm at a deposition rate of 0.5 nm/sec and a vacuum degree of 1×10⁻⁵ Torr (about 1.3×10⁻³ Pa). On this aluminum layer, silver for elevating the electrical conductivity of the cathode was similarly heated in a molybdenum boat to form a silver layer having a film thickness of 40 nm at a deposition rate of 0.3 nm/sec and a vacuum degree of 1×1⁻⁵ Torr (about 1.3×10⁻³ Pa), thereby completing the cathode 8. During the deposition of this three-layer cathode 8, the substrate temperature was kept at room temperature.

In this way, an organic electroluminescent device having a light emission area part in the size of 2 mm×2 mm was obtained. The light emission characteristics of this device are shown in Table 3. In Table 3, the light emission efficiency is the value at 100 cd/m², the luminance/current is the inclination of luminance-current density characteristic curve, the voltage is the value at 100 cd/m². The maximum wavelength of the light emission spectrum of this device was 584 nm and identified as the wavelength attributable to Platinum Complex (T-8).

COMPARATIVE EXAMPLE 1

A device was fabricated in the same manner as in Example 1 except that Iridium Complex (T-2) as one sub-component of the light-emitting layer was excluded. The light emission characteristics of this device are shown in Table 3. The maximum wavelength of the light emission spectrum of this device was 585 nm similarly to Example 1 and identified as the wavelength attributable to Platinum Complex (T-8).

EXAMPLE 2

A device was fabricated in the same manner as in Example 1 except that Compound (H-34) was used as the main component of the light-emitting layer. The light emission characteristics of this device are shown in Table 3. The maximum wavelength of the light emission spectrum of this device was 585 nm similarly to Example 1 and identified as the wavelength attributable to Platinum Complex (T-8).

COMPARATIVE EXAMPLE 2

A device was fabricated in the same manner as in Example 2 except that Iridium Complex (T-2) as one sub-component of the light-emitting layer was excluded. The light emission characteristics of this device are shown in Table 3. The maximum wavelength of the light emission spectrum of this device was 585 nm similarly to Example 1 and identified as the wavelength attributable to Platinum Complex (T-8).

EXAMPLE 3

A device was fabricated in the same manner as in Example 1 except that Iridium Complex (T-17) was used in place of Platinum Complex (T-8) as one sub-component of the light-emitting layer. The light emission characteristics of this device are shown in Table 3. The maximum wavelength of the light emission spectrum of this device was 618 nm and identified as the wavelength attributable to Iridium Complex (T-17).

COMPARATIVE EXAMPLE 3

A device was fabricated in the same manner as in Example 3 except that Iridium Complex (T-2) as one sub-component of the light-emitting layer was excluded. The light emission characteristics of this device are shown in Table 3. The maximum wavelength of the light emission spectrum of this device was 618 nm similarly to Example 3 and identified as the wavelength attributable to Iridium Complex (T-17).

TABLE 3

| | Maximum Light Emission Luminance [cd/m$^2$] @0.25 A/cm$^2$ | Light Emission Efficiency [1 m/W] @100 cd/m$^2$ | Luminance/-Current [cd/A] | Voltage [V] @100 cd/m$^2$ |
|---|---|---|---|---|
| Example 1 | 8830 | 6.5 | 10.5 | 5.1 |
| Comparative Example 1 | 6500 | 2.1 | 4.7 | 7.0 |
| Example 2 | 5870 | 3.4 | 6.6 | 6.2 |
| Comparative Example 2 | 5150 | 1.7 | 3.4 | 6.2 |
| Example 3 | 6180 | 2.5 | 5.7 | 7.1 |
| Comparative Example 3 | 3530 | 1.7 | 3.7 | 7.0 |

It is seen from Table 3 that although light emission of Phosphorescent Organic Metal Complex (T-8) or (T-17) was recognized in all of Examples 1 to 3 and Comparative Examples 1 to 3, the devices using Organic Metal Complex (T-2) serving as a sensitizer in combination were more improved in the maximum light emission luminance, the light emission efficiency and the like than the devices of Comparative Examples 1 to 3 where only Phosphorescent Organic Metal Complex (T-8) or (T-17) was doped into the host material (H-1) or (H-34).

REFERENCE EXAMPLES 1 TO 3

Organic electroluminescent devices were fabricated in the same manner as in Example 1 except that Compound (H-1) was used as the main component of the light-emitting layer 5 and (T-2), (T-8) or (T-17) was used as the sub-component phosphorescent organic metal complex. The content of (T-2), (T-8) or (T-17) in the light-emitting layer was 5% by weight.

The maximum wavelength of the light emission spectrum of each device is shown in Table 4.

TABLE 4

| | Compound | Maximum Light Emission Wavelength (nm) |
|---|---|---|
| Reference Example 1 | T-2 | 512 |
| Reference Example 2 | T-8 | 585 |
| Reference Example 3 | T-17 | 618 |

EXAMPLE 4

An organic electroluminescent device having a construction shown in FIG. 2 was fabricated by the following method.

A glass substrate having deposited thereon an indium tin oxide (ITO) transparent electrically conductive film to a thickness of 150 nm (an electron beam film formation product, produced by GEOMATIC; sheet resistance: 15 Ω) was patterned to have 2 mm-width stripes using normal photolithography technique and hydrochloric acid etching to form an anode. The ITO substrate after the pattern formation was washed in the order of ultrasonic washing with acetone, washing with pure water and ultrasonic washing with iso-propyl alcohol, then dried by blowing nitrogen and finally washed with ultraviolet ozone. The thus-treated substrate was disposed within a vacuum vapor deposition apparatus and the apparatus was roughly evacuated by means of an oil-sealed rotary pump and then evacuated using an oil-diffusion pump equipped with a liquid nitrogen trap until the degree of vacuum within the apparatus decreased to $2\times10^{-6}$ Torr (about $2.7\times10^{-4}$ Pa) or less.

Subsequently, 4,4'-bis[N-(1-naphthyl)-N-phenylamino]-biphenyl was placed in a ceramic crucible disposed within the apparatus and heated by means of a tantalum wire heater in the periphery of the crucible to perform the vapor deposition. At this time, the crucible temperature was controlled to the range from 280 to 260° C. The vapor deposition was performed at a vacuum degree of $1.3\times10^{-6}$ Torr (about $1.7\times10^{-4}$ Pa) and a deposition rate of 0.3 nm/sec to obtain a hole-transporting layer 4 having a film thickness of 60 nm.

Subsequently, Compound (H-1) as the main component of the light-emitting layer and phosphorescent organic metal complexes as sub-components, namely, Iridium Complex (T-2) and Fluorescent Compound (Dye-1) shown below:

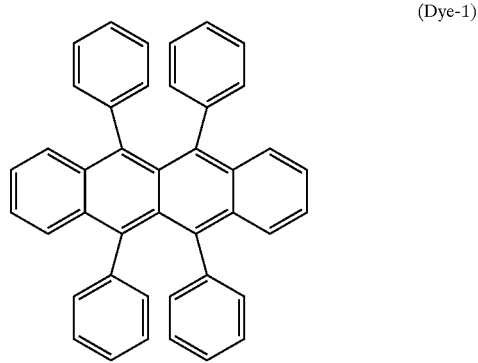

(Dye-1)

were placed in separate ceramic crucibles and the film formation was performed by the ternary concurrent vapor deposition method. Under the conditions controlled to a crucible temperature of 220° C. and a deposition rate of 0.2 nm/sec for Compound (H-1), to a temperature of 290 to 300° C. for Iridium Complex (T-2) and to 190 to 195° C. for Fluorescent Dye (Dye-1), a light-emitting layer 5 having a film thickness of 30 nm and containing 5% by weight of Iridium Complex (T-2) and 2% by weight of Fluorescent Dye (Dye-1) was stacked on the hole-transporting layer 4. At the vapor deposition, the degree of vacuum was $1.0\times10^{-6}$ Torr (about $1.3\times10^{-4}$ Pa).

Furthermore, a hole-blocking layer 6 was stacked by depositing Compound (HB-12) to a film thickness of 10 nm at a crucible temperature of 220° C. and a deposition rate of 0.2 nm/sec. At the vapor deposition, the degree of vacuum was $1.2\times10^{-6}$ Torr (about $1.6\times10^{-4}$ Pa)

On this hole-blocking layer 6, an electron-transporting layer 7 was stacked by depositing 8-hydroquinoline complex of aluminum ($Al(C_9H_6NO)_3$) in the same manner. At this time, the crucible temperature of the 8-hydroquinoline complex of aluminum was controlled to 290 to 300° C. The vapor deposition was performed at a vacuum degree of $1.0\times10^{-6}$ Torr (about $1.3\times10^{-4}$ Pa) and a deposition rate of 0.2 nm/sec to a film thickness of 35 nm.

At the time of vacuum depositing these hole-transporting layer, light-emitting layer, hole-blocking layer and electron-transporting layer, the substrate temperature was kept at room temperature.

The device treated until the electron-transporting layer 7 was deposited was once taken out from the vacuum deposition apparatus into the atmosphere and a shadow mask having 2 mm-width stripes as a mask for the cathode deposition was closely contacted with the device such that the stripes run orthogonally to the ITO stripes of the anode 2. Then, the device was disposed within another vacuum deposition apparatus and the apparatus was evacuated in the same manner as in the formation of the organic layer until the degree of vacuum within the apparatus decreased to $2\times10^{-6}$ Torr (about $2.7\times10^{-4}$ Pa) or less. Thereafter, using magnesium fluoride ($MgF_2$) placed in a molybdenum boat, a film as a cathode 8 was formed on the electron-transporting layer 7 to a thickness of 1.5 nm at a deposition rate of 0.1 nm/sec and a vacuum degree of $7.0\times10^{-6}$ Torr (about $9.3\times10^{-4}$ Pa).

Subsequently, aluminum was similarly heated in a molybdenum boat to form an aluminum layer having a film thickness of 40 nm at a deposition rate of 0.5 nm/sec and a vacuum degree of $1\times10^{-5}$ Torr (about $1.3\times10^{-3}$ Pa). On this aluminum layer, silver for elevating the electrical conductivity of the cathode was similarly heated in a molybdenum boat to form a silver layer having a film thickness of 40 nm at a deposition rate of 0.3 nm/sec and a vacuum degree of $1\times10^{-5}$ Torr (about $1.3\times10^{-3}$ Pa), thereby completing the cathode 8. During the deposition of this three-layer cathode 8, the substrate temperature was kept at room temperature.

In this way, an organic electroluminescent device having a light emission area part in the size of 2 mm×2 mm was obtained. The light emission characteristics of this device are shown in Table 5. In Table 5, the light emission efficiency is the value at 100 cd/m², the luminance/current is the inclination of luminance-current density characteristic curve, the voltage is the value at 100 cd/m². The maximum wavelength of the light emission spectrum of this device was 561 nm and identified as the wavelength attributable to fluorescent Dye (Dye-1).

TABLE 5

| | Maximum Light Emission Luminance [cd/m²] @0.25 A/cm² | Light Emission Efficiency [1 m/W] @100 cd/m² | Luminance/-Current [cd/A] | Voltage [V] @100 cd/m² |
|---|---|---|---|---|
| Example 4 | 14230 | 3.1 | 9.1 | 9.2 |
| Comparative Example 4 | 7400 | 1.6 | 4.4 | 8.5 |
| Example 5 | 10010 | 1.8 | 4.9 | 8.8 |
| Example 6 | 30590 | 6.8 | 18.5 | 8.6 |

This device was sealed and stored in an environment of 85° C. for 500 hours and even after the storage for 500 hours, the device could endure the practical use with a light non-emission part being less than 1% of the entire light emission part.

COMPARATIVE EXAMPLE 4

A device was fabricated in the same manner as in Example 4 except that Iridium Complex (T-2) as one sub-component of the light-emitting layer was excluded. The light emission characteristics of this device are shown in Table 5. The maximum wavelength of the light emission spectrum of this device was 560 nm similarly to Example 4 and identified as the wavelength attributable to Fluorescent Dye (Dye-1).

EXAMPLE 5

A device was fabricated in the same manner as in Example 4 except that (Dye-2) (content: 1% by weight) shown below was used as the fluorescent dye which is one sub-component of the light-emitting layer. The light emission characteristics of this device are shown in Table 5. The maximum wavelength of the light emission spectrum of this device was 590 nm and identified as the wavelength attributable to Fluorescent Dye (Dye-2).

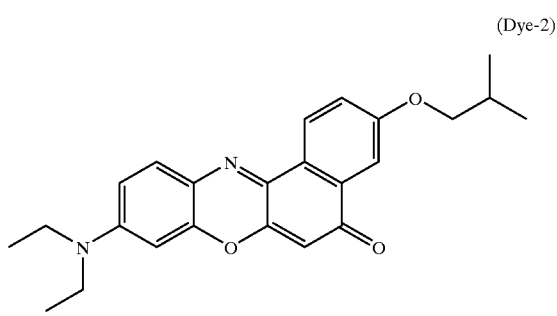

(Dye-2)

EXAMPLE 6

A device was fabricated in the same manner as in Example 4 except that (Dye-3) (content: 0.5% by weight) shown below was used as the fluorescent dye which is one sub-component of the light-emitting layer. The light emission characteristics of this device are shown in Table 5. The maximum wavelength of the light emission spectrum of this device was 535 nm and identified as the wavelength attributable to Fluorescent Dye (Dye-3).

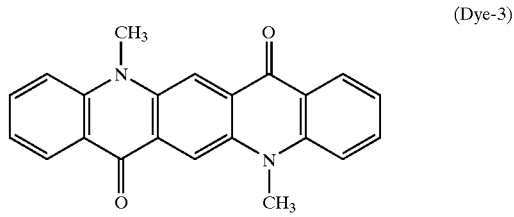

(Dye-3)

COMPARATIVE EXAMPLE 5

A device was fabricated in the same manner as in Example 4 except that Fluorescent Dye (Dye-1) which is one sub-component of light-emitting layer is excluded. (An effect of preventing the decrease in a light emission efficiency when a device is driven at a high luminance)

Figure 4:
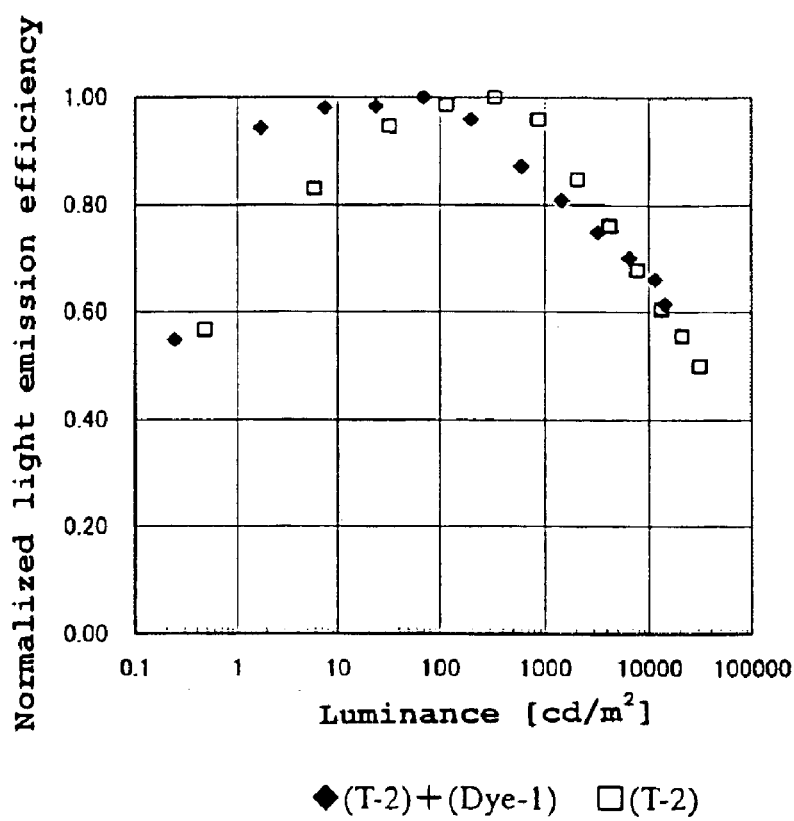
FIG. 4 is a graph showing the change in a luminance when the devices fabricated in Example 4 or Comparative Example 5 emitted light at a high luminance.
Figure 5:
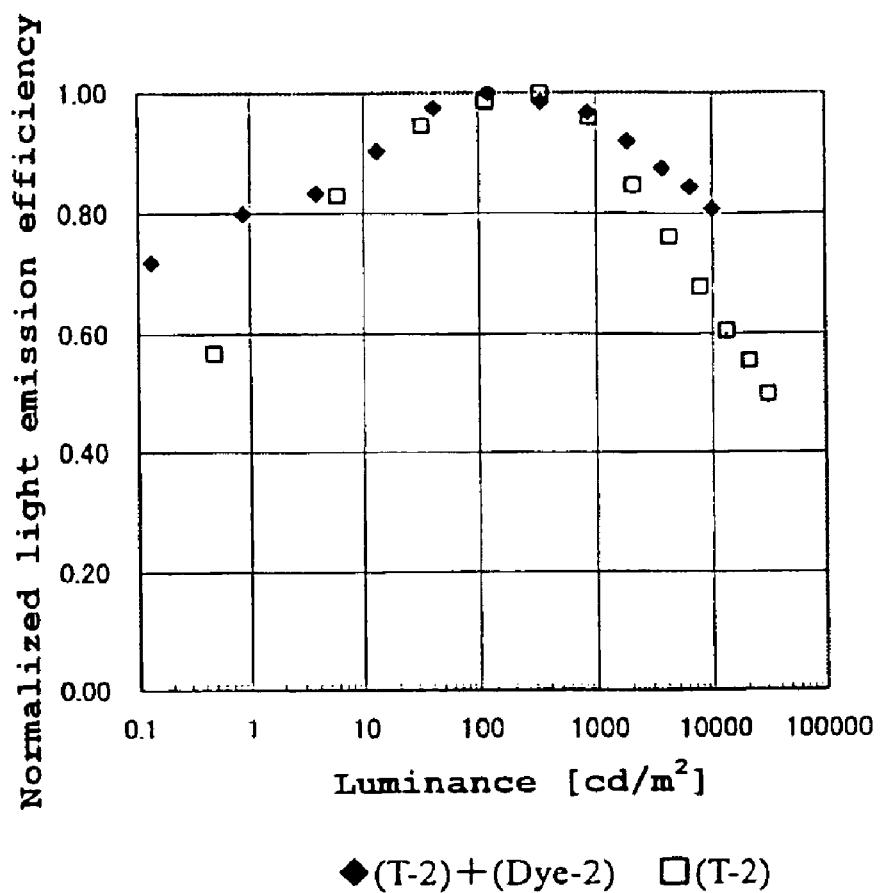
FIG. 5 is a graph showing the change in a luminance when the devices fabricated in Example 5 or Comparative Example 5 emitted light at a high luminance.
Figure 6:
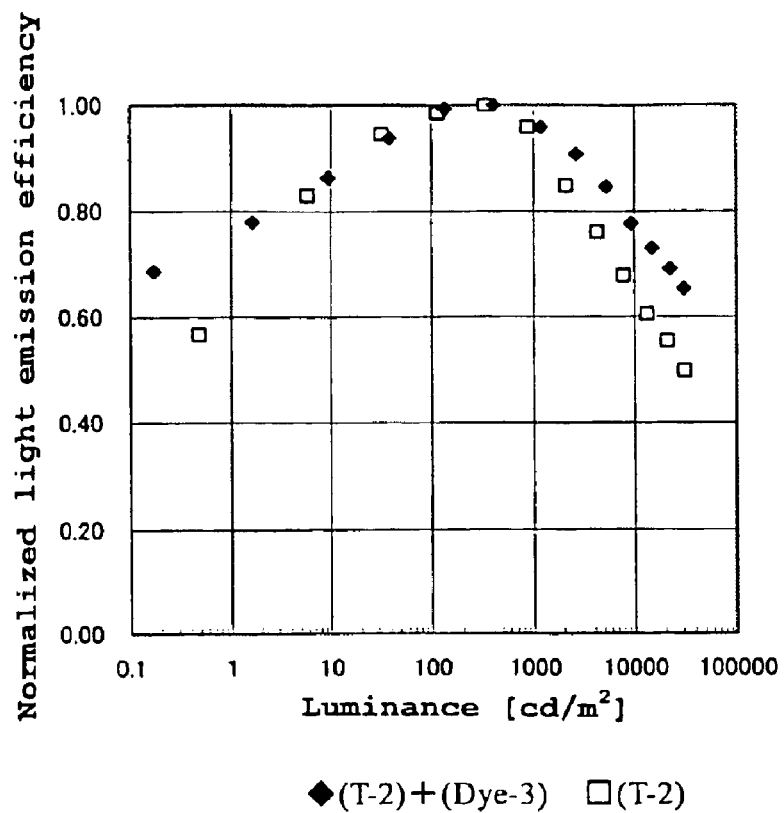
FIG. 6 is a graph showing the change in a luminance when the devices fabricated in Example 6 or Comparative Example 5 emitted light at a high luminance.

The change in a light emission efficiency was observed with increasing a luminance using each of the devices fabricated in Example 4, 5 or 6 or Comparative Example 5. The results thus obtained are shown in FIGS. 4 to 6. The light emission efficiencies shown in FIG. 4, 5 or 6 each is a value normalized with the maximum light emission efficiency.

Each of the devices fabricated in Example 4, 5 or 6 was less in the decrease in a light emission efficiency than that of the device with no fluorescent compound fabricated in Comparative Example 5 when the devices emitted light at a high luminance.

(An Effect of Preventing the Decrease in a Luminance when a Device is Driven Continuously)

Figure 7:
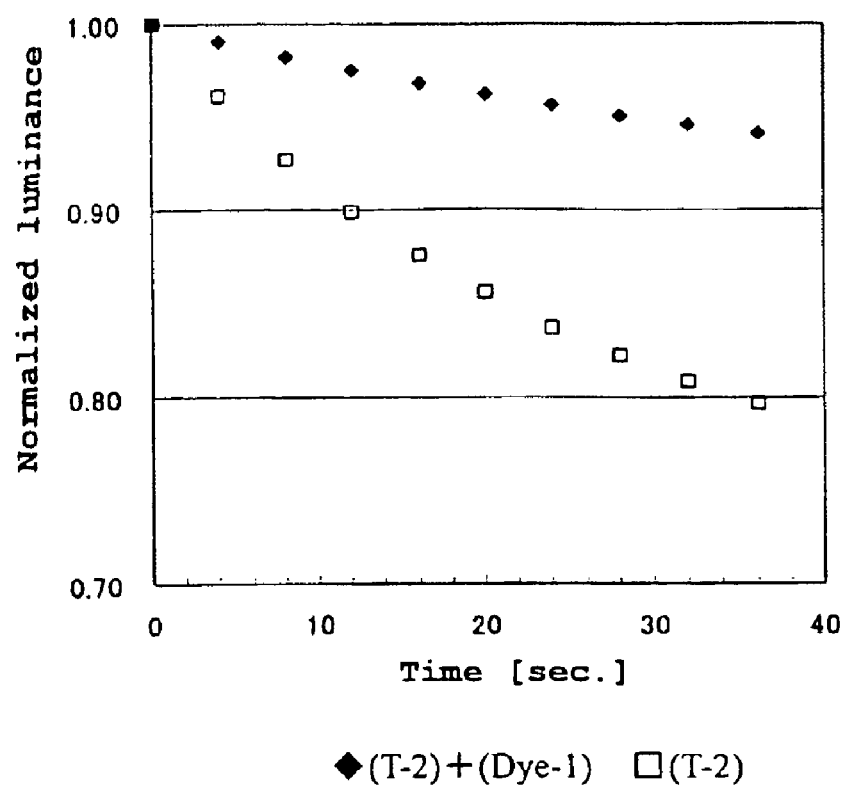
FIG. 7 is a graph showing the change in a luminance when the devices fabricated in Example 4 or Comparative Example 5 were driven continuously.
Figure 8:
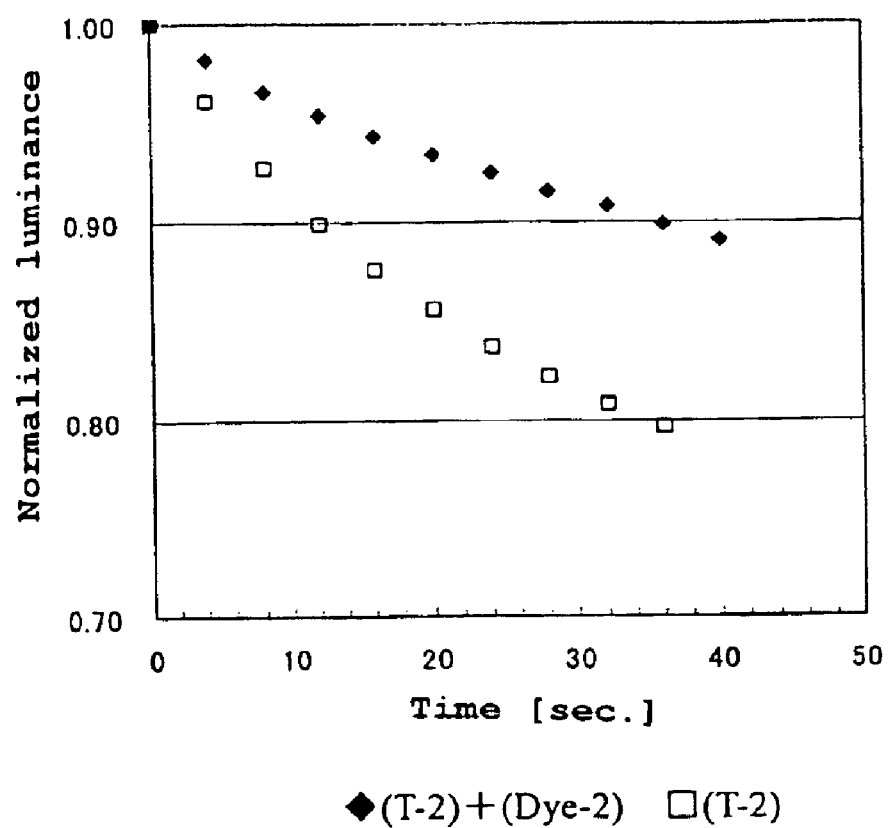
FIG. 8 is a graph showing the change in a luminance when the devices fabricated in Example 5 or Comparative Example 5 were driven continuously.
Figure 9:
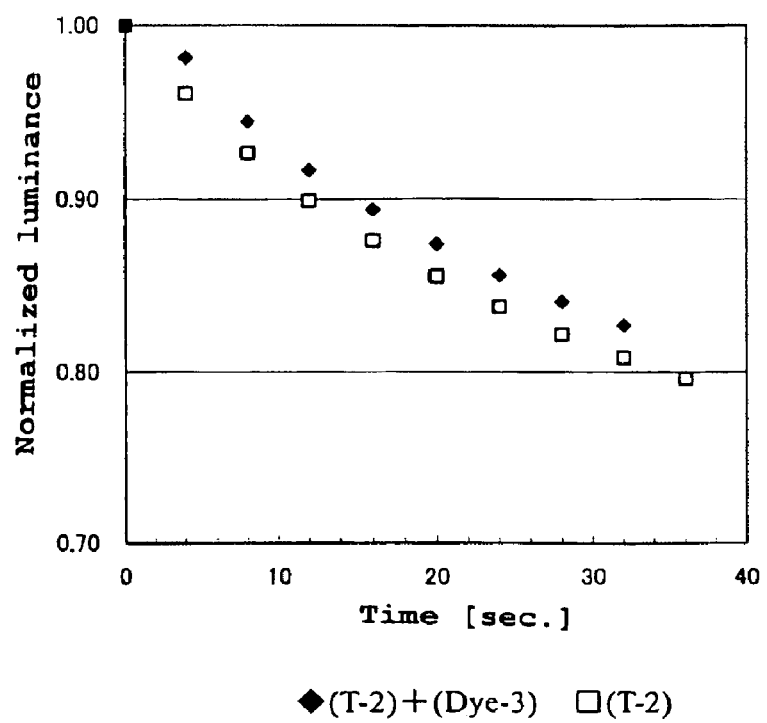
FIG. 9 is a graph showing the change in a luminance when the devices fabricated in Example 6 or Comparative Example 5 were driven continuously.

The aging change in a luminance was observed when each of the devices fabricated in Example 4, 5 or 6 or Comparative Example 5 was driven at the current density J=250 mA/cm$^2$. The results thus obtained are shown in FIGS. 7 to 9. The luminance shown in FIG. 7, 8 or 9 is a value normalized with the maximum luminance (the initial luminance).

Each of the devices fabricated in Example 4, 5 or 6 was less in the decrease in a luminance than that of the device with no fluorescent compound fabricated in Comparative Example 5.

According to the present invention, Compound A, which is capable of phosphorescence emission at room temperature, is used in combination with Compound B, which is (a) a phosphorescence emission compound not capable of emitting light with high efficiency by itself, or is (b) a fluorescence emission compound capable of emitting light in various colors but incapable of ensuring light emission efficiency as high as that of the phosphorescence emission compound for any of those colors, whereby the light emission of Compound B is intensified and the light emission efficiency of the fabricated device is improved.

As a result, a device having light emission of various colors can be obtained and therefore, the present invention is very useful in realizing a flat panel display of multi-color display or full-color display using an organic electroluminescent device.

In the case where Compound B is a compound capable of fluorescence emission at room temperature, an effect of preventing the deterioration of luminance and the decrease in a light emission efficiency can also be provided and this is preferred. By the combination use with the phosphorescent Compound A, an organic electroluminescent device showing a light emission color attributable to the fluorescent Compound B and having a light emission efficiency close to the phosphorescence emission can be realized and at the same time, the fabricated device can be prevented from aging deterioration of luminance and decrease in a light emission efficiency when the device emits light at a high luminance, which occurs very often in phosphorescence emission devices, and can have high driving stability.

While the invention has been described in detail and with reference to specific embodiments thereof, it will be apparent to one skilled in the art that various changes and modifications can be made therein without departing from the spirit and scope thereof.

This application is based on Japanese patent applications No. 2000-304655 filed on Oct. 4, 2000, No. filed on Oct. 7, 2000 and No. 2001-188392 filed on Jun. 21, 2001, the entire contents thereof being hereby incorporated by reference.

What is claimed is:

1. An organic electroluminescent device comprising a substrate having thereon a light-emitting layer sandwiched by an anode and a cathode, wherein said light-emitting layer comprises at least:
   (1) a host material having electron-transporting or hole-transporting property,
   (2) Compound A capable of phosphorescence emission at room temperature, and
   (3) Compound B capable of phosphorescence emission at room temperature and having the maximum light emission wavelength longer than the maximum light emission wavelength of Compound A,
   and the maximum light emission wavelength of said device is attributable to said (3),
   and wherein Compound A and Compound B are uniformly distributed within the light-emitting layer or are non-uniformly present by having a distribution in the layer thickness direction.

2. The organic electroluminescent device as claimed in claim 1, wherein Compound A is an organic metal complex containing a metal selected from Groups 7 to 11 of the periodic table.

3. The organic electroluminescent device as claimed in claim 1, wherein Compound B is an organic metal complex capable of presenting phosphorescence emission at room temperature and containing a metal selected from Groups 7 to 11 of the periodic table.

4. The organic electroluminescent device as claimed in claim 2 or 3, wherein the metal of Groups 7 to 11 of the periodic table is selected from ruthenium, rhodium, palladium, silver, rhenium, osmium, iridium, platinum and gold.

5. The organic electroluminescent device as claimed in claim 2 or 3, wherein the organic metal complex is a compound represented by the following formula (IV):

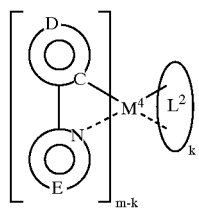

(IV)

wherein the ring D represents an aromatic hydrocarbon ring which may have a substituent or an aromatic heterocyclic ring which may have a substituent, the ring E represents a nitrogen-containing aromatic heterocyclic ring which may have a substituent, a group on the ring D and a group on the ring E may combine to form a ring condensed to these rings, $M^4$ represents a metal selected from Groups 7 to 11 of the periodic table, $L^2$ represents an arbitrary bidentate ligand, m represents a valence number of $M^4$, and k represents an integer that is zero or greater but less than m, wherein Compound A and Compound B are uniformly distributed within the light-emitting layer.

6. The organic electroluminescent device as claimed in claim 2 or 3, wherein the organic metal complex is selected from the compounds represented by the following formula (IV-1) or (IV-2):

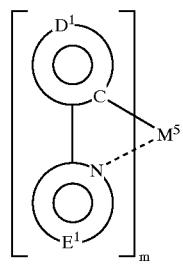

(IV-1)

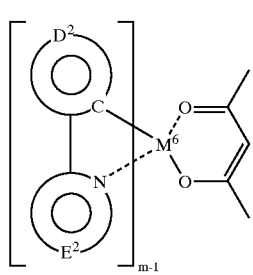

(IV-2)

wherein $M^5$ and $M^6$ each represents a metal selected from Groups 7 to 11 of the periodic table, m represents a valence number of said metal, the rings $D^1$ and $D^2$ each represents an aromatic hydrocarbon ring or aromatic heterocyclic ring which may have a substituent, the rings $E^1$ and $E^2$ each represents a nitrogen-containing aromatic heterocyclic ring which may have a substituent, a substituent on the ring $D^1$ and a substituent on the ring $E^1$ may combine to form a ring condensed to these rings, or a substituent on the ring $D^2$ and a substituent on the ring $E^2$ may combine to form a ring condensed to these rings, wherein Compound A and Compound B are uniformly distributed within the light-emitting layer.

7. The organic electroluminescent device as claimed in claim 2 or 3, wherein the organic metal complex is selected from the compounds represented by the following formula (V):

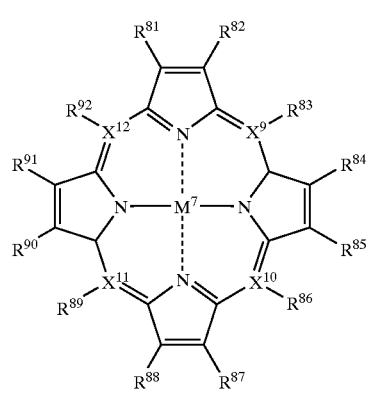

(V)

wherein $R^{81}$ to $R^{92}$ each represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group or an aromatic hydrocarbon ring group or aromatic heterocyclic group which may have a substituent, each of the pairs $R^{81}$ and $R^{82}$, $R^{84}$ and $R^{85}$, $R^{87}$ and $R^{88}$, and $R^{90}$ and $R^{91}$ may combine with each other to form a ring, $M^7$ represents a metal selected from Groups 7 to 11 of the periodic table, $X^9$ to $X^{12}$ each represents carbon or nitrogen, provided that when any one of $X^9$ to $X^{12}$ is a nitrogen atom, $R^{83}$, $R^{86}$, $R^{89}$ or $R^{92}$ bonded to said nitrogen atom is absent.

8. The organic electroluminescent device as claimed in claim 2 or 3, wherein the organic metal complex is a compound represented by the following formula (IV):

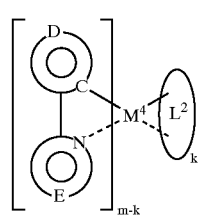

(IV)

wherein the ring D represents an aromatic hydrocarbon ring which may have a substituent or an aromatic heterocyclic ring which may have a substituent, the ring E represents a nitrogen-containing aromatic heterocyclic ring which may have a substituent, a group on the ring D and a group on the ring E may combine to form a ring condensed to these rings, $M^4$ represents a metal selected from Groups 7 to 11 of the periodic table, $L^2$ represents an arbitrary bidentate ligand, m represents a valence number of $M^4$, and k represents an integer that is zero or greater but less than m, wherein said organic metal complex is not

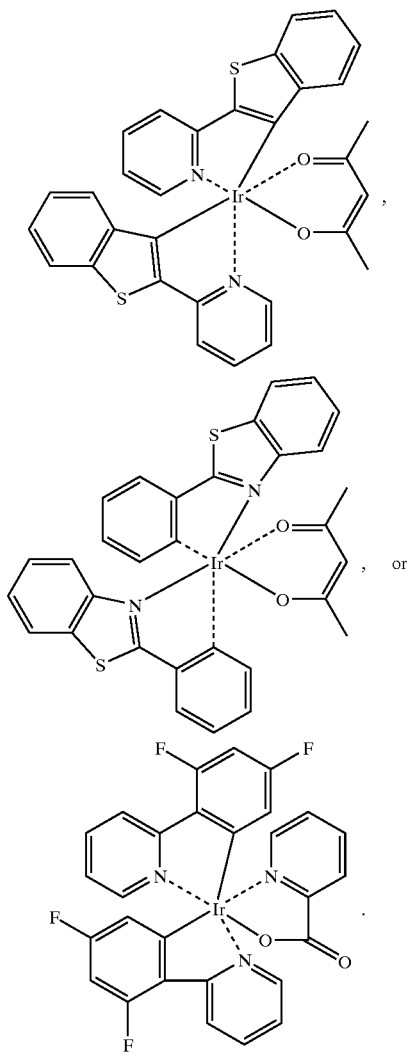

9. The organic electroluminescent device as claimed in claim 2 or 3, wherein the organic metal complex is selected from the compounds represented by the following formula (IV-1):

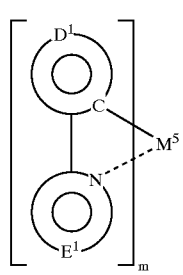

(IV-1)

wherein $M^5$ represents a metal selected from Groups 7 to 11 of the periodic table, m represents a valence number of said metal, the ring $D^1$ represents an aromatic hydrocarbon ring or aromatic heterocyclic ring which may have a substituent, the ring $E^1$ represents a nitrogen-containing aromatic heterocyclic ring which may have a substituent, a substituent on the ring $D^1$ and a substituent on the ring $E^1$ may combine to form a ring condensed to these rings.

10. The organic electroluminescent device as claimed in claim 2 or 3, wherein the organic metal complex is selected from the compounds represented by the following formula (IV-2):

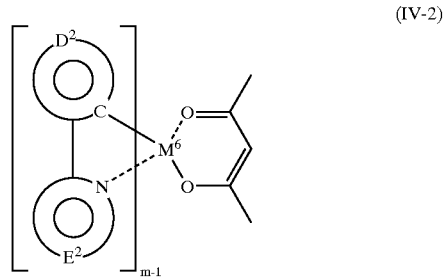

(IV-2)

wherein $M^6$ represents a metal selected from Groups 7 to 11 of the periodic table, m represents a valence number of said metal, the ring $D^2$ represents an aromatic hydrocarbon ring or aromatic heterocyclic ring which may have a substituent, the ring $E^2$ represents a nitrogen-containing aromatic heterocyclic ring which may have a substituent, a substituent on the ring $D^2$ and a substituent on the ring $E^2$ may combine to form a ring condensed to these rings, wherein said organic metal complex is not

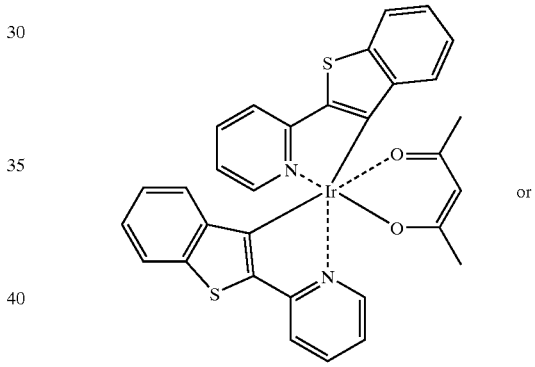

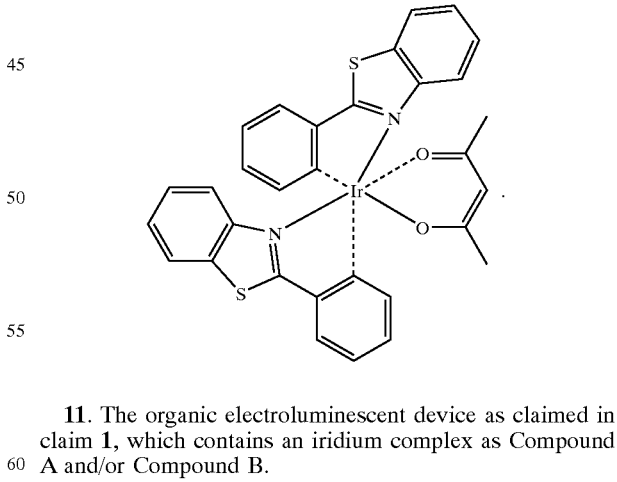

11. The organic electroluminescent device as claimed in claim 1, which contains an iridium complex as Compound A and/or Compound B.

12. The organic electroluminescent device as claimed in claim 1, which contains at least one iridium complex and at least one platinum complex, one as Compound A and the other as Compound B.

13. The organic electroluminescent device as claimed in claim 1, which contains one iridium complex as Compound A and one iridium complex as Compound B.

14. The organic electroluminescent device as claimed in claim 1, wherein the host material is a compound represented by the following formula (I):

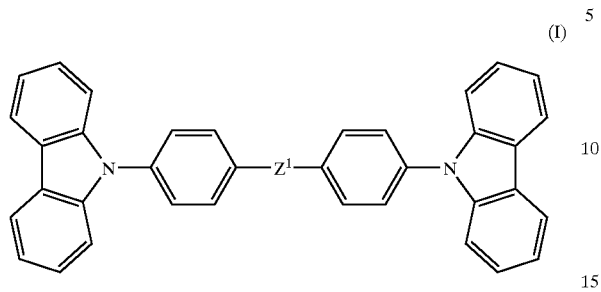

(I)

wherein the carbazolyl group and the phenylene group each may have an arbitrary substituent, and $Z^1$ represents a direct bond or a divalent linking group.

15. The organic electroluminescent device as claimed in claim 14, wherein in formula (I), $Z^1$ is a direct bond, an oxygen atom, a sulfur atom, a linking group shown below:

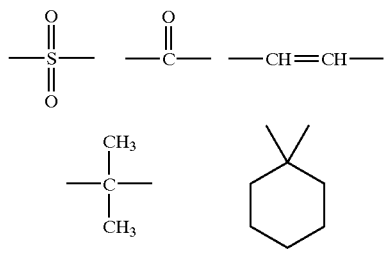

a divalent aromatic hydrocarbon ring group or aromatic heterocyclic group which may have a substituent, or any one of the following linking groups:

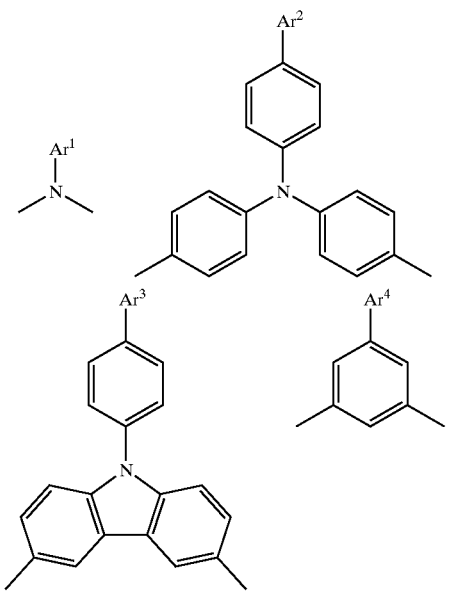

-continued

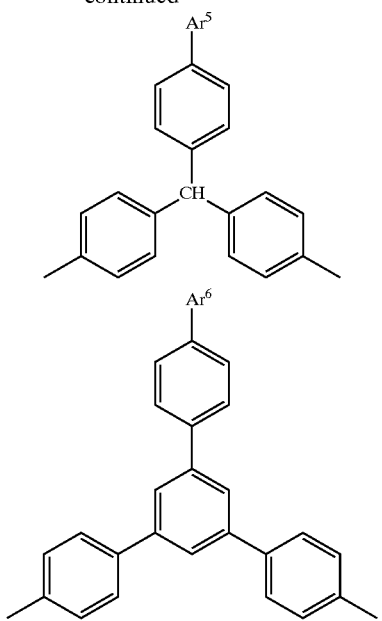

any benzene ring moiety in each structure may have an arbitrary substituent, and $Ar^1$ to $Ar^6$ each represents the aromatic hydrocarbon ring group or aromatic heterocyclic group which may have a substituent or a group represented by the following formula (I-2):

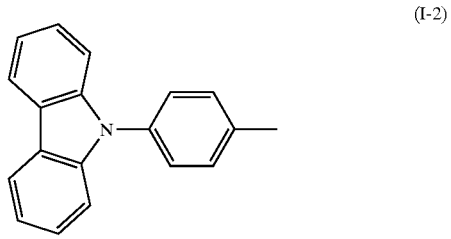

(I-2)

wherein the carbazolyl group and the phenylene group each may have an arbitrary substituent.

16. The organic electroluminescent device as claimed in claim 15, wherein the group represented by formula (I-2) is present and is a group represented by the following formula (I-3):

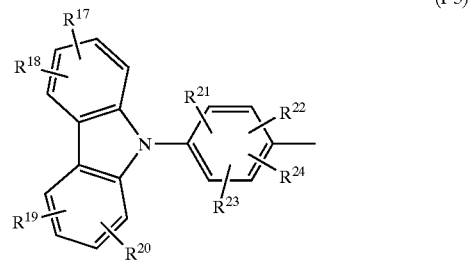

(I-3)

wherein $R^{17}$ to $R^{24}$ each independently represents a hydrogen atom, a halogen atom, an alkyl group, an aralkyl group, an alkenyl group, a cyano group, an amino group which may have a substituent, an acyl group, an alkoxycarbonyl group, a carboxyl group, an alkoxy group, an alkylamino group, an aralkylamino group, a haloalkyl group, a hydroxyl group, an aryloxy group, or an aromatic hydrocarbon ring group or aromatic heterocyclic group which may have a substituent, each of the pairs $R^{17}$ and $R^{18}$, $R^{19}$ and $R^{20}$, $R^{21}$ and $R^{22}$, and $R^{23}$ and $R^{24}$ may combine with each other to form a ring.

17. The organic electroluminescent device as claimed in claim 14, wherein the compound represented by formula (I) is represented by the following formula (I-1):

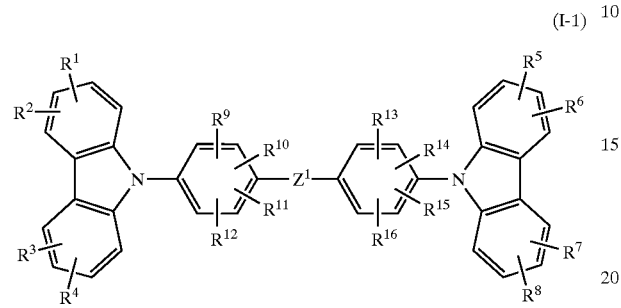

(I-1)

wherein $R^1$ to $R^{16}$ each independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxyl group, an aryloxy group or an aromatic hydrocarbon ring group or aromatic heterocyclic group which may have a substituent, each of the adjacent substituents $R^1$ and $R^2$, $R^3$ and $R^4$, $R^5$ and $R^6$, $R^7$ and $R^8$, $R^9$ and $R^{10}$, $R^{11}$ and $R^{12}$, $R^{13}$ and $R^{14}$, and $R^{15}$ and $R^{16}$ may combine to form a ring, and $Z^1$ represents a direct bond or a divalent linking group.

18. The organic electroluminescent device as claimed in claim 1, wherein the host material is a compound represented by the following formula (II):

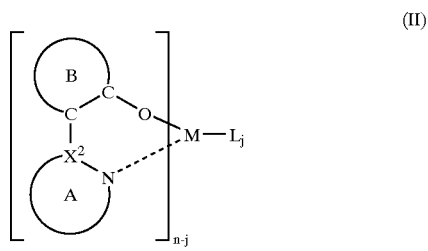

(II)

wherein M represents a metal selected from Groups 1, 2, 3, 12 and 13 of the periodic table, n represents a valence number of said metal, L represents an arbitrary substituent, j represents a number of the substituent L and is 0 or 1, $X^2$ represents a carbon atom or a nitrogen atom, the ring A represents a nitrogen-containing heterocyclic ring and may have a substituent, and the ring B represents an aromatic hydrocarbon ring group or an aromatic heterocyclic group and may have a substituent.

19. The organic electroluminescent device as claimed in claim 18, wherein the compound represented by formula (II) is represented by any one of the following formulae (II-1), (II-2) and (II-3):

Organic Metal Complex

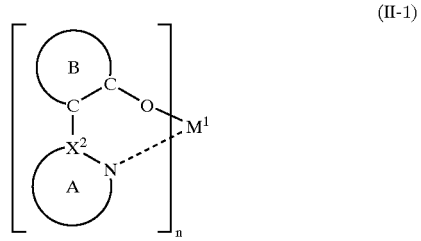

(II-1)

wherein $M^1$ is a mono-, di- or trivalent metal, n, $X^2$ and the rings A and B have the same meanings as in formula (II);

Mixed Ligand Complex

(II-2)

wherein $M^2$ represents a trivalent metal, $X^2$ and the rings A and B have the same meanings as in formula (II), and $L^1$ represents the following formula (II-2a), (II-2b) or (II-2c):

(II-2a)

(II-2b)

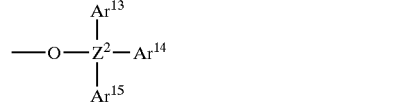

(II-2c)

wherein $Ar^{11}$ to $Ar^{15}$ each represents an aromatic hydrocarbon ring group which may have a substituent or an aromatic heterocyclic group which may have a substituent, and $Z^2$ represents silicon or germanium;

Binuclear Metal Complex

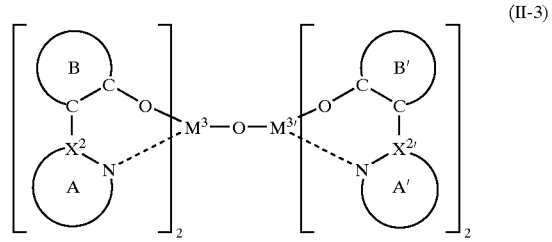

(II-3)

wherein $M^3$ and $M^{3'}$, each represents a trivalent metal, $X^2$ and the rings A and B have the same meanings as in formula (II), $X^{2'}$ and the rings A' and B' have the same meanings as $X^2$ and the rings A and B, respectively.

20. The organic electroluminescent device as claimed in claim 1, wherein a host material is a compound having a group represented by the following formula (III):

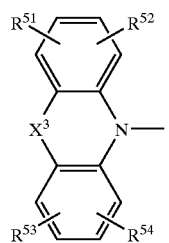

(III)

wherein $R_{51}$ to $R^{54}$ each independently represents a hydrogen atom or an arbitrary substituent, each of the pairs $R^{51}$ and $R^{52}$, and $R^{53}$ and $R^{54}$ may combine to form a ring, and $X^3$ represents an oxygen atom or a sulfur atom.

21. The organic electroluminescent device as claimed in claim 20, wherein the compound having a group represented by formula (III) has a molecular weight of approximately from 400 to 1,200.

22. The organic electroluminescent device as claimed in claim 20, wherein the compound having a group represented by formula (III) is represented by the following formula (III-1) or (III-2):

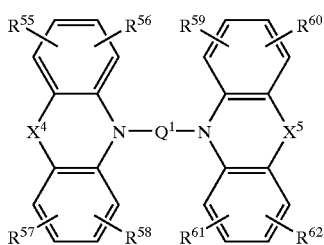

(III-1)

wherein $R^{55}$ to $R^{62}$ each independently represents a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylamino group, an α-haloalkyl group, a hydroxyl group, or an aromatic hydrocarbon ring group or aromatic heterocyclic group which may have a substituent, each of the pairs $R^{55}$ and $R^{56}$, $R^{57}$ and $R^{58}$, $R^{59}$ and $R^{60}$, and $R^{61}$ and $R^{62}$ may combine with each other to form a ring, $X^4$ and $X^5$ each independently represents an oxygen atom or a sulfur atom, and $Q^1$ represents a divalent linking group comprising an aromatic hydrocarbon ring group or aromatic heterocyclic group which may have a substituent;

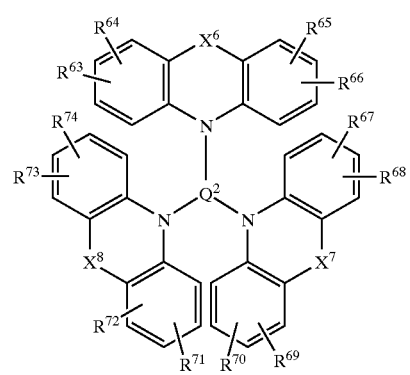

(III-2)

wherein $R^{63}$ to $R^{74}$ each independently represents a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylamino group, an α-haloalkyl group, a hydroxy group, or an aromatic hydrocarbon ring group or aromatic heterocyclic group which may have a substituent, each of the adjacent substituents $R^{63}$ and $R^{64}$, $R^{65}$ and $R^{66}$, $R^{67}$ and $R^{68}$, $R^{69}$ and $R^{70}$, $R^{71}$ and $R^{72}$, and $R^{73}$ and $R^{74}$ may combine to form a ring, $X^6$ to $X^8$ each independently represents an oxygen atom or a sulfur atom, and $Q^2$ represents a trivalent linking group comprising an aromatic hydrocarbon ring group or aromatic heterocyclic group which may have a substituent.

23. The organic electroluminescent device as claimed in claim 1, which has a hole-blocking layer between said light-emitting layer and a cathode.

* * * * *